(12) United States Patent
Ramer et al.

(10) Patent No.: US 8,710,526 B2
(45) Date of Patent: Apr. 29, 2014

(54) THERMAL CONDUCTIVITY AND PHASE TRANSITION HEAT TRANSFER MECHANISM INCLUDING OPTICAL ELEMENT TO BE COOLED BY HEAT TRANSFER OF THE MECHANISM

(75) Inventors: David P. Ramer, Reston, VA (US); Jack C. Rains, Jr., Herndon, VA (US)

(73) Assignee: ABL IP Holding LLC, Conyers, GA (US)

( * ) Notice: Subject to any disclaimer, the term of this patent is extended or adjusted under 35 U.S.C. 154(b) by 269 days.

(21) Appl. No.: 13/221,244

(22) Filed: Aug. 30, 2011

(65) Prior Publication Data

US 2013/0049041 A1  Feb. 28, 2013

(51) Int. Cl.
*H01L 33/00* (2010.01)

(52) U.S. Cl.
USPC ............... 257/98; 257/99; 257/432; 257/712; 257/E31.129; 257/E33.061; 977/955; 165/104.19; 165/104.22

(58) Field of Classification Search
None
See application file for complete search history.

(56) References Cited

U.S. PATENT DOCUMENTS

| | | | |
|---|---|---|---|
| 3,596,125 A | 7/1971 | Seigel | |
| 4,874,731 A | 10/1989 | Sachtler et al. | |
| 5,070,375 A | 12/1991 | Sakai | |
| 5,195,575 A | 3/1993 | Wylie | |
| 5,841,244 A | 11/1998 | Hamilton et al. | |
| 6,377,459 B1 | 4/2002 | Gonsalves et al. | |
| 6,766,817 B2 | 7/2004 | da Silva | |
| 6,827,134 B1 | 12/2004 | Rightley et al. | |
| 6,834,712 B2 | 12/2004 | Parish et al. | |
| 6,864,571 B2 | 3/2005 | Arik et al. | |
| 6,935,022 B2 | 8/2005 | German et al. | |
| 6,969,843 B1 | 11/2005 | Beach et al. | |
| 7,027,304 B2 | 4/2006 | Aisenbrey | |
| 7,028,759 B2 | 4/2006 | Rosenfeld et al. | |

(Continued)

FOREIGN PATENT DOCUMENTS

DE     102 13 042 A1     10/2003
EP       0 144 071 A2      6/1985

(Continued)

OTHER PUBLICATIONS

Entire prosecution history of U.S. Appl. No. 13/221,050, filed Aug. 30, 2011, entitled "Optical/Electrical Transducer Using Semiconductor Nanowire Wicking Structure in a Thermal Conductivity and Phase Transition Heat Transfer Mechanism."

(Continued)

*Primary Examiner* — Yasser A Abdelaziez
(74) *Attorney, Agent, or Firm* — RatnerPrestia

(57) ABSTRACT

A thermal conductivity and phase transition heat transfer mechanism incorporates an active optical element. Examples of active optical elements include various phosphor materials for emitting light, various electrically driven light emitters and various devices that generate electrical current or an electrical signal in response to light. The thermal conductivity and phase transition between evaporation and condensation, of the thermal conductivity and phase transition heat transfer mechanism, cools the active optical element during operation. At least a portion of the active optical element is exposed to a working fluid within a vapor tight chamber of the heat transfer mechanism. The heat transfer mechanism includes a member that is at least partially optically transmissive to allow passage of light to or from the active optical element and to seal the chamber of the heat transfer mechanism with respect to vapor contained within the chamber.

43 Claims, 19 Drawing Sheets

(56) References Cited

U.S. PATENT DOCUMENTS

| | | | |
|---|---|---|---|
| 7,095,110 | B2 | 8/2006 | Arik et al. |
| 7,124,809 | B2 | 10/2006 | Rosenfeld et al. |
| 7,137,443 | B2 | 11/2006 | Rosenfeld et al. |
| 7,148,632 | B2 | 12/2006 | Berman et al. |
| 7,164,466 | B2 | 1/2007 | Hazelton |
| 7,318,660 | B2 | 1/2008 | Yu |
| 7,505,268 | B2 | 3/2009 | Schick |
| 7,538,356 | B2 | 5/2009 | Lai |
| 7,543,960 | B2 | 6/2009 | Chang et al. |
| 7,547,124 | B2 | 6/2009 | Chang et al. |
| 7,572,033 | B2 | 8/2009 | Sun et al. |
| 7,651,260 | B2 | 1/2010 | Hamann et al. |
| 7,679,916 | B2 | 3/2010 | Orr et al. |
| 7,763,353 | B2 | 7/2010 | Geohegan et al. |
| 7,768,192 | B2 | 8/2010 | Van De Ven et al. |
| 7,821,022 | B2 | 10/2010 | Kim |
| 7,846,751 | B2 | 12/2010 | Wang |
| 7,857,037 | B2 | 12/2010 | Parish et al. |
| 7,898,176 | B2 | 3/2011 | Li et al. |
| 2004/0244963 | A1 | 12/2004 | Hazelton |
| 2006/0279191 | A1 | 12/2006 | Geohegan et al. |
| 2007/0295968 | A1 | 12/2007 | Tan et al. |
| 2008/0042429 | A1 | 2/2008 | Schick et al. |
| 2008/0093962 | A1 | 4/2008 | Kim et al. |
| 2008/0128898 | A1 | 6/2008 | Henderson et al. |
| 2008/0205062 | A1 | 8/2008 | Dahm et al. |
| 2008/0219007 | A1* | 9/2008 | Heffington et al. ........... 362/294 |
| 2008/0285271 | A1 | 11/2008 | Roberge et al. |
| 2009/0014154 | A1 | 1/2009 | Schick et al. |
| 2010/0038660 | A1 | 2/2010 | Shuja |
| 2010/0044697 | A2 | 2/2010 | Liu et al. |
| 2010/0200199 | A1 | 8/2010 | Habib et al. |
| 2010/0265717 | A1 | 10/2010 | Luettgens et al. |
| 2010/0283064 | A1 | 11/2010 | Samuelson et al. |
| 2011/0228516 | A1 | 9/2011 | Stewart et al. |
| 2011/0255268 | A1 | 10/2011 | Horn et al. |
| 2012/0026723 | A1 | 2/2012 | Wheelock et al. |
| 2012/0033440 | A1 | 2/2012 | Wheelock et al. |
| 2012/0044678 | A1 | 2/2012 | Aggarwal et al. |

FOREIGN PATENT DOCUMENTS

| | | |
|---|---|---|
| JP | 60-158649 A | 8/1985 |
| WO | 2007069119 A1 | 6/2007 |
| WO | WO 2007/069119 A1 | 6/2007 |

OTHER PUBLICATIONS

Entire prosecution history of U.S. Appl. No. 13/221,083, filed Aug. 30, 2011, entitled "Phosphor Incorporated in a Thermal Conductivity and Phase Transition Heat Transfer Mechanism."

L. Davis et al., "Photoluminescent Nanofibers for Solid-State Lighting Applications," RTI International.

M.S. Dresselhaus, "Nanostructures and Energy Conversion," Proceedings of 2003 Rohsenow Symposium on Future Trends of Heat Transfer, May 16, 2003.

H. P. J. de Bock et al., "Experimental Investigation of Micro/Nano Heat Pipe Wick Structures," Proceedings of the ASME International Mechanical Engineering Congress and Exposition, IMECE2008, Oct. 31-Nov. 6, 2008.

T. Ogoshi et al., "Transparent ionic piqued-phenol resin hybrids with high ionic conductivity," Polymer Journal 43, 421-424 (Apr. 2011).

Ionic Liquids Today, Issue 3-07, Wednesday, Oct. 31, 2007, <www.iolitec.com>.

Y.-S. Cho et al., "Preparation of Transparent Red-Emitting $YVO_4$:Eu Nanophosphor Suspensions," Bull. Korean Chem. Soc. 2011, vol. 32, No. 1.

J. Oliva et al., "Effet of ammonia on luminescent properties of YAG:$Ce^{3+}$, $Pr^{3+}$ nanophosphors," Proc. SPIE 7755, 77550E (2010).

Engineers Edge Solutions by Design, "Fluid Characteristics Chart/Data, Density, Vapor Pressure and Viscosity/Data," printed from <http://www.engineersedge.com/fluid_flow/fluid_data.htm> on Aug. 15, 2011.

What is a Heat Pipe? printed from <http://www.cheresources.com/htpipes.shtml> on Aug. 15, 2011.

Non-final Office Action issued in U.S. Appl. No. 13/221,050, dated Sep. 26, 2013.

Notice of Allowance issued Feb. 10, 2014, in U.S. Appl. No. 13/221,050, filed Aug. 30, 2011, entitled "Optical/Electrical Transducer Using Semiconductor Nanowire Wicking Structure in a Thermal Conductivity and Phase Transition Heat Transfer Mechanism."

* cited by examiner

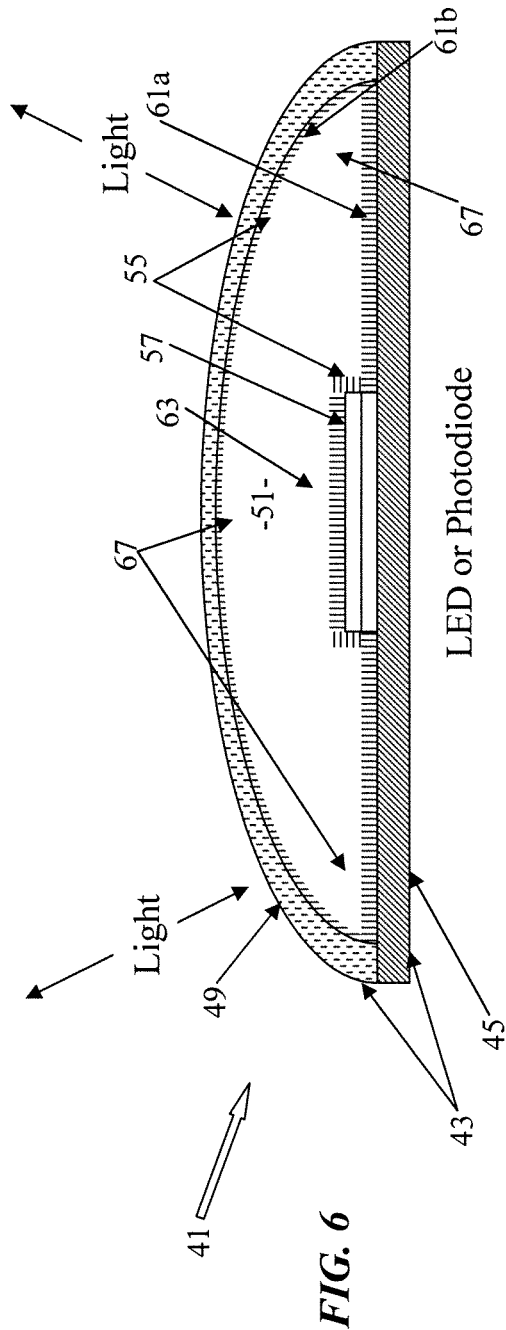

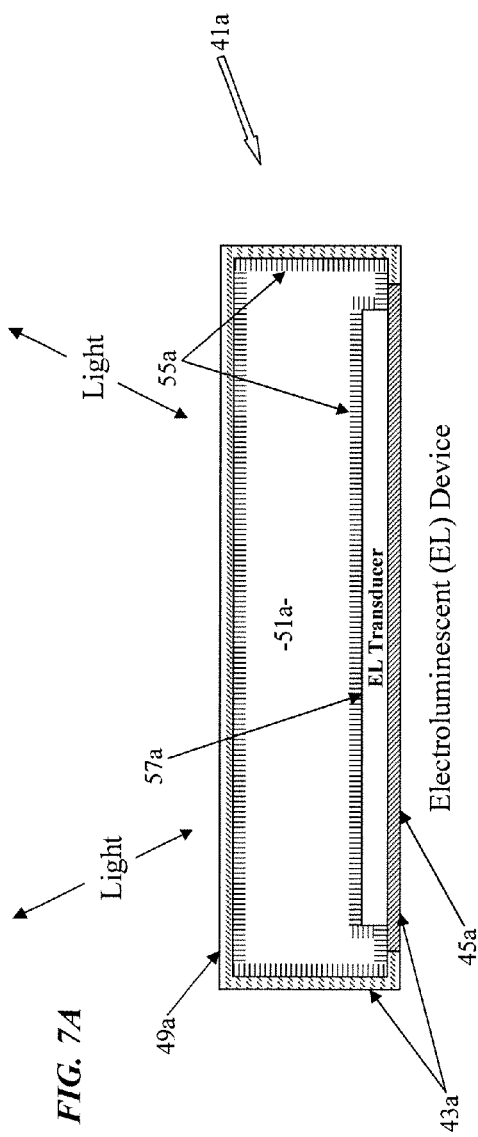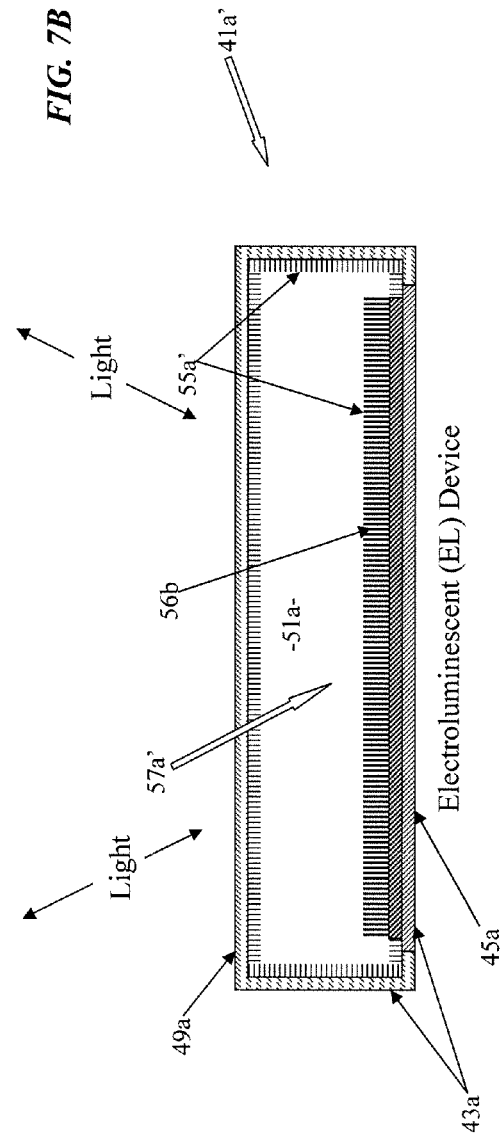
FIG. 7A
FIG. 7B

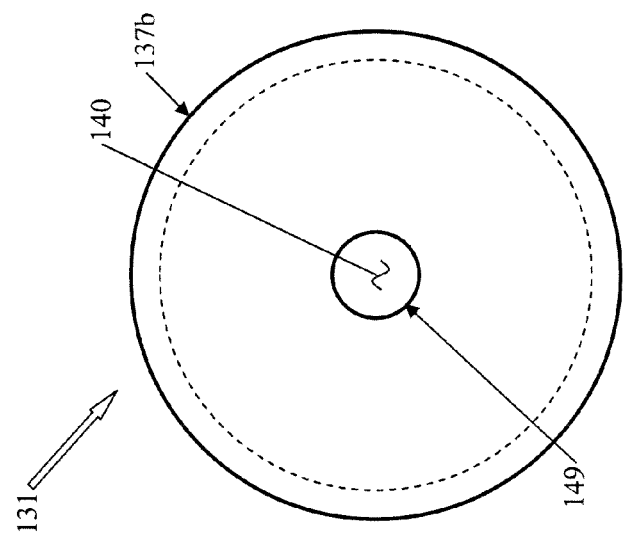
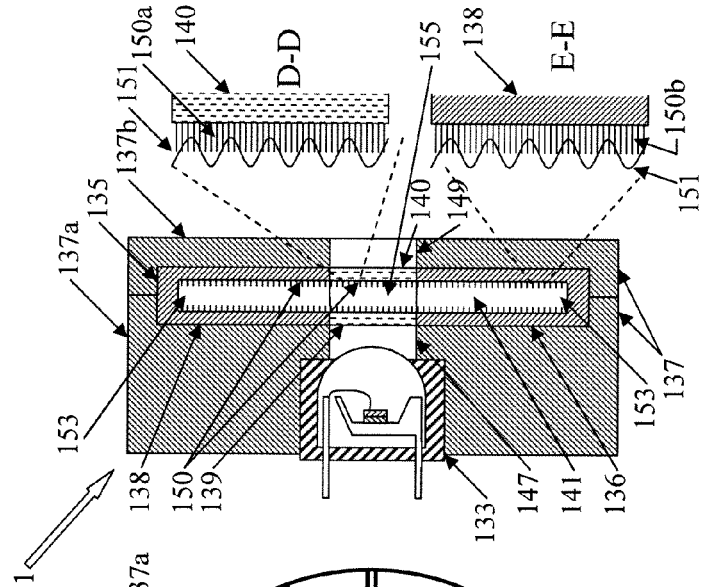
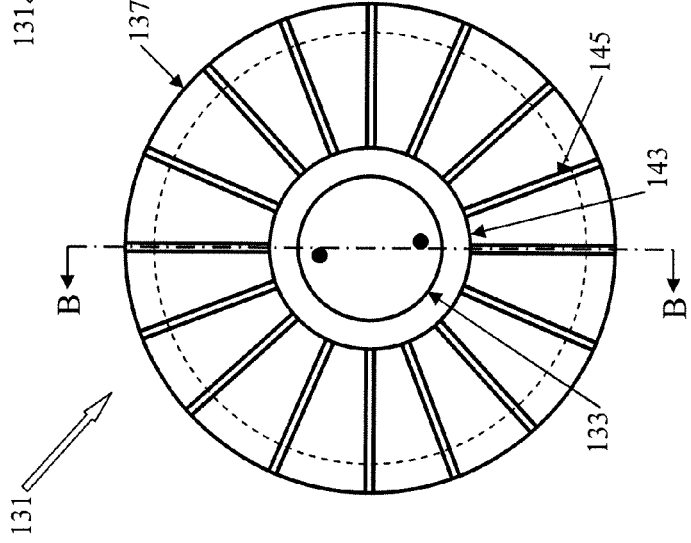

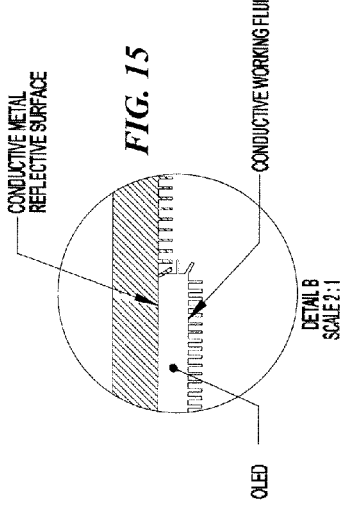
FIG. 12
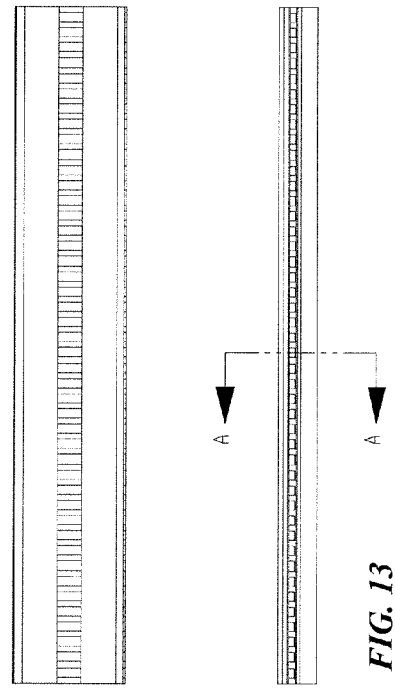
FIG. 13
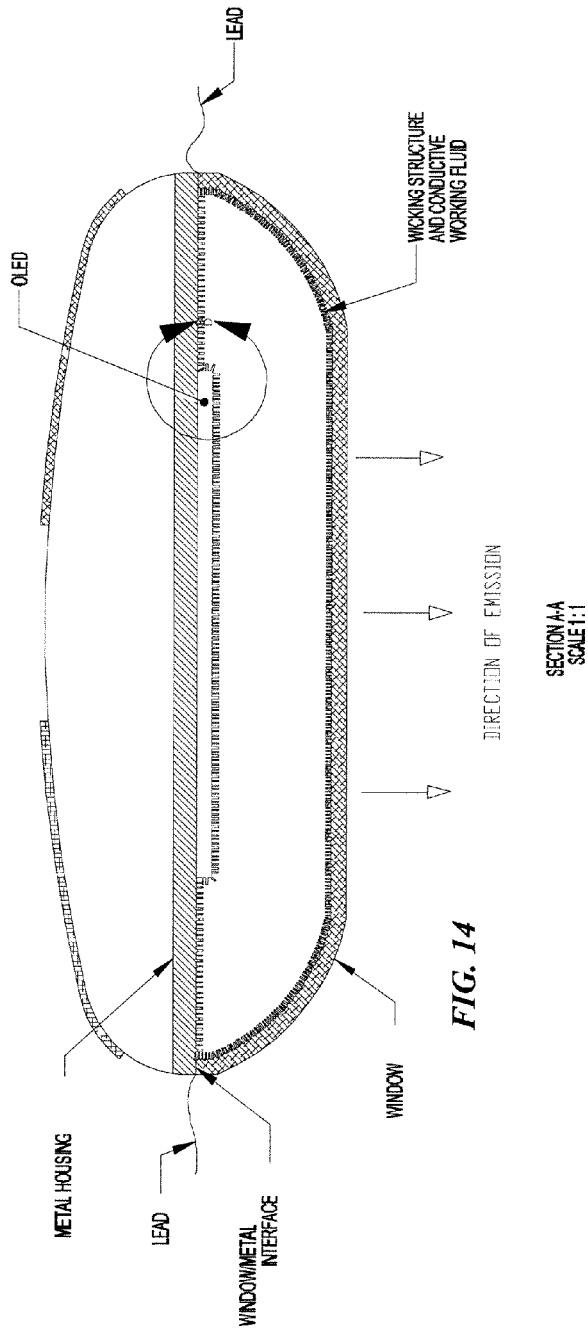
FIG. 15
FIG. 14

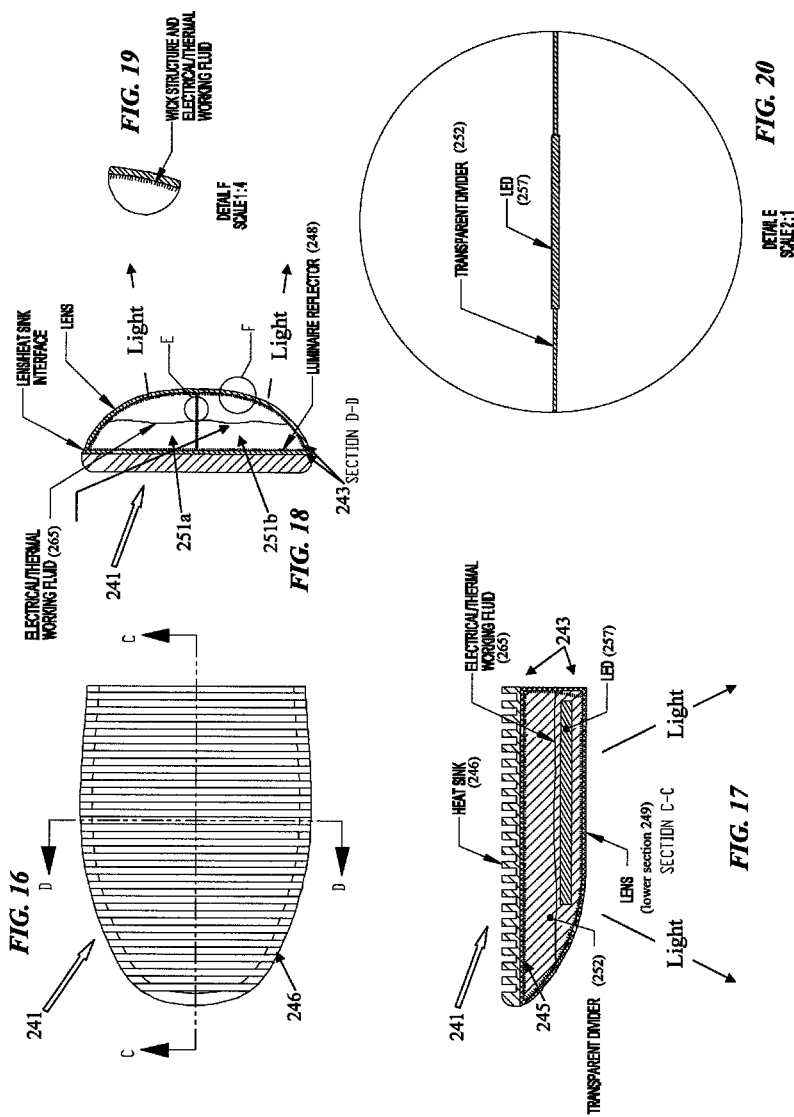

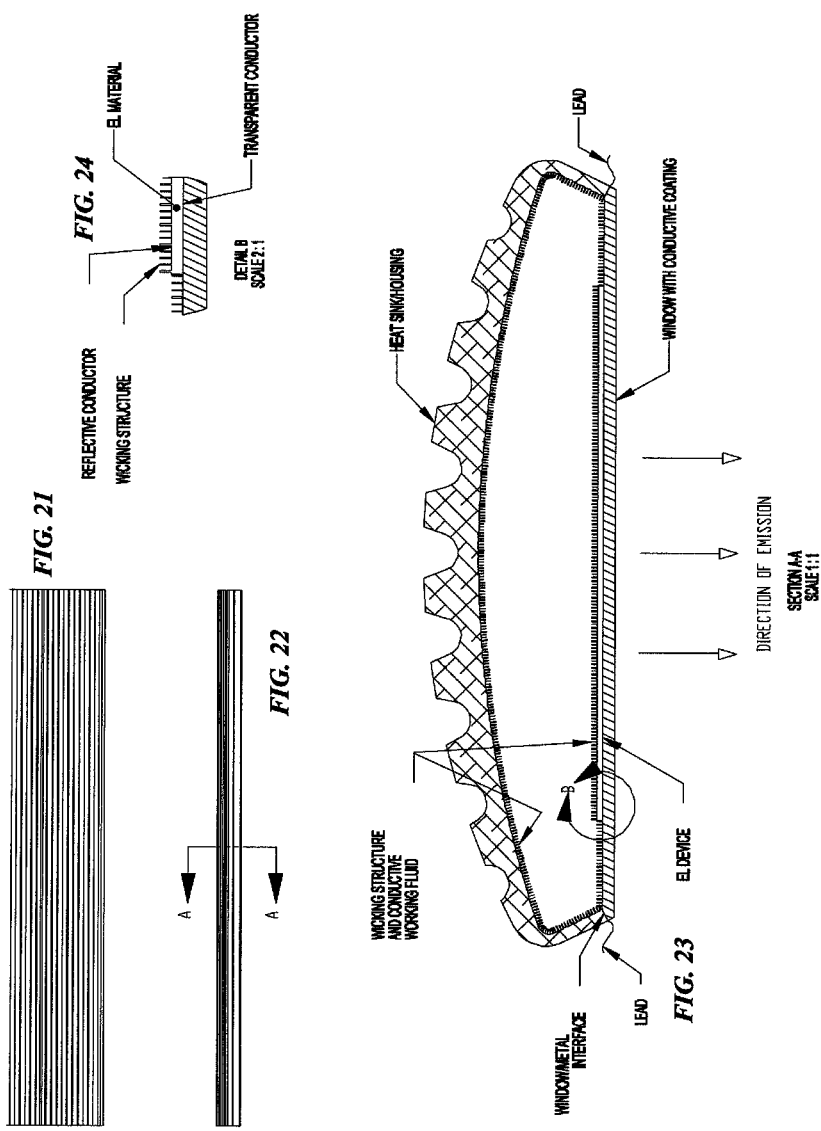

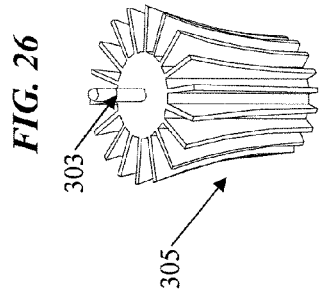
FIG. 26
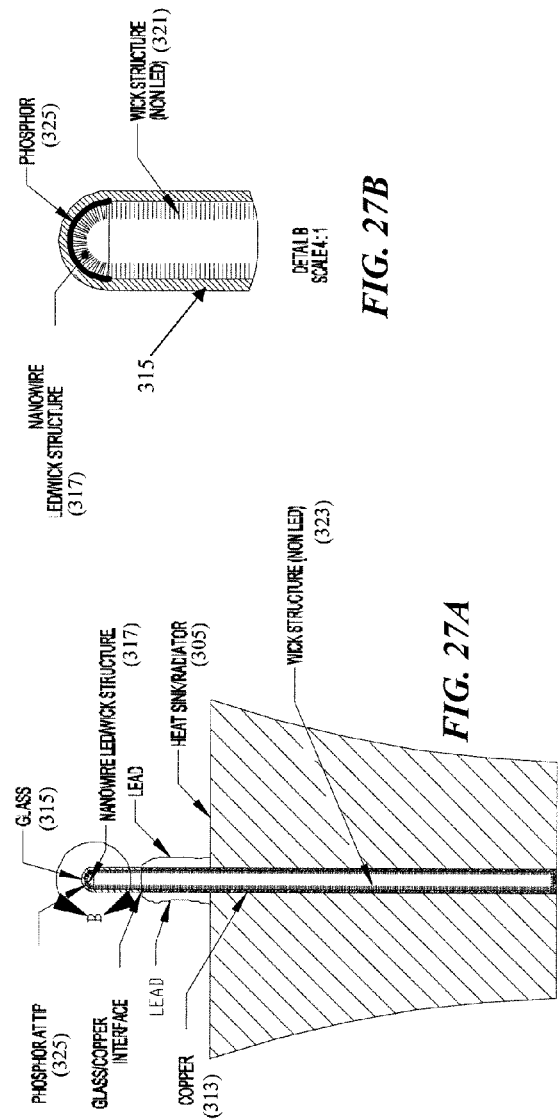
FIG. 27B
FIG. 27A
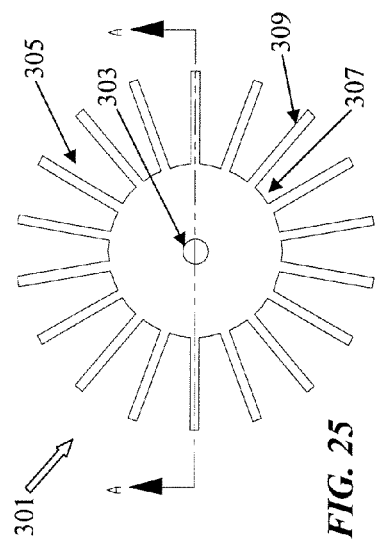
FIG. 25

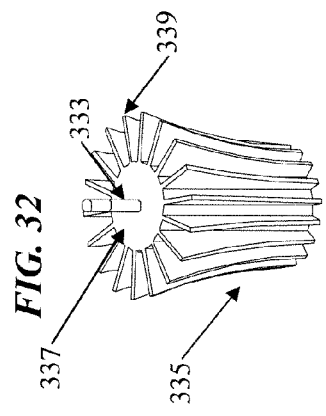
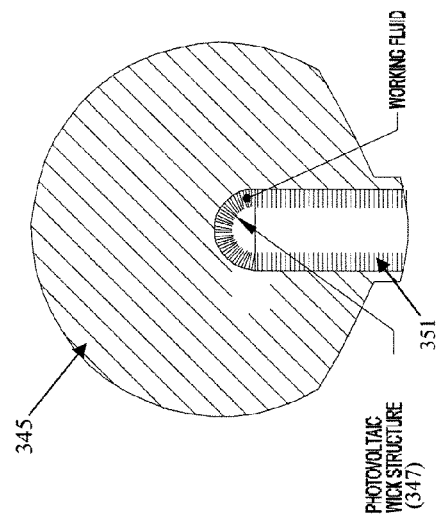
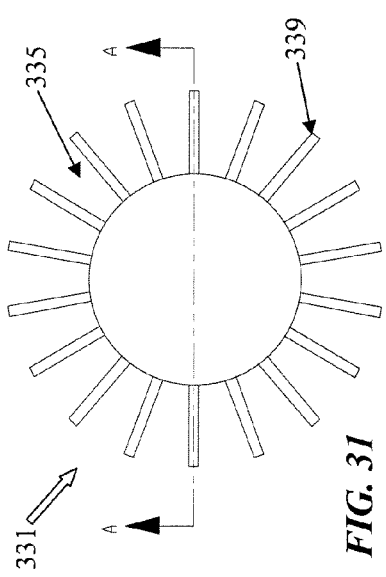
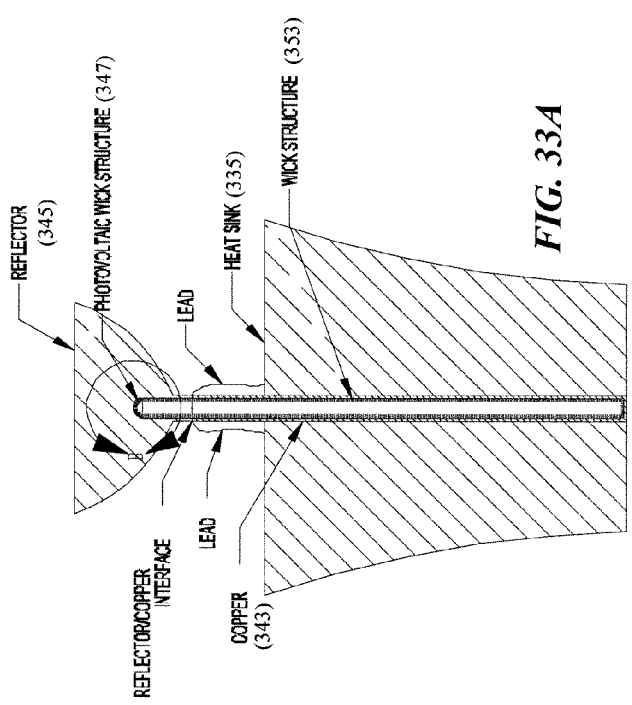

THERMAL CONDUCTIVITY AND PHASE TRANSITION HEAT TRANSFER MECHANISM INCLUDING OPTICAL ELEMENT TO BE COOLED BY HEAT TRANSFER OF THE MECHANISM

RELATED APPLICATIONS

This application is related to U.S. Utility application Ser. No. 13/221,083 Filed Aug. 30, 2011 entitled "PHOSPHOR INCORPORATED IN A THERMAL CONDUCTIVITY AND PHASE TRANSITION HEAT TRANSFER MECHANISM."

This application is related to U.S. Utility application Ser. No. 13/221,050 Filed Aug. 30, 2011 entitled "OPTICAL/ELECTRICAL TRANSDUCER USING SEMICONDUCTOR NANOWIRE WICKING STRUCTURE IN A THERMAL CONDUCTIVITY AND PHASE TRANSITION HEAT TRANSFER MECHANISM."

TECHNICAL FIELD

The present subject matter relates to thermal conductivity and phase transition heat transfer mechanisms, which incorporate an active optical element to be cooled by the heat transfer of the mechanism.

BACKGROUND

Many different types of active optical elements for emitting or responding to light used in optical/electrical transducers require effective dissipation of heat. Consider a semiconductor light emitter, such as a light emitting diode (LED) or laser diode, as a first example. To generate more light, the device is driven harder by a higher power drive current. However, the device then generates more heat.

The semiconductor may be damaged or break down if heated to or above a certain temperature. If the temperature gets too high, the device may burn out instantly. All semiconductor light emitters decline in efficiency of light generation as they are operated over time. However, even if the temperature is not high enough to burn out the device quickly, operating a semiconductor light emitter at relatively high temperatures (but below the burn-out temperature) for an extended period will cause the semiconductor light emitter to degrade more quickly than if operated at lower temperatures. Even when a device is running within its rated temperature, the hotter it gets, the less efficient it becomes. Conversely, the cooler the device operates, the more efficient it is.

Many available types of LEDs fail at ~150° C. LED performance data typically is based on junction temperature of 25° C. However, at more typical junction temperatures (~100° C.), operating performance is degraded by ~20% from the specified performance data.

As a solid state light emitter device such as a LED operates, the semiconductor generates heat. The heat must be effectively dissipated and/or the electrical drive power (and thus light output) must be kept low enough, to avoid breakdown or rapid performance degradation and/or to maintain operating efficiency. The package or enclosure of the semiconductor light emitter device typically includes a heat slug of a high thermal conductivity, which is thermally coupled to the actual semiconductor that generates the light. In operation, the slug is thermally coupled to a cooling mechanism outside the device package, such as a heat pipe and/or a heat sink. External active cooling may also be provided.

To increase the intensity of the light generated, the semiconductor light emitter may be driven with a higher intensity electrical current. Alternatively, an overall system or lighting device may include a number of semiconductor light emitters which together can produce a desired quantity of light output. With either approach, the increase in intensity of generated light increases the amount of heat that needs to be dissipated to avoid breakdown or rapid performance degradation and/or to maintain operating efficiency.

Also, many lighting technologies utilize phosphors that are susceptible to overheating. Again, consider a solid state lighting device, for a general lighting application, by way of an example. The solid state light sources typically produce light of specific limited spectral characteristics. To change or enhance the spectral characteristic of a solid state light source, for example, to obtain white light of a desired characteristic, one approach currently favored by LED (light emitting diode) manufacturers, utilizes a semiconductor emitter to pump phosphors within the device package (on or in close proximity to the actual semiconductor chip). Another approach uses one or more semiconductor emitters, but the phosphor materials are provided remotely (e.g. on or in association with a macro optical processing element such as a diffuser or reflector outside the semiconductor package). At least some opto-luminescent phosphors that produce desirable output light characteristics degrade quickly if heated, particularly if heated above a characteristic temperature limit of the phosphor material.

Hence, phosphor thermal degradation can be an issue of concern in many lighting systems. Thermal degradation of some types of phosphors may occur at temperatures as low as 85° C. Device performance may be degraded by 10-20% or more. The lifecycle of the phosphor may also be adversely affected by temperature.

At least some of the recently developed semiconductor nanophosphors and/or doped semiconductor nanophosphors may have an upper temperature limit somewhere in the range of 60-80° C. The light conversion output of these materials degrades quickly if the phosphor material is heated to or above the limit, particularly if the high temperature lasts for a protracted period.

Maintaining performance of the phosphors therefore creates a need for efficient dissipation of any heat produced during light generation. A current mitigation technique for phosphor thermal degradation is to maintain separation of the phosphor from the heat source and maximize unit area of phosphor to minimize flux density. However, the need for more lumens in an output using the phosphor requires larger phosphor unit area, and any limits placed on the flux density to reduce thermal impact on the phosphor constrains the overall device design.

The examples above relate to light generation devices or systems. However, similar heat dissipation issues may arise in devices or systems that convert light to other forms of energy such as electricity. For example light sensors or detectors and/or photovoltaic devices may degrade or breakdown if overheated, e.g. if subject to particularly intense input light of if subject to high light input over extended time periods. Even when a device is running within its rated temperature, the hotter it gets, the less efficient it becomes. Conversely, the cooler the device operates, the more efficient it is.

For these and other types of active optical elements for emitting or responding to light, there is a continuing need for ever more effective dissipation of heat. Improved heat dissipation may provide a longer operating life for the active optical element. Improved heat dissipation may allow a light emitter to be driven harder to emit more light or allow a detector/second or photovoltaic to receive and process more intense light.

Many thermal strategies have been tried to dissipate heat from and cool active optical elements. Many systems or devices that incorporate active optical elements use a heat sink to receive and dissipate heat from the active optical element(s). A heat sink is a component or assembly that transfers generated heat to a lower temperature medium. Although the lower temperature medium may be a liquid, the lower temperature medium often is air.

A larger heat sink with more surface area dissipates more heat to the ambient atmosphere. However, there is often a tension or trade off between the size and effectiveness of the heat sink versus the commercially viable size of the device that must incorporate the sink. For example, if a LED based lamp must conform to the standard form factor of an A-lamp, that form factor limits the size of the heat sink. To improve thermal performance for some applications, an active cooling element may be used, to dissipate heat from a heat sink or from another thermal element that receives heat from the active optical element(s). Examples of active cooling elements include fans, Peltier devices, membronic cooling elements and the like.

Other thermal strategies for equipment that use active optical elements have utilized heat pipes or other devices based on principles of a thermal conductivity and phase transition heat transfer mechanism. A heat pipe or the like may be used alone or in combination with a heat sink and/or an active cooling element.

A device such as a heat pipe relies on thermal conductivity and phase transition between evaporation and condensation to transfer heat between two interfaces. Such a device includes a vapor chamber and working fluid within the chamber, typically at a pressure somewhat lower than atmospheric pressure. The working fluid, in its liquid state, contacts the hot interface where the device receives heat input. As the liquid absorbs the heat, it vaporizes. The vapor fills the otherwise empty volume of the chamber. Where the chamber wall is cool enough (the cold interface), the vapor releases heat to the wall of the chamber and condenses back into a liquid. Thermal conductivity at the cold interface allows heat transfer away from the mechanism, e.g. to a heat sink or to ambient air. By gravity or a wicking structure, the liquid form of the fluid flows back to the hot interface. In operation, the working fluid goes through this evaporation, condensation and return flow to form a repeating thermal cycle that effectively transfers the heat from the hot interface to the cold interface. Devices like heat pipes can be more effective than passive elements like heat sinks, and they do not require power or mechanical parts as do active cooling elements. It is best to get the heat away from the active optical element as fast as possible, and the heat pipe improves heat transfer away from the active optical element, even where transferring the heat to other heat dissipation elements.

Although these prior technologies do address the thermal issues somewhat, there is still room for further improvement.

For example, passive cooling elements, active cooling elements and heat transfer mechanisms that rely on thermal conductivity and phase transition have been implemented outside of the devices that incorporate active optical elements. A light processing device may include one or more elements coupled to the actual active optical element to transfer heat to the external thermal processing device. In our LED example, heat passes through of the layers of the semiconductor, to the heat slug and then to the external thermal processing device(s). The need to transfer the heat through so many elements and the various interfaces between those elements reduces efficiency in cooling the thermally susceptible component(s) of the active optical element. Again referencing the LED example, the need to transfer the heat through so many elements reduces efficiency in cooling the LED chip, particularly cooling at the internal the layer/point in the semiconductor chip where the light is actually generated.

It has been suggested that a heat pipe type mechanism could be incorporated at the package level with the LED (WO 2007/069119 (A1)). However, even in that device, a heat spreader and a light transmissive collimator encapsulate the actual LED chip and separate the chip from the working fluid. Heat from the LED chip structure is transferred through the heat spreader to the working fluid much like the prior examples that used an external heat pipe coupled to the heat slug of the LED package.

There is an increasing desire for higher, more efficient operation (light output or response to light input) in ever smaller packages. As outlined above, thermal capacity is a limiting technical factor. Thermal capacity may require control of heat at the device level (e.g. transducer package level and/or macro device level such as in a lamp or fixture). Also, for equipment utilizing phosphors, there is a continuing need for ever more effective dissipation of heat. Improved heat dissipation may provide a longer operating life for the apparatus or device using the phosphor(s). Improved heat dissipation may allow a device to drive the phosphor harder, to emit more light, for a particular application.

Hence, it may be advantageous to reduce the distance and/or number elements and interfaces that the heat must pass through from the active optical element. As outlined above, thermal capacity may require control of heat at the phosphor level. Hence, it may be advantageous to improve technologies to more effectively dissipate heat from and/or around phosphor materials. Also, improvement in technologies to more effectively dissipate heat from active optical elements may help to meet increasing performance demands with respect to the various types of equipment that use the active optical elements.

SUMMARY

The teachings herein alleviate one or more of the above noted problems and provide improved cooling of an active optical element to dissipate heat present at the element during its processing of light. Examples will address applications to various active optical elements and/or optical/electrical transducers or other devices that incorporate such elements.

As discussed more fully below, a thermal conductivity and phase transition heat transfer mechanism will incorporate an active optical element to be cooled by the heat transfer of the mechanism. The mechanism includes a member that is at least partially optically transmissive serving both to seal the working fluid within the chamber and to allow passage of light to or from the active optical element. At least a portion of the active optical element is exposed to a working fluid within a vapor tight chamber of the heat transfer mechanism.

As a result, in the examples, the working fluid directly contacts at least a portion of an active optical element in the mechanism. There are no separate elements creating additional layers or thermal interfaces between the active optical element and the working fluid of the heat transfer mechanism. This improves the efficiency of transfer of heat from the active optical element to the working fluid and thus improves the cooling of the active optical element by operation of the phase transition heat transfer mechanism.

Disclosed examples encompass the mechanisms that include or incorporate the active optical elements, for light emission applications as well as for applications involving production of electrical signals in response to light. Examples include mechanisms that incorporate various semiconductor optical/electrical transducers as well as mechanisms that incorporate phosphors.

In a light emission application, the integration of heat transfer and light generation functions may enable significantly greater light output with more efficient heat transfer from the emitter. Similar advantages may be provided in applications to transducers that respond to light input.

An example of a thermal conductivity and phase transition heat transfer mechanism includes a housing having a section that is thermally conductive and a member that is at least partially optically transmissive. The section and member are connected to form a seal for a vapor tight chamber enclosed by the housing. The mechanism also includes a working fluid within the chamber and an active optical element to be cooled by phase transition of the heat transfer mechanism. The active optical element is configured to be driven to emit light and/or driven by light to produce an electrical current, through the optically transmissive member. At least a portion of the active optical element is at least partially exposed within the chamber so as to be incorporated in or in contact with the working fluid. The pressure within the chamber configures the working fluid to absorb heat during operation of the active optical element, to vaporize at a relatively hot location of the mechanism as it absorbs heat from the operation of the active optical element, to transfer heat to and condense at a relatively cold location of the mechanism, and to return as a liquid to the relatively hot location of the mechanism.

Another example of a thermal conductivity and phase transition heat transfer mechanism includes a housing with a thermally conductive section connected together with a member, that is at least partially optically transmissive, to form a seal for a vapor tight chamber enclosed by the housing. The mechanism also includes a semiconductor device to be cooled by phase transition of the heat transfer mechanism. The semiconductor device is of a type configured to be driven to emit light and/or driven by light to produce an electrical current, through the optically transmissive member. At least a surface of the semiconductor device is at least partially exposed within the chamber. A working fluid is provided within the chamber, and the pressure within the chamber configures the working fluid to absorb heat during operation of the semiconductor device, to vaporize at a relatively hot location of the mechanism as it absorbs heat from the operation of the semiconductor device, to transfer heat to and condense at a relatively cold location of the mechanism, and to return as a liquid to the relatively hot location of the mechanism. In this example, the working fluid is electrically conductive for carrying electrical current to or from a portion of the surface of the semiconductor device during operation of the semiconductor device.

In another example of a thermal conductivity and phase transition heat transfer mechanism, the housing has a member that is at least partially optically transmissive connected to a thermally conductive section, to form a seal for a vapor tight chamber enclosed by the housing, and a working fluid within the chamber. In this example, the mechanism also includes an electroluminescent type light emitter, which includes an electroluminescent material, e.g. a thin film structure or a phosphor, of a type configured to be driven to emit light for passage through the optically transmissive member. At least a portion of the electroluminescent phosphor is exposed to the working fluid within the chamber. The pressure within the chamber configures the working fluid to absorb heat during operation of the electroluminescent light emitter, to vaporize at a relatively hot location of the mechanism as it absorbs heat from the operation of the electroluminescent light emitter including at least some heat from the electroluminescent phosphor, to transfer heat to and condense at a relatively cold location of the mechanism, and to return as a liquid to the relatively hot location of the mechanism.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 6-8 are examples of devices similar to the device of FIG. 1A, where the optical/electrical transducer is a LED or photodiode (FIG. 6), electroluminescent devices (FIGS. 7A-7C), or an OLED (FIG. 8).

FIGS. 10A-10C are various views of an example of a light emitting device or light engine, having a source and a thermal conductivity and phase transition heat transfer mechanism that incorporates a phosphor within the thermal conductivity and phase transition heat transfer mechanism, in a manner analogous to the example of FIG. 1C.

FIGS. 12-15 are various views of an example of a linear downlight utilizing an OLED in a thermal conductivity and phase transition heat transfer mechanism.

FIGS. 16-20 are various views of an example of street lamp utilizing a two-sided semiconductor light emitter and a two-chamber thermal conductivity and phase transition heat transfer mechanism.

FIGS. 21-24 are various views of an example of an electroluminescent device type linear downlight utilizing an electroluminescent emitter in a thermal conductivity and phase transition heat transfer mechanism.

FIGS. 25 and 26 are top and isometric views of a light emitting type optical/electrical transducer apparatus and heat sink as may be used in a fixture or lamp/light bulb.

FIG. 27A is a cross-sectional view taken along line A-A of FIG. 25.

FIG. 27B is an enlarged detail view of a portion of the optical/electrical transducer apparatus and heat sink of FIG. 27A.

FIGS. 31 and 32 are top and isometric views of a light-receiving type optical/electrical transducer apparatus, a heat sink and a light concentrator, as may be used in for a sensor or photovoltaic apparatus.

FIG. 33A is a cross-sectional view taken along line A-A of FIG. 31.

FIG. 33B is an enlarged detail view of a portion of the optical/electrical transducer apparatus and heat sink of FIG. 33A.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various mechanisms, transducers, apparatuses and systems disclosed herein utilize thermal conductivity and phase transition heat transfer mechanisms that incorporate active optical elements. Examples of active optical elements include various phosphor materials for emitting light, various electrically driven light emitters and various devices that generate electrical current or an electrical signal in response to light. The thermal conductivity and phase transition between evaporation and condensation, of the thermal conductivity and phase transition heat transfer mechanism, cools the active optical element during operation. At least a portion of the active optical element is exposed to a working fluid within a vapor tight chamber of the heat transfer mechanism. The heat transfer mechanism includes a member that is at least partially optically transmissive to allow passage of light to or from the active optical element and to seal the chamber of the heat transfer mechanism with respect to vapor contained within the chamber.

An optical/electrical transducer apparatus is a device that converts between forms of optical and electrical energy, for example, from optical energy to an electrical signal or from electrical energy to an optical output. Examples of optical-to-electrical transducers include various sensors, photovoltaic devices and the like. Examples of electrical-to-optical transducers include various light emitters, although the emitted light may be in the visible spectrum or in other wavelength ranges.

The phase transition of the mechanism is closer to the actual active optical element and transfers heat away from the element more quickly. The element/mechanism would still often be used in combination with one or more other thermal transfer or heat dissipation elements, such as a heat sink and/or an active cooling element coupled to the cold interface of the mechanism.

Figure 1A:
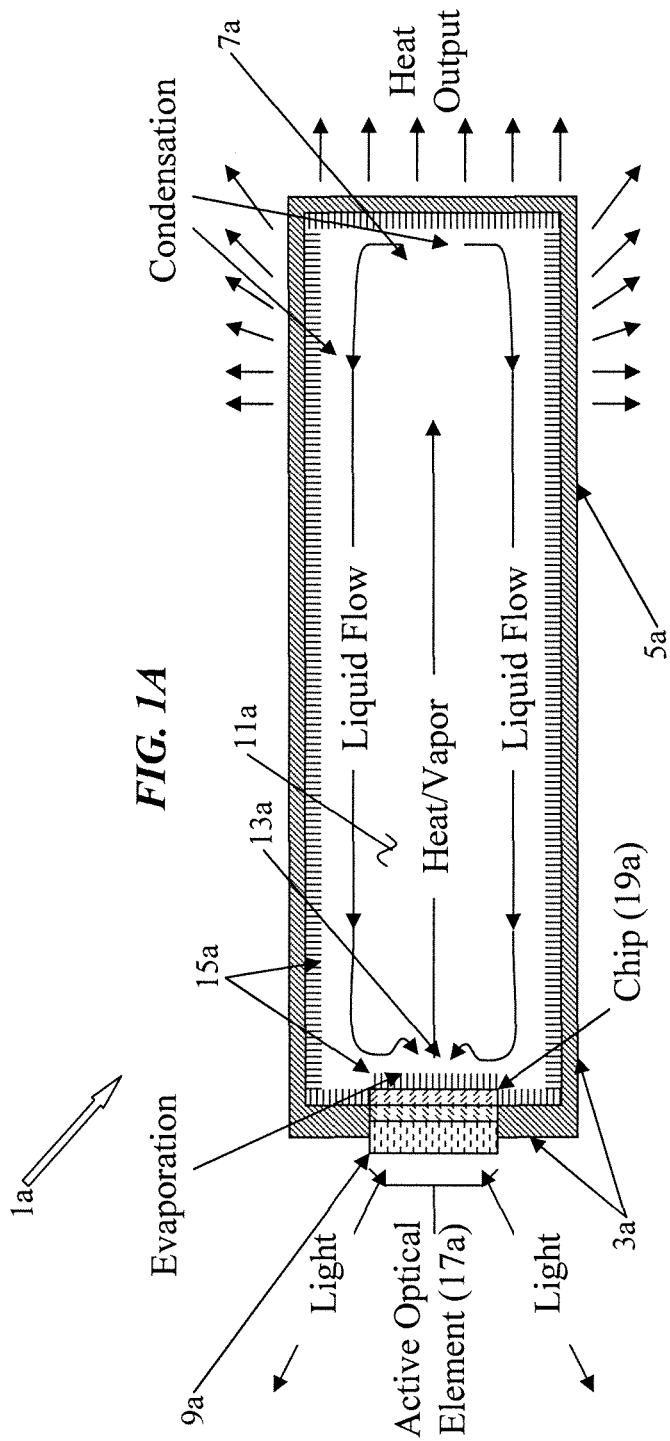
FIG. 1A is a cross-sectional view of a first example of a thermal conductivity and phase transition heat transfer mechanism that incorporates an active optical element, such as a multilayer optical/electrical transducer optical/electrical transducer.

Reference now is made in detail to the examples illustrated in the accompanying drawings and discussed below. FIG. 1A is a cross-sectional view of a somewhat stylized example of an optical/electrical transducer apparatus $1a$, where the actual transducer is an active optical element $17a$ of or within a combined phase transition heat transfer mechanism.

An active optical element converts energy from one form or another by an electrical process and/or an excitation state change process, where at least one form of the energy is optical, e.g. light. Active optical elements include optically driven elements, such as optically pumped phosphors and/or electrical devices driven by light to produce electricity, as well as electrical devices and/or phosphors driven by electricity or electrical/electromagnetic fields to produce light. In the example, the active optical element $17a$ is a multi-layer solid state "transducer" in the form of a 'chip' or the like $19a$ for converting between light and electricity. Examples include semiconductor based light emitters, such as LEDs and OLEDS, as well electroluminescent devices. Examples also include light responsive devices, such as photovoltaic devices and photodiodes for sensor or detector type applications. Examples of mechanisms incorporating semiconductor devices that include semiconductor nanowires as the active optical elements and examples of mechanisms incorporating phosphor as the active optical elements are discussed later at a similarly high level with respect to FIGS. 1B and 1C. By contrast, passive optical elements process and even change the character of light, but by optical processing only, that is to say, without use of an electrical and/or excitation state change process. Examples of passive optical elements include windows, lenses, optical color filters, reflectors, gratings, diffusers, and the like.

The transducer apparatus $1a$ includes a housing $3a$. The housing $3a$ has at least one section that is thermally conductive. In the example of FIG. 1A, the major section $5a$ of the housing 3a is formed of a thermally conductive material. Examples of suitable materials include metals, such as copper and aluminum, although other thermally conductive materials, such as thermally conductive plastics and ceramics, may be used to form the housing section 5a. A portion of the housing section 5a will form a cold location 7a, for example, acting as or coupled to a heat sink (not separately shown).

The housing 3a has a member 9a that is at least partially optically transmissive. The member 9a may be transparent or translucent or exhibit other transmissive characteristics (e.g. non-white color filtering), depending on the optical requirements of the particular application of the transducer apparatus 1a. The material forming the member 9a may be any material of sufficient optical transmissivity and desired color characteristic for the particular application that is also able to withstand the expected operating temperatures of the transducer apparatus 1a. Examples of suitable materials for the member 9a include various forms of glass, ceramics and plastics. The material for the member 9a may or may not need to be heat resistant, depending on the operating temperature at the hot location 7a maintained by operation of the thermal conductivity and phase transition heat transfer mechanism. The optically transmissive member 9a is connected to the housing section 5a to form a seal for a vapor tight chamber 11a enclosed by the thermally conductive housing section 5a and the optically transmissive member 9a. The material of the member 9a is sufficiently transmissive to light, at least in the portion of the optical energy spectrum that is relevant to operations of the apparatus 1a, so as to allow passage of optical energy into and/or out of the apparatus 1a.

As noted, the optically transmissive member 9a is attached to the housing section 5a to form a seal for a vapor tight chamber 11a. For example, if the optically transmissive member 9a is a glass or ceramic material and the housing section 5a is formed of a metal, the two elements may be joined by a glass frit process or by application of a suitable epoxy.

The exemplary apparatus 1a also includes a working fluid within the chamber 11a. The pressure within the chamber 11a, typically a pressure somewhat lower than atmospheric pressure, configures the working fluid to absorb heat during operation of the apparatus, to vaporize at a relatively hot location 13a as it absorbs heat, to transfer heat to and condense at the relatively cold location 7a, and to return as a liquid to the relatively hot location. A variety of different fluids may be used as the working fluid, and the pressure is determined based on the fluid type and the amount of heat that the fluid is expected to transfer.

The working fluid, in its liquid state, contacts the hot interface at the location 13a where the apparatus receives or produces heat. In the example, heat is absorbed from surfaces of the multi-layer solid state transducer 19a of the active optical element 17a. As the liquid absorbs the heat, it vaporizes. The vapor fills the otherwise empty volume of the chamber 11a. Where the chamber wall is cool enough (the cold interface at location 7a), the vapor releases heat to the wall of the chamber 11a and condenses back into a liquid. The drawing shows a central arrow from the hot location 13a toward the cold location 7a. This arrow generally represents the flow of heat in the vapor state of the working fluid from the hot location 13a where the working fluid vaporizes toward the cold location 7a where the working fluid transfers heat for output via the thermally conductive housing section 5a and condenses back to the liquid form. The liquid form of the fluid flows back to the hot interface at location 13a. The drawing shows arrows generally along the outer wall(s) of the housing from the relatively cold location 7a back to the relatively hot location 13a. The arrows generally represent the flow of the condensed working fluid from the relatively cold location 7a back to the relatively hot location 13a where the fluid again vaporizes as it absorbs heat. In operation, the working fluid goes through this evaporation, condensation and return flow to form a repeating thermal cycle that effectively transfers the heat from the hot interface at location 13a to the cold interface at location 7a.

The apparatus 1a thus is configured as a thermal conductivity and phase transition heat transfer mechanism, similar to many mechanisms which are sometimes referred to as "heat pipes." The thermal conductivity of the housing section 5a and the phase transition cycle through evaporation and condensation transfer heat from the hot location 13a to the cold location 7a. Thermal conductivity at the cold interface allows heat transfer away from the mechanism, e.g. to a heat sink or to ambient air. Active cooling may also be provided. The configuration of the mechanism together with the degree of cooling determines the internal operating temperature. For example, the mechanism and a heat sink may support a maximum internal operating temperature around 50° C. Addition of active cooling or refrigeration at the cold interface may enable operation at a much lower internal temperature, such as 0° C.

The exemplary apparatus 1a also includes a wicking structure 15a mounted within the chamber 11a to facilitate flow of the condensed liquid of the working fluid from the cold location 7a to the hot location 13a of the mechanism 1a. Capillary action or "wicking" relies on inter-molecular forces between a liquid and the surface(s) of a material around the liquid to cause movement of the liquid along or through the material. This action can overcome other forces on the liquid, such as gravity, to promote a desired movement of the liquid. In the thermal conductivity and phase transition heat transfer mechanism, the wicking structure 15a promotes movement of the condensed liquid back from the cold location 7a to the hot location 13a.

The wicking structure 15a may take many forms, such as sintered metal, phosphor, glass or ceramic powder; woven copper; surface grooves, mesh arrangements or small closely spaced wires extending inward from the surfaces of the housing forming the walls of the chamber 11a; as well as nanoscale wire structures extending inward from the chamber surface(s); and various combinations of these forms. The spacing between elements of the wicking structure 15a is sufficiently small to cause inter-molecular forces on the liquid form of the working fluid to cause the liquid to flow toward the region where the fluid vaporizes, that is to say, the hot location 13a in the apparatus 1a. This wicking or capillary action enables the liquid form of the working fluid to flow back to the hot location 13a regardless of the orientation of (and thus the impact of gravity on fluid in) the heat transfer mechanism.

The apparatus 1a includes an active optical element 17a. In this case, the active optical element is an optical/electrical transducer, in the form of a multi-layer device or chip as shown at 19a. The transducer 17a converts between optical and electrical energy. The present teachings apply to transducers 17a for emitting light in response to an electrical drive signal or for receiving and responding to light to produce an electrical signal. In the apparatus 1a, light enters the apparatus through the optically transmissive member 9a, for an optical-to-electrical conversion application to reach the transducer 17a. For an electrical-to-optical conversion application, light produced by operation of the transducer 17a emerges from the apparatus 1a through the optically transmissive member 9a.

If the apparatus 1a is cylindrical, then when viewed from either end, the apparatus 1a would appear circular. The member 9a could be circular or have other shapes, even in a cylindrical implementation of the apparatus 1a. Those skilled in the art will appreciate that the lateral shapes of the mechanism as a whole and of the optically transmissive member may take other geometric forms, such as oval, rectangular or square, just to name a few examples.

The orientation in the drawing, in which light enters the apparatus 1a or is emitted from the apparatus 1a to the left in directions about a somewhat horizontal central axis, is shown only for purposes of illustration. Those skilled in the art will appreciate that the apparatus may be used in any other orientation that is desirable or suitable for any particular application of the transducer apparatus. Some implementations may utilize more than one optically transmissive member, to facilitate receipt or emission of light in additional directions. Although not shown, passive optical processing elements, such as diffusers, reflectors, lens and the like, may be coupled to the optically transmissive member to process light directed into the transducer apparatus 1a or to process light emitted from the transducer apparatus 1a.

The examples discussed herein with regard to FIG. 1A relate to transducer type active optical elements 17a that are formed of one or more layers 19a, such as layers form an electroluminescent device or a semiconductor device. The transducer 17a is configured to emit light through the optically transmissive member 9a, and/or to be driven by light received via the optically transmissive member 9a. At least a portion of a surface of the multilayer chip or the like 19 is exposed to the working fluid in the chamber 11a of the mechanism and is accessible for direct transfer of heat to the working fluid at the hot location 15a, to facilitate efficient cooling of the element 17a by the thermal conductivity and phase transition heat transfer of mechanism 1.

Figure 1B:
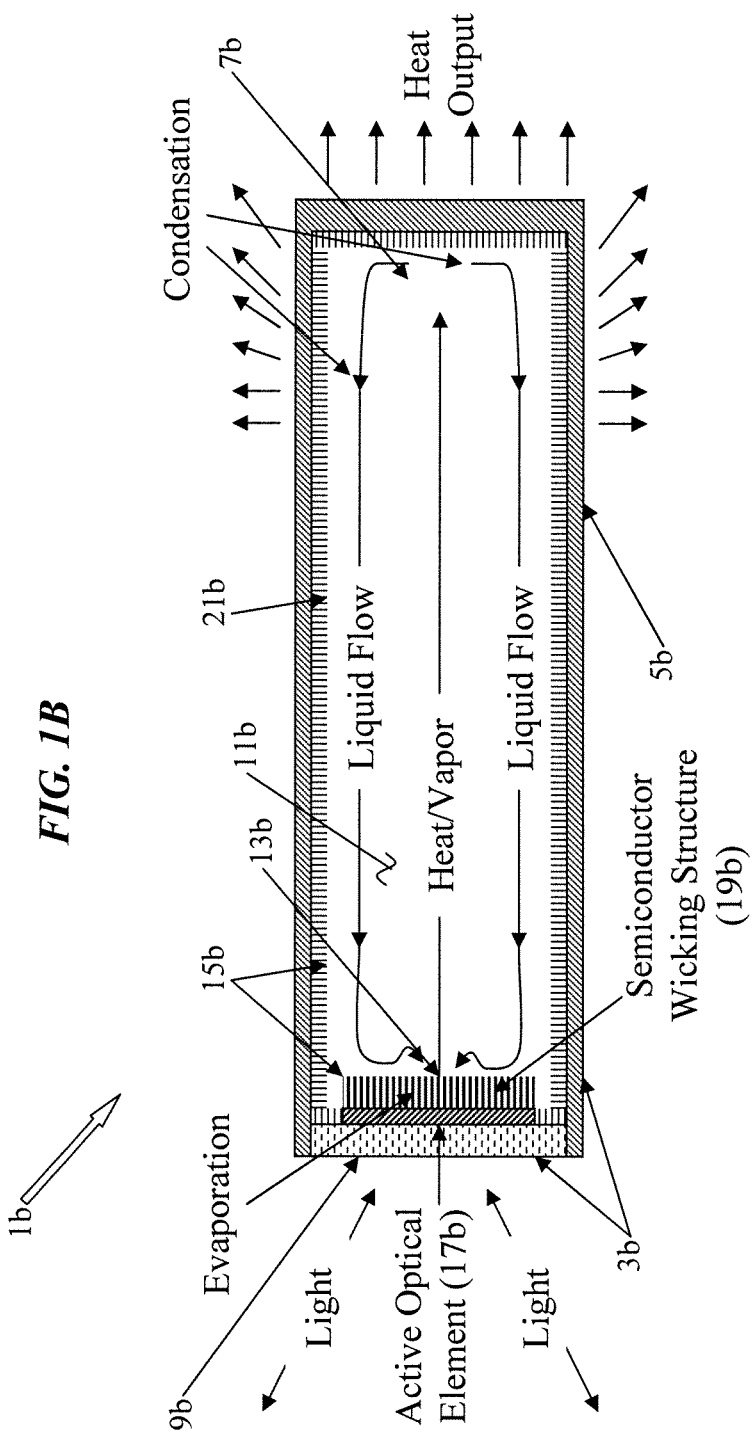
FIG. 1B is a cross-sectional view of an example of an optical/electrical transducer apparatus, in the form of a second thermal conductivity and phase transition heat transfer mechanism, in this example, a mechanism that incorporates an active optical element in the form of a semiconductor transducer utilizing semiconductor nanowires that also form at least a portion of the wicking structure of the thermal conductivity and phase transition heat transfer mechanism.

FIG. 1B is a cross-sectional view of a somewhat stylized example of an optical/electrical transducer apparatus 1b, where the actual transducer is an active optical element 17b of or within a combined phase transition heat transfer mechanism. In this second example, the active optical element 17b is a semiconductor "transducer" for converting between light and electricity that, at least in part, uses semiconductor nanowires 19b to produce or respond to light. The nanowires 19b are also part of a wicking structure 15b.

The transducer apparatus 1b includes a housing 3b. The housing 3b has at least one section that is thermally conductive. In the example of FIG. 1B, the major section 5b of the housing 3b is formed of a thermally conductive material. Examples of suitable materials include metals, such as copper and aluminum, although other thermally conductive materials, such as thermally conductive plastics and ceramics, may be used to form the housing section 5b. A portion of the housing section 5b will form a cold location 7b, for example, acting as or coupled to a heat sink (not separately shown).

The housing 3b has a member 9b that is at least partially optically transmissive. The member 9b may be transparent or translucent or exhibit other transmissive characteristics (e.g. non-white color filtering), depending on the optical requirements of the particular application of the transducer apparatus 1b. The material forming the member 9b may be any material of sufficient optical transmissivity and desired color characteristic for the particular application that is also able to withstand the expected operating temperatures of the transducer apparatus 1b. Examples of suitable materials for the member 9b include various forms of glass, ceramics and plastics. The material for the member 9b may or may not need to be heat resistant, depending on the operating temperature at the hot location 7b maintained by operation of the thermal conductivity and phase transition heat transfer mechanism. The optically transmissive member 9b is connected to the housing section 5b to form a seal for a vapor tight chamber 11b enclosed by the thermally conductive housing section 5b and the optically transmissive member 9b. The material of the member 9b is sufficiently transmissive to light, at least in the portion of the optical energy spectrum that is relevant to operations of the apparatus 1b, so as to allow passage of optical energy into and/or out of the apparatus 1b.

As noted, the optically transmissive member 9b is attached to the housing section 5b to form a seal for a vapor tight chamber 11b. For example, if the optically transmissive member 9b is a glass or ceramic material and the housing section 5b is formed of a metal, the two elements may be joined by a glass frit process or by application of a suitable epoxy.

The exemplary apparatus 1b also includes a working fluid within the chamber 11b. The pressure within the chamber 11b, typically a pressure somewhat lower than atmospheric pressure, configures the working fluid to absorb heat during operation of the apparatus, to vaporize at a relatively hot location 13b as it absorbs heat, to transfer heat to and condense at the relatively cold location 7b, and to return as a liquid to the relatively hot location. A variety of different fluids may be used as the working fluid, and the pressure is determined based on the fluid type and the amount of heat that the fluid is expected to transfer.

The working fluid, in its liquid state, contacts the hot interface at the location 13b where the apparatus receives or produces heat. In the example, heat is absorbed from surfaces of the semiconductor nanowires 19b of the transducer element 17b. As the liquid absorbs the heat, it vaporizes. The vapor fills the otherwise empty volume of the chamber 11b. Where the chamber wall is cool enough (the cold interface at location 7b), the vapor releases heat to the wall of the chamber 11b and condenses back into a liquid. The drawing shows a central arrow from the hot location 13b toward the cold location 7b. This arrow generally represents the flow of heat in the vapor state of the working fluid from the hot location 13b where the working fluid vaporizes toward the cold location 7b where the working fluid transfers heat for output via the thermally conductive housing section 5b and condenses back to the liquid form. The liquid form of the fluid flows back to the hot interface at location 13b. The drawing shows arrows generally along the outer wall(s) of the housing from the relatively cold location 7b back to the relatively hot location 13b. The arrows generally represent the flow of the condensed working fluid from the relatively cold location 7b back to the relatively hot location 13b where the fluid again vaporizes as it absorbs heat. In operation, the working fluid goes through this evaporation, condensation and return flow to form a repeating thermal cycle that effectively transfers the heat from the hot interface at location 13b to the cold interface at location 7b.

The apparatus 1b thus is configured as a thermal conductivity and phase transition heat transfer mechanism, similar to many mechanisms which are sometimes referred to as "heat pipes." The thermal conductivity of the housing section 5b and the phase transition cycle through evaporation and condensation transfer heat from the hot location 13b to the cold location 7b. Thermal conductivity at the cold interface allows heat transfer away from the mechanism, e.g. to a heat sink or to ambient air. Active cooling may also be provided. The configuration of the mechanism together with the degree of cooling determines the internal operating temperature. For example, the mechanism and a heat sink may support a maximum internal operating temperature around 50° C. Addition of active cooling or refrigeration at the cold interface may enable operation at a much lower internal temperature, such as 0° C.

Like the example of FIG. 1A, the exemplary apparatus 1b also includes a wicking structure 15b mounted within the chamber 11b to facilitate flow of the condensed liquid of the working fluid from the cold location 7b to the hot location 13b of the mechanism 1b. In the thermal conductivity and phase transition heat transfer mechanism, the wicking structure 15b promotes movement of the condensed liquid back from the cold location 7b to the hot location 13b.

The wicking structure 15b may take many forms, such as sintered metal, phosphor, glass or ceramic powder; woven copper; surface grooves, mesh arrangements or small closely spaced wires extending inward from the surfaces of the housing forming the walls of the chamber 11b; as well as nanoscale wire structures extending inward from the chamber surface(s); and various combinations of these forms. The spacing between elements of the wicking structure 15b is sufficiently small to cause inter-molecular forces on the liquid form of the working fluid to cause the liquid to flow toward the region where the fluid vaporizes, that is to say, the hot location 13b in the apparatus 1b. This wicking or capillary action enables the liquid form of the working fluid to flow back to the hot location 13b regardless of the orientation of (and thus the impact of gravity on fluid in) the heat transfer mechanism.

The apparatus 1b includes an active optical element 17b. In this case, the active optical element is an optical/electrical transducer. The transducer 17b converts between optical and electrical energy. The present teachings apply to transducers 17b for emitting light in response to an electrical drive signal or for receiving and responding to light to produce an electrical signal. In the apparatus 1b, light enters the apparatus through the optically transmissive member 9b, for an optical-to-electrical conversion application to reach the transducer 17b. For an electrical-to-optical conversion application, light produced by operation of the transducer 17b emerges from the apparatus 1b through the optically transmissive member 9b.

If the apparatus 1b is cylindrical, then when viewed from either end, the apparatus 1b would appear circular. The member 9b could be circular or have other shapes, even in a cylindrical implementation of the apparatus 1b. Those skilled in the art will appreciate that the lateral shapes of the mechanism as a whole and of the optically transmissive member may take other geometric forms, such as oval, rectangular or square, just to name a few examples.

The orientation in the drawing, in which light enters the apparatus 1b or is emitted from the apparatus 1b to the left in directions about a somewhat horizontal central axis, is shown only for purposes of illustration. Those skilled in the art will appreciate that the apparatus may be used in any other orientation that is desirable or suitable for any particular application of the transducer apparatus. Some implementations may utilize more than one optically transmissive member, to facilitate receipt or emission of light in additional directions. Although not shown, passive optical processing elements, such as diffusers, reflectors, lens and the like, may be coupled to the optically transmissive member to process light directed into the transducer apparatus 1b or to process light emitted from the transducer apparatus 1b.

The examples discussed herein relate to transducers 17b that are formed at least in part by semiconductor nanowires 19, and in an apparatus like that of FIG. 1B, the nanowires also serve as part of the wicking structure for purposes of promoting the liquid flow in the phase transition cycle of the heat transfer mechanism.

Hence, in the example of FIG. 1B, the wicking structure 15b includes at least two different portions 19b and 21b. The portion of the wicking structure 19b is formed of the semiconductor nanowires that also form at least part of the actual optical/electrical transducer 17b within the chamber 11b. The semiconductor transducer 17b that includes the semiconductor nanowires 19b of the wicking structure 15b is configured to emit light through the optically transmissive member 9, and/or the semiconductor transducer 17b that includes the semiconductor nanowires 19b of the wicking structure is configured to be driven by light received via the optically transmissive member 9b.

Figure 1C:
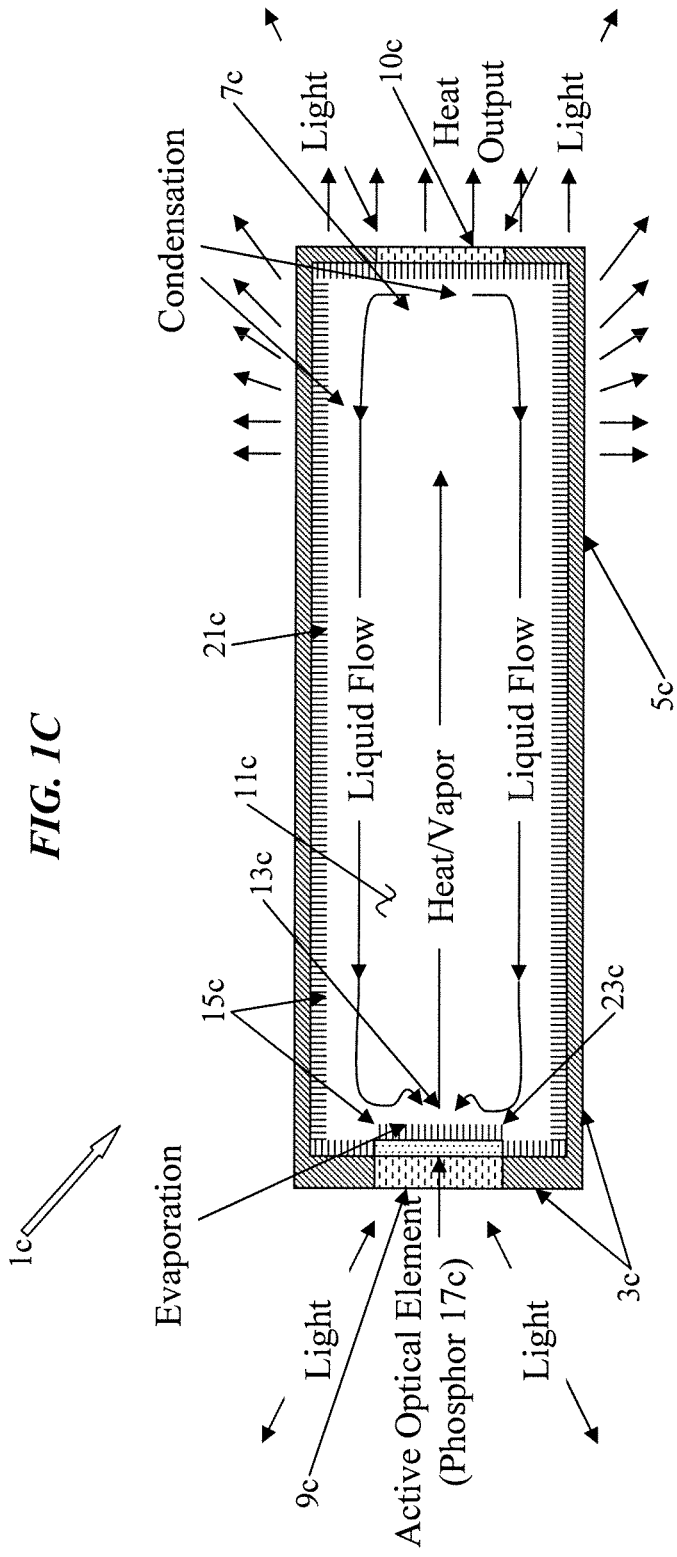
FIG. 1C is a cross-sectional view of an example of a third thermal conductivity and phase transition heat transfer mechanism that incorporates a phosphor within the thermal conductivity and phase transition heat transfer mechanism as the active optical element.

FIG. 1C is a cross-sectional view of an example of a thermal conductivity and phase transition heat transfer mechanism 1c that incorporates a phosphor material, as the active optical element. In this example, the source of energy to pump or excite the phosphor is not included inside the mechanism and is omitted for ease of illustration and discussion. Later drawings show examples with the source outside the mechanism and as well as examples with the source inside the mechanism.

The mechanism 1c includes a housing 3c. The housing 3c has at least one section that is thermally conductive. In the example of FIG. 1C, the major section 5c of the housing 3c is formed of a thermally conductive material. Examples of suitable materials include metals, such as copper and aluminum, although other thermally conductive material materials, such as thermally conductive plastics and ceramics, may be used form manufacture the housing section 5c.

The housing 3c has at least one member 9c that is at least partially optically transmissive. In this example, the mechanism 1c includes two members 9c and 10c, each of which is at least partially optically transmissive. Each optically transmissive member 9c or 10c may be transparent or translucent or exhibit other transmissive characteristics (e.g. non-white color filtering), depending on the optical requirements of the particular application of the mechanism 1c. In an example like that of FIG. 1C, in which the mechanism does not incorporate the source, at least one of the optically transmissive members 9c, 10c would allow entry of optical energy from an external source, whereas one or both of the optically transmissive members 9, 10c would allow emission of light as an output. The optically transmissive members 9c and 10c appear flat in cross-section, although they could have other shapes, e.g. convex or concave, if a particular shape would promote light input or light output for a particular application.

If the apparatus 1c is cylindrical, then when viewed from either end, the apparatus 1c would appear circular. Either member 9c or member 10c could be circular or have other shapes, even in a cylindrical implementation of the apparatus 1c. Those skilled in the art will appreciate that the lateral shapes of the mechanism as a whole and of the optically transmissive member(s) may take other geometric forms, such as oval, rectangular or square, just to name a few examples.

The material forming each optically transmissive member 9c or 10c may be any material of sufficient optical transmissivity that is also able to withstand the expected operating temperatures of the mechanism 1c. Examples of suitable materials for the members 9c, 10c include various forms of glass ceramics and plastics. The material of the optically transmissive members 9c, 10c may or may not need to be heat resistant, depending on the temperature at the location of each member during operation. Each optically transmissive member 9c or 10c is connected to the housing section 5c to form a seal for a vapor tight chamber 11c enclosed by the thermally conductive housing section 5c and the optically transmissive members 9c, 10c. The material of the member 9c or 10c is sufficiently transmissive to light, at least in the portion of the optical energy spectrum that is relevant to operations of the mechanism 1c, so as to allow passage of optical energy into and/or out of the apparatus 1c.

As noted, the optically transmissive members 9c, 10c are attached to the housing section 5c to form a seal for a vapor tight chamber 11c. For example, if the optically transmissive members 9c, 10c are formed of a glass or ceramic material and the housing section 5c is formed of a metal, the different elements may be joined by a glass frit process or by application of a suitable epoxy.

The mechanism or device 1c also includes an opto-luminescent phosphor 17c contained within the chamber for emitting light, when excited by optical pumping energy. The phosphor 17c is the active optical element of the mechanism or device 1c. In some of the later examples, other active optical elements, in addition to the phosphor, are provided within the chamber 11c of the apparatus 1c. As discussed more later, light emitted by the excited phosphor 17c is output from the mechanism via one or both of the optically transmissive members 9c, 10c. The heat transfer function of the mechanism 1c mitigates thermal impact on the phosphor 17c.

A portion of the housing section 5c will form a cold location 7c within the chamber 11, for example, acting as or coupled to a heat sink (not separately shown). In the example of FIG. 1C, a cold location 7c is formed near an end portion of the thermally conductive housing section 5c and the second optically transmissive member 10c. Of course, any heat sink coupled to the mechanism at or near the cold location would not optically block passage of light to/from the optically transmissive member 10c in this example.

The exemplary apparatus 1c also includes a working fluid within the chamber 11c. The pressure within the chamber 11c, typically a pressure somewhat lower than atmospheric pressure, configures the working fluid to absorb heat during operation of the apparatus, to vaporize at a relatively hot location 13c as it absorbs heat, to transfer heat to and condense at the relatively cold location 7c, and to return as a liquid to the relatively hot location. A variety of different fluids may be used as the working fluid, and the pressure is determined based on the fluid type and the amount of heat that the fluid is expected to transfer.

The working fluid, in its liquid state, contacts the hot interface at the location 13c where the apparatus receives or produces heat. In the example, the working fluid directly contacts at least some surface area(s) of the phosphor layer 17c at or near the hot location 13c. At those surface areas, the working fluid absorbs at least some heat from the phosphor, be it heat generated by excitation of the phosphor or heat the phosphor may receive from the external excitation source.

As the liquid absorbs the heat, it vaporizes. The vapor fills the otherwise empty volume of the chamber 11c. Where the chamber wall is cool enough (the cold interface at location 7c), the vapor releases heat to the wall of the chamber 11c and condenses back into a liquid. The drawing shows a central arrow from the hot location 13c toward the cold location 7c. This arrow generally represents the flow of heat in the vapor from the hot location 13c where the working fluid vaporizes toward the cold location 7c where the working fluid transfers heat for output via the thermally conductive housing section 5c and condenses back to the liquid form. The liquid form of the fluid flows back to the hot interface at location 13c. The drawing shows arrows generally along the outer wall(s) of the housing from the relatively cold location 7c back to the relatively hot location 13c. The arrows generally represent the flow of the condensed working fluid from the relatively cold location 7c back to the relatively hot location 13c where the fluid again vaporizes as it absorbs heat. In operation, the working fluid goes through this evaporation, condensation and return flow to form a repeating thermal cycle that effectively transfers the heat from the hot interface at location 13c to the cold interface at location 7c.

The device 1c in the example thus is configured as a thermal conductivity and phase transition heat transfer mechanism, similar to many mechanisms which are sometimes referred to as "heat pipes." The thermal conductivity of the housing section 5c and the phase transition cycle through evaporation and condensation transfer heat from the hot location 13c to the cold location 7c. Thermal conductivity at the cold interface allows heat transfer away from the mechanism, e.g. to a heat sink or to ambient air. Active cooling may also be provided. The configuration of the mechanism together with the degree of cooling determine the internal operating temperature, e.g. at the hot location 13c. For example, the mechanism and a heat sink may support a maximum internal operating temperature around 50° C. Addition of active cooling or refrigeration at the cold interface may enable operation at a much lower internal temperature, such as 0° C.

Although some thermal conductivity and phase transition heat transfer mechanisms do not include a wicking structure, the exemplary mechanism 1c also includes a wicking structure 15c mounted within the chamber 11c to facilitate the flow of condensed liquid of the working fluid from the cold location 7c to the hot location 13c of the mechanism 1c. In the thermal conductivity and phase transition heat transfer mechanism 1c, the wicking structure 15c promotes movement of the condensed liquid back from the cold location 7c to the hot location 13c.

The wicking structure 15c may take many forms, such as sintered metal, phosphor, glass or ceramic powder; woven copper; surface grooves, mesh arrangements or small closely spaced wires extending inward from the surfaces of the housing forming the walls of the chamber 11c; as well as nano-scale wire structures extending inward from the chamber surface(s); and various combinations of these forms. The spacing between elements of the wicking structure 15c is sufficiently small to cause inter-molecular forces on the liquid form of the working fluid to cause the liquid to flow toward the region where the fluid vaporizes, that is to say, the hot location 13c in the mechanism 1c. This wicking or capillary action enables the liquid form of the working fluid to flow back to the hot location regardless of the orientation of (and thus the impact of gravity on fluid in) the heat transfer mechanism 1c.

As noted briefly above, the mechanism 1c includes an active optical element 17c that is to be cooled by the thermodynamic operation of the combined phase transition heat transfer mechanism. In this case, the active optical element that is to be cooled is a phosphor that emits light when pumped, specifically an opto-luminescent phosphor contained within the chamber 11c. The opto-luminescent phosphor 17c is contained within the chamber 11c formed by the housing 3c of the thermal conductivity and phase transition heat transfer mechanism 1c, in such a manner that at least a portion of a surface of the phosphor 17c is directly contacted by the working fluid through gaps or vias in the wick 23c formed on the phosphor layer 17, at the location 13c where the fluid evaporates as it absorbs heat. The phosphor may be provided in the chamber in a variety of different ways and other examples will be discussed below with regard to the later drawing figures. In this example, the phosphor takes the form of a layer at 17c formed on an inner surface of the chamber 11c, specifically a layer on the inward facing surface of the optically transmissive member 9c.

The phosphor 17c will be subject to heating during operation, due to excitation and/or due to heat passing through the housing 5c into the chamber 11c from the external source, e.g. if the source is adjacent to the member 9c and the phosphor 17c. The working fluid is directly in contact with at least a portion of the opto-luminescent phosphor 17c.

The phosphor within the layer at 17c is of a type for emitting light when excited by optical energy. Some of the light produced by the excited phosphor passes through one or both of the optically transmissive members 9c, 10c. For example, if optical excitation energy is supplied to the phosphor in layer 17c via the first optically transmissive member 9c, some phosphor emission may pass back through the optically transmissive member 9c. However, much of the phosphor emission passes through the chamber 11c and the optically transmissive member 10c. Reflective materials may be provided on the walls of the chamber 11c to reduce loss of light passing through the chamber 11c, for example, by use of a reflective wick along some sections of the chamber wall(s). The light for exciting the phosphor may also be applied through the optically transmissive member 10c, instead of or in addition to excitation energy supplied through the optically transmissive member 9c.

An opto-luminescent "phosphor," as used in this and several other examples, may be any of a variety of optically excited luminescent materials. Electroluminescent phosphor materials are discussed with regard to other examples. Terms relating to opto-luminescent phosphor are intended to encompass a broad range of materials excited by optical energy of a first or 'excitation' band that re-generate light in a different second or 'emission' band that is at least somewhat different from the excitation band. Examples of phosphors that may be used in various applications discussed herein include traditional phosphors, such as rare-earth phosphors, as well as semiconductor nanophosphors sometimes referred to as quantum dots or Q-dots, and doped semiconductor nanophosphors. Those skilled in the art will also appreciate that phosphors of similar types and/or of different types, emitting light of different spectral characteristics, may be used in combination.

The orientation in the drawing, in which light enters the mechanism 1c and is emitted from the mechanism 1c in one or both lateral directions about a somewhat horizontal central axis, is shown only for purposes of illustration. Those skilled in the art will appreciate that the apparatus may be used in any other orientation that is desirable or suitable for any particular application of the mechanism 1c. Some implementations may utilize additional optically transmissive members, to facilitate receipt or emission of light in additional directions. Although not shown, passive optical processing elements, such as diffusers, reflectors, lens and the like, may be coupled to each optically transmissive member to process light directed into the mechanism 1c or to process light emitted from the mechanism 1b.

As noted earlier, the wicking structure 15c may take many forms. The wicking structure may be substantially the same on all of the relevant inner surfaces of the housing 5c, or there may be somewhat different wicks at different locations within the chamber 11c. For example, there may be two different types of wicks, one type wick 21c formed on the thermally conductive section 5c and possibly the optically transmissive member 10c and another type wick 23c formed on the phosphor layer 17c. For example, the wick 23c may be transmissive and/or formed of the phosphor material as grooves or wire extensions of the phosphor material. The wick 21c may be at least somewhat reflective although the portion of the wick on the member 10c may be transmissive.

As noted above, the thermal conductivity and phase transition heat transfer mechanisms may use a variety of different wicks as the wicking structures, and in some examples at least, one mechanism may include two or more different kinds of wicks. Although other types of wicks may be used, many of the specific examples discussed herein utilize nano-scale structures or nanowires as one or more of the types of wicks in particular exemplary mechanisms. The example of FIG. 1B uses a semiconductor wick 19b as or as part of the transducer 17b. Instead of or in addition to the layer 17c, the example 1c of FIG. 1C could utilize phosphor bearing nanowires as some or all of the wicking structure. Phosphor bearing nanowire wicks also could be used in the examples of FIGS. 1A and 1B, in addition to the active optical elements 17a and 17b. In each of the three examples of FIGS. 1A-1C, it may also be useful to have at least some of the wicking structure formed of a reflective material, such as a reflective mesh or reflective metallic nanowires. To further appreciate the structure of such exemplary nanowire wicks, in may be helpful to discuss them in somewhat more detail with respect to FIGS. 2-4.

Figure 2:
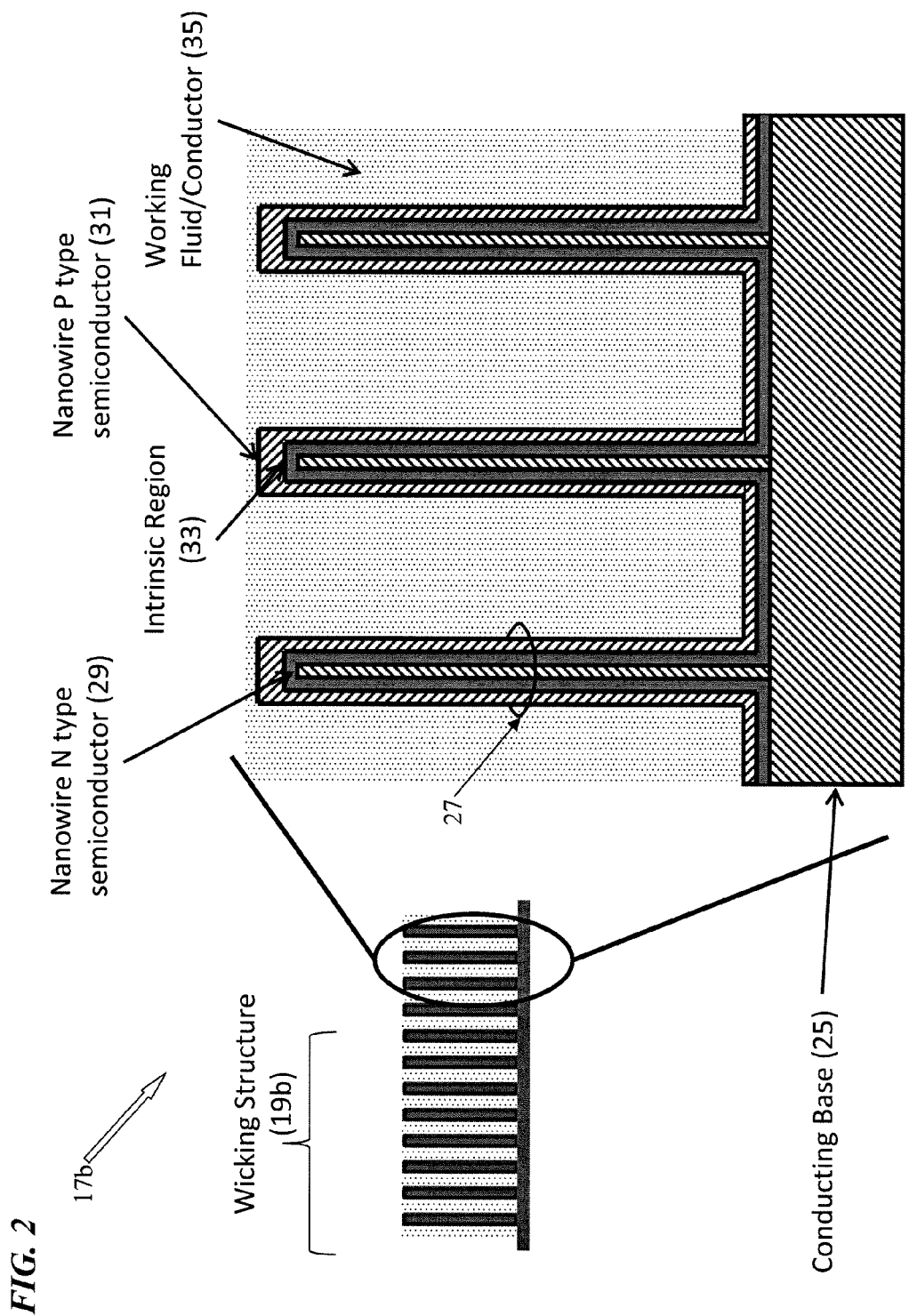
FIG. 2 is an enlarged detailed view of a portion of the semiconductor transducer in the apparatus of FIG. 1B, including a number of the semiconductor nanowires.

FIG. 2 shows an example of a section of the optical/electrical transducer 17b, utilizing the semiconductor nanowire portion 19b of the wicking structure. As discussed here, applicable semiconductor light emitters essentially include any of a wide range light emitting or generating devices formed from organic or inorganic semiconductor materials. Similarly, the present discussion encompasses any of a wide range of sensors, photovoltaics or other transducers for producing an electrical signal in response to optical energy that may be formed from organic or inorganic semiconductor materials.

The active optical element, in this case the optical/electrical transducer 17b, includes a conductive base 25. The base may be formed of an appropriate conductive material. For an arrangement like that of FIG. 1B, where the transducer 17b is adjacent to the optically transmissive member 9b, the conductive base 25 may also be optically transmissive. For example, the conductive base 25 can be formed of Indium Tin Oxide (ITO), other similar transparent conductive oxides, transparent conducting polymers, or layers consisting of transparent carbon nanotubes. The transparent conductive base 25 could form the optically transmissive member 9b of the apparatus housing 3, but in the example of FIGS. 1B and 2, the conductive base 25 is a separate element or layer on or adjacent to the optically transmissive member 9 of the apparatus housing 3b. If ITO or another similar transparent conductive oxide is used, for example, the transparent conductive base 25 could take the form of a layer formed on a portion of the inner surface of the optically transmissive member 9b. Although not separately shown, an electrical connection will be provided to the base 25, to provide one of the current path couplings to the semiconductor device of the actual transducer 17b.

The transducer also includes nanowires 19b grown to extend out from the conductive base 25. Nanowires are wire-like structures having nano-scale cross-sectional dimensions. Although the cross-section of a nanowire may not be circular, it is often easiest to consider the lateral dimension of the nanowire to be a diameter. An individual nanowire 27 therefore may have an outer diameter measured in nanometers, e.g. in a range of approximately 1-500 nanometers. Hence, "nanowire" is meant to refer to any continuous wire or filament of indefinite length having an average effective diameter of nanometer (nm) dimensions. The "nanowire" term is therefore intended to refer to nanostructures of indefinite length, which may have a generally circular cross-sectional configuration or a non-circular cross-section (e.g. nanobelts having a generally rectangular cross-section).

Each individual semiconductor nanowire 27 in the example includes an inner nanowire 29 as a core and an outer nanowire 31. The inner and outer nanowires are doped with different materials so as to be of different semiconductor types. In the example, the inner nanowire 29 is an N type semiconductor, and the outer nanowire 31 is a P type semiconductor, although obviously, the types could be reversed. As a result of the semiconductor growth and doping processes, there is semiconductor junction or intrinsic region 33 formed between the two semiconductor type nanowires 29, 31. In the example, the material forming the intrinsic region and the P type semiconductor also extends over the inner surface(s) of the conductive base 25 between the N type inner nanowires 29. Those skilled in the art will recognize that the doping may be applied so as to essentially reverse the semiconductor types, e.g. so that the inner core nanowire 29 is a P type semiconductor and the outer nanowire 31 is an N type semiconductor.

Although not shown, reflectors may be provided at the distal ends (away from the base 25) of the semiconductor nanowires 27 to direct more of the light produced by the nanowire diodes back through the base 25 and the light transmissive member 9b.

FIG. 2 also illustrates some of the working fluid 35 of the phase transition cycle of the heat transfer mechanism. The working fluid 35 directly contacts the outer surface(s) of at least the nanowires 27 of the semiconductor transducer, so that the fluid 35 may efficiently absorb heat from the transducer 17b during operation of the transducer. As noted, the conductive base 25 provides one of the electrical connections to the semiconductor nanowires 27, in this example, to the N type semiconductor inner nanowires 29. Although other types of electrical connections to the outer nanowires 31 could be provided, in the example of FIG. 2, the electrical connection to the P type semiconductor outer nanowires 31 is provided via the working fluid 35. To that end, the example uses a fluid 35 that is electrically conductive. Although not shown, the apparatus of FIG. 1B would include a conductive connection to the working fluid, for example, via a conductor connected to a metal forming the section 5b of the housing 3b.

The semiconductor type optical/electrical transducer can provide conversion between optical and electrical energy or can provide conversion between electrical and optical energy. For an optical-to-electrical energy conversion, such as in a sensor or photovoltaic device, light energy applied to the semiconductor device produces a voltage across the P-N junction at the intrinsic region 33 of each nanowire 27, which allows a current to flow through a circuit via the conductive base 25 and the working fluid 35. For an electrical-to-optical energy conversion, the inner and outer nanowires together form a light emitting diode. A voltage is applied to produce a drive current through the diode, via the conductive base 25 and the working fluid 35. Application of a voltage at or above the diode turn-on threshold, across the P-N junction at the intrinsic region 33, causes each of each of the nanowires 27 to produce light.

The discussion of FIG. 2 focused on the semiconductor structure of the transducer 17b within the chamber 11b and the transducer operation. However, the nanowires 27 also form part of the wicking structure 15 of the combined phase transition and heat transfer mechanism. The spacing between the nanowires 27 is sufficiently small so as to facilitate capillary action on the working fluid 35, so that the nanowires 27 also function as portion 19 of the wicking structure 15b in the apparatus 1b of FIG. 1B. Although the entire wicking structure 15b could be formed of semiconductor nanowires like the nanowires 27, the wicking structure 15b also includes a somewhat different portion 21b. The other example 1a of FIG. 1A also includes a wicking structure 15a, which may be formed of one, two or more types of nanowire wicks on the surface of the transducer 19a and/or the walls of the thermally conductive housing section 5a, some of which may bear phosphor and some of which may be reflective. As noted earlier, an example similar to that of FIG. 1C may use phosphor bearing nanowires as part of the wicking structure and/or may use a reflective wick or mesh or nanowires.

Figure 3:
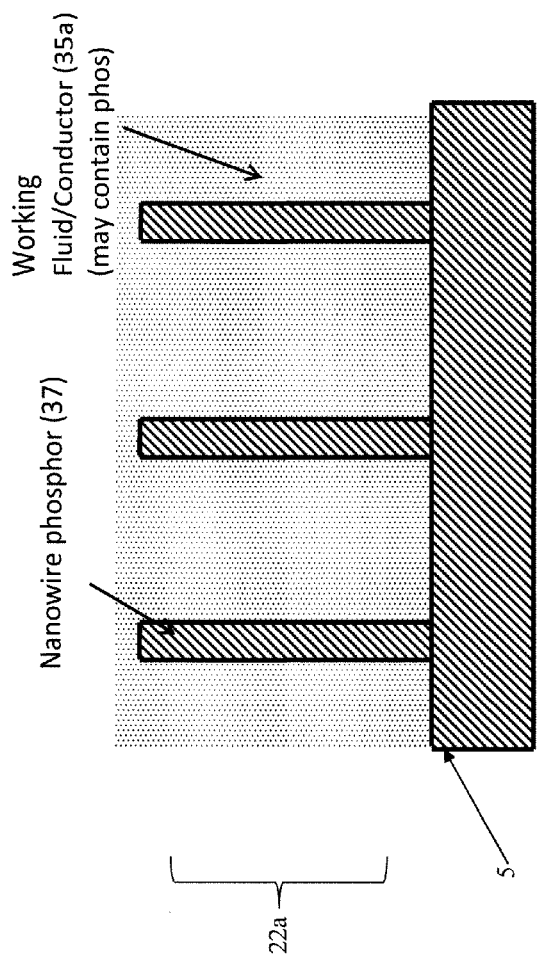
FIG. 3 is an enlarged detailed view of a portion of the thermally conductive part of the housing and associated part of the wicking structure, of a phase transition heat transfer mechanism of one of the examples of FIGS. 1A-1C, showing phosphor bearing nanowires.
Figure 4:
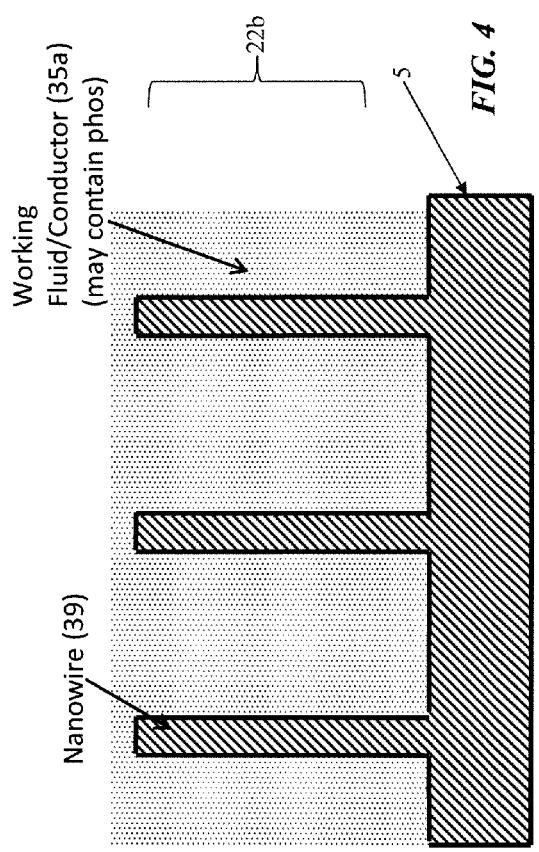
FIG. 4 is an enlarged detailed view of a portion of the thermally conductive part of the housing and associated part of the wicking structure, of a phase transition heat transfer mechanism of one of the examples of FIGS. 1A-1C, showing metal nanowires.

FIGS. 3 and 4 show two specific examples of arrangements that may be used as some or the entire a wicking structure in the exemplary mechanisms of FIGS. 1A-1C. The example of FIG. 3 uses a wicking arrangement 22a formed of nanowires 37. However, in the example of FIG. 3, the nanowires 37 are formed of an optically luminescent material such as a phosphor or phosphor bearing medium. The phosphor or medium may be grown as nanowires 37 extending inward into the interior of the chamber from the inner surface of the section 5 of the housing. By way of an example, particles of suitable phosphor(s) may be dispersed in a polymer matrix, and the phosphor-polymer matrix is grown in the form of nanowires. Examples of suitable polymers include epoxies and silicon. A barrier layer of a few nanometers up to around a micron may be provided on the surface of the phosphor nanowires 37, so long at the barrier layer does not substantially impede flow of light to or from the phosphor or flow of heat from the excited phosphor to the fluid. The phosphor converts some of the optical energy within the chamber from energy in one wavelength range (the excitation band of the phosphor) to another somewhat different wavelength range. There may or may not be some overlap of the excitation and emission spectra of the phosphor.

In an optical-to-electrical transducer application, the phosphor may convert some energy in a wavelength range that the semiconductor transducer can not process to a wavelength range that the semiconductor transducer can process or can at least process more efficiently. Converted light produced by the phosphor nanowires will eventually reach the semiconductor transducer within the chamber, and can then be processed more effectively by the transducer. Hence, the phosphor conversion may improve sensitivity of the transducer apparatus 1a or 1b.

In an electrical-to-optical transducer application, the phosphor may convert some energy from the semiconductor light emitting transducer from a less desirable wavelength range (e.g. near or outside the visible spectrum) to a more desirable wavelength range (e.g. to fill-in a gap in the spectral characteristic of light produced by the emitter), to improve efficiency of the transducer apparatus 1a or 1b and/or to improve the quality of the light output. In the electrical-to-light type optical transducer application, the phosphor receives light emitted by the semiconductor transducer 17a or 17b that has not yet emerged from the apparatus 1a or 1b via the optically transmissive member 9a or 1b. If in sections of the chamber not at or near the member, the phosphor recycles such light and retransmits it within the chamber for eventual passage through the transducer and the optically transmissive member. Phosphor bearing nanowires 37 may be used in place of or in addition to the phosphor layer 17c in the example of FIG. 1C.

Instead of a phosphor wicking structure as in FIG. 3, the example of FIG. 4 uses a metal nanowire wicking structure 22b. In the example of FIG. 4, metallic nanowires 39 of sufficient size and closeness to function as the wicking structure are grown so as to extend inward from the inner surface of the thermally conductive section 5 of the housing. In addition to supporting the capillary wicking function, the nanowires 39 may help support current flow to or from the conductive working fluid if the fluid is conductive. The nanowires 39 may also be reflective to reflect light within the chamber back to the transducer and/or the optically transmissive member, so as to improve re-circulation of light within the chamber and thereby improve overall optical performance of the apparatus, in any of the examples of FIGS. 1A-1C.

Although referred to as a phosphor, each nanowire may include one or more phosphors of different types where the mix of phosphors is chosen to promote a particular application of the apparatus or mechanism. Another multi-phosphor approach might use a phosphor of one type in nanowires in one region of the chamber and a phosphor of another type in a different region of the chamber.

In both the examples of FIGS. 3 and 4, the working fluid may be conductive. Where an optical-luminescent function is desirable, the working fluid 35a may also be or include a phosphor or the like. If phosphor particles are contained in the fluid 35a, the particle surfaces may be exposed to the fluid or the particles may be encapsulated in a barrier layer of a few nanometers up to around a micron, so long at the barrier layer does not substantially impede flow of light to or from the phosphor or flow of heat from the excited phosphor to the fluid medium. The phosphor in the working fluid 35a may enhance certain aspects of performance in a manner similar to that discussed above relative to the phosphor of the nanowires 37 in the example of FIG. 3.

The examples of FIGS. 3 and 4 relate to different nanowire arrangements for one or more portions of the wicking structure. In both cases, the size and spacing of the nanowires would be such as to provide a capillary flow of the liquid form of the working fluid. The working fluid 35 or 35a would directly contact the outer surface(s) of the respective nanowires.

Figure 5:
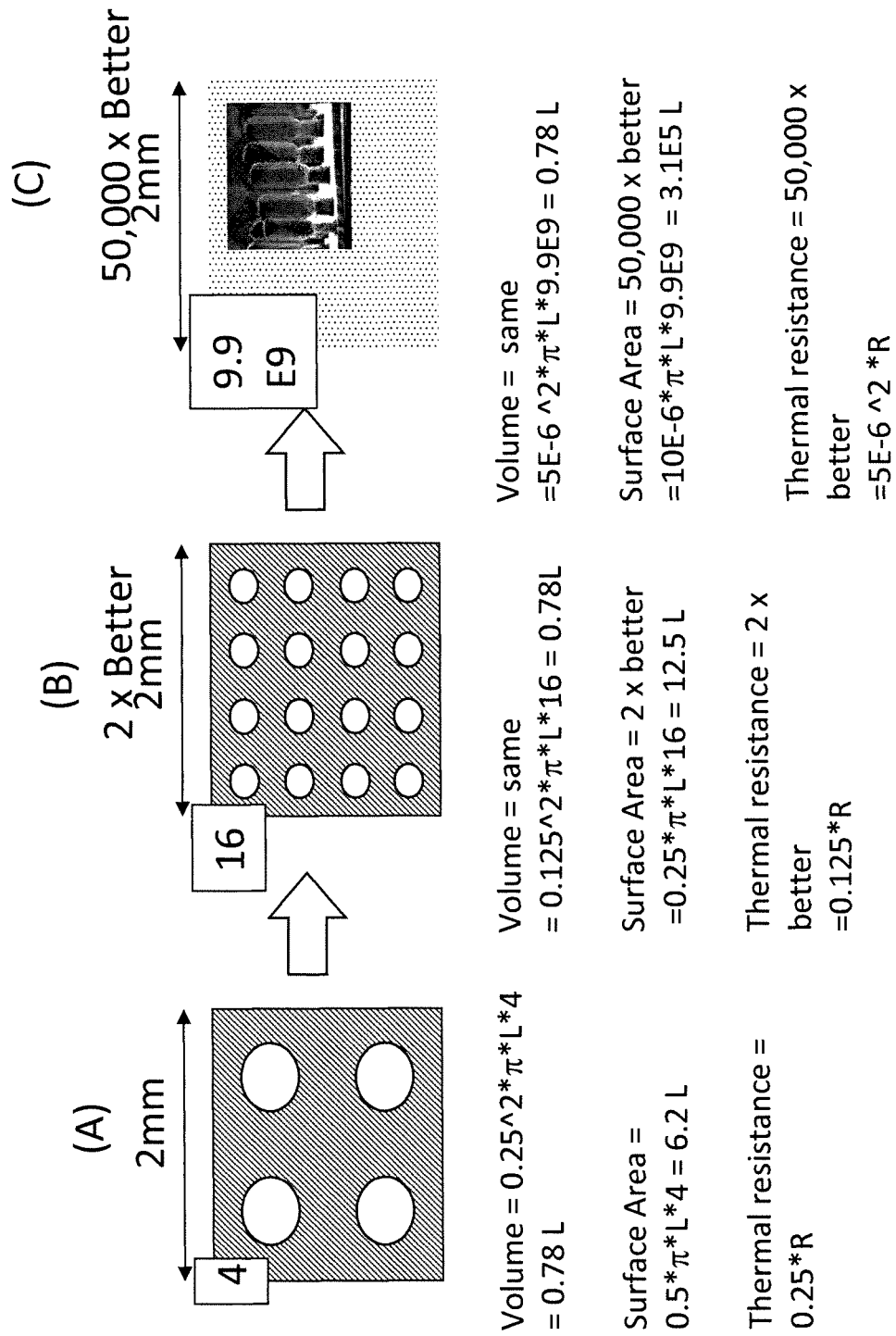
FIG. 5 is a comparative diagram useful in explaining how reducing the size and increasing the number of thermal elements per unit area increases the surface area for heat transfer and reduces the thermal resistance, and thus shows the advantages of using nanowires or similarly sized elements in the wicking structure of a thermal conductivity and phase transition heat transfer mechanism.

The use of nanowires in the wicking structure, particularly at the hot and cold locations, also improves heat transfer. In general, smaller more numerous heat transfer elements at these locations present increased surface area for heat transfer to/from the working fluid and therefore represent decreased thermal resistance. FIG. 5 is a comparative diagram useful in explaining how reducing the size and increasing the number of thermal elements per unit area of the housing wall increases total surface area for heat transfer and reduces the thermal resistance, both of which help to improve the rate of thermal transfer to/from the working fluid contacting the thermal transfer elements, in this case contacting the nanowires. It is believed that this comparison helps demonstrate and explain advantages of using nanowires or similarly sized elements in the wicking structure of the combined phase transition heat transfer mechanism of an optical/electrical transducer apparatus.

For discussion purposes, the square under each identifier (A), (B) and (C) represents a 2 mm×2 mm section of an inner surface of the vapor chamber of a thermal conductivity and phase transition heat transfer mechanism. However, the different examples (A), (B) and (C) have different sizes and numbers of heat transfer elements extending into the interior of the chamber. In the illustrated views, the heat transfer elements appear as circles, representing the end view (from inside the vapor chamber) of cylindrical heat transfer elements. Cylindrical shapes are used here for ease of modeling, although as noted earlier, other shapes may be used. For purposes of this comparison, we will assume that the heat transfer elements are all formed of the same material in each and every one of the three examples in FIG. 5.

The first example (A) has four pins of radius 0.25 mm (diameter of 0.5 mm). The length of the pins L need not be specified for comparison purposes. The number 4 in the formulae for the example is the number of pins. The volume of each pin is $2\pi$ times the radius-squared times the length (L) of the pins. As shown, the total volume of the material of the four pins is $0.25^2*2\pi*L*4$, which equals 0.78 L. For purposes of calculation of the surface area, we will use the outer cylindrical surface only (without including the end surfaces) to somewhat simplify the calculations for the comparison. With that approach, the surface area of a cylindrical pin is the diameter times 7C; times the length. Hence, the total cylindrical outer surface area presented by the four pins at (A) would be $0.5*\pi*L*4$, which equals 6.2 L. The thermal resistance of each pin equals the pin radius times the thermal resistance R of the material from which the pins are formed. In the example (A) in which the radius of the pins is 0.25 mm, the thermal resistance of each pin is $0.25*R$.

The second example (B) has sixteen (16) pins of radius 0.125 mm (diameter of 0.250 mm) of the same length L as in the previous example. As shown, the total volume of the material of the sixteen pins is $0.125^2*2\pi*L*16$, which again equals 0.78 L. Again, using only the cylindrical surface area for purposes of comparison (without including the end surfaces), the total cylindrical outer surface area presented by the sixteen pins at (B) would be $0.25*\pi*L*16$, which equals 12.5 L. This decrease in size and increase in number of pins results in approximately doubling the surface area for heat transfer in comparison to example (A). The thermal resistance of each pin in example (B), equals $0.125*R$, which is half the thermal resistance of example (A).

The use of nanowires in the wicking structure, particularly the semiconductor transducer 17 and/or or on the housing section 5 at the cold location 7, increases both the surface area for heat transfer and reduces the thermal resistance of each heat transfer element. Increased surface area and decreased thermal resistance both contribute to improved heat transfer. Example (C) in FIG. 5 represents a nanowire configuration in which the 2 mm×2 mm area of the chamber wall has $9.9\times10^9$ nanowires, where the radius of each nanowire is $5\times10^{-6}$ mm (5 nanometers) or the diameter of each nanowire is $10\times10^{-6}$ mm (10 nanometers).

As shown at (C), the total volume of the material of the nanowires is $(5\times10^{-6})^2*2\pi*L*(9.9\times10^9)$, which again equals 0.78 L. Again, using only the cylindrical surface area for purposes of comparison (without including the end surfaces), the total cylindrical outer surface area presented by the nanowires at (C) would be $10\times10^{-6}*\pi*L*9.9\times10^9$, which equals $(3.1\times10^5)L$, which is approximately 50,000 times more surface area for heat transfer than in first example (A). The thermal resistance of each nanowire in example (C), equals $(5\times10^{-6})*R$, which is approximately 50,000 times lower than the thermal resistance of example (A).

Hence, the use of nanowires in the wicking structure at various points in the exemplary transducer apparatuses, mechanisms or light emitters discussed herein improves thermal transfer capabilities. At a hot location or interface, use of nanowires improves transfer of heat to the working fluid. At a cold location, use of nanowires improves transfer of heat from the working fluid to the cold interface, e.g. for transfer through the interface to a heat sink, active cooling element or ambient air.

The use of the nanowires also helps with the wicking action. As noted, inter-molecular forces between a liquid and the surface(s) of the wicking material around the liquid produce capillary action to move of the liquid form of the working fluid along or through the material. Increasing the surface area helps to increase the inter-molecular forces on the liquid form of the working fluid. Hence, use of nanowires as the wicking structure, with increased surface area as shown above, also increases the strength of the capillary action of the wicking structure on the liquid form of the working fluid.

As noted earlier, a variety of different fluids may be used as the working fluid. Different fluids are used in various transducer apparatus configurations to support the heat transfer function, and in many of the examples, to serve as a carrier for phosphor and/or as a conductor. For examples of the transducer apparatus that do not use the fluid as a carrier for phosphor or as a conductor, fluids commonly used in prior heat pipes and the like may be used, particularly if sufficiently transparent to allow any light passage that may be desirable in the particular apparatus configuration. For a working fluid that would carry semiconductor nano-phosphor as the phosphor, examples of suitable fluids include acetone, methanol, ethanol and toluene. If the nano-phosphor is well encapsulated, water may be on option. Toluene may be a preferred choice for many phosphors, however, for cooler internal working temperatures, ethanol me be preferred. For a working fluid that would carry rare-earth-phosphor, examples of suitable fluids include acetone, methanol ethanol and toluene, although here water may be a preferred choice. For a working fluid that is also electrically conductive, examples of suitable fluids include salt water, ammonia and fluids from the class of transparent ionic liquids.

We will now turn to a discussion of more examples of the principles outlined above relative to FIGS. 1A to 5. In that regard, FIGS. 6-8 are examples of thermal conductivity and phase transition heat transfer mechanisms that incorporate active optical elements in the form of multilayer optical/electrical transducer.

Consider first the example of a mechanism or apparatus 41 that incorporates a LED or photodiode, as the active optical element. The drawing is a cross-sectional view of an example of an optical/electrical transducer apparatus 41, which also is configured as a thermal conductivity and phase transition heat transfer mechanism. The apparatus 41 includes a semiconductor transducer 57, in the form of a light emitting diode or light emitting transistor, or a photodiode or light responsive transistor, as the active optical element incorporated in the thermal conductivity and phase transition heat transfer mechanism. As is well known in the art, the semiconductor includes two or more layers of semiconductor materials doped with traces of impurities to determine the type and degree of semi-conductivity of each layer. The number of layers and the types of semiconductor formed at the various layers configures the semiconductor as a particular type of electronic device, that is to say, as a particular type of optical/electrical transducer in this example.

The transducer apparatus 41 includes a housing 43. The housing 43 is formed of a metal section 45 and a light transmissive member 49. In this example, the metal section 45 supports the semiconductor transducer 57; and the light transmissive member 49 forms a curved cover or dome over but separated from the emitting portions of the semiconductor transducer 57. Viewed from above or below, the apparatus could be circular, oval, rectangular, square or the like. The metal of section 45 may be reflective, but it is not optically transmissive in this example. The optically transmissive member 49 of the housing 43 may be formed of a material that is also thermally conductive, although it may not be as thermally conductive as the metal of section 45.

The semiconductor transducer 57 is located at a roughly central area or region of the metal section 45, in this example, and a hot location 63 is formed in the area within the chamber 51 where heat is produced by operation of a semiconductor transducer 57.

One or more portions of the member 49 and/or section 45 provide one or more relatively cold interfaces, similar to that at the cold location in the example of FIG. 1A. Although the apparatus 41 functions at various orientations, in the illustrated orientation, a cold interface or location would be formed at 67 along the surface of the curved optically transmissive member 49 of the housing 43, although there may be other cold locations 67 within the chamber. The materials of the housing section 45 and member 49 may be similar to those of the section 5a and the member 9a in the example of FIG. 1A, although other suitable materials may be used.

As in the earlier example, the optically transmissive member or section 49 is attached to the housing section 45 to form a seal for the vapor tight chamber 51. For example, if the optically transmissive member or section 49 is a glass or ceramic material and the housing section 45 is formed of a metal, the two elements may be joined by a glass frit process or by application of a suitable epoxy.

The exemplary apparatus 41 also includes a working fluid within the chamber 51. Again, the pressure within the chamber 51, typically a pressure somewhat lower than atmospheric pressure, configures the working fluid to absorb heat during operation of the apparatus, to vaporize at the relatively hot location 63 as it absorbs heat from the transducer 57, to transfer heat to and condense at the relatively cold location(s) 67, and to return as a liquid to the relatively hot location 63. A variety of different fluids may be used as the working fluid, and the pressure is determined based on the fluid type and the amount of heat that the fluid is expected to transfer.

The working fluid, in its liquid state, contacts the hot interface at the location 63 where the transducer 57 produces heat. For example, the working fluid directly contacts the one or more surfaces of the transducer 57 exposed to the fluid within the chamber 51. As the liquid absorbs the heat, it vaporizes. The vapor fills the otherwise empty volume of the chamber 51. Where the chamber wall is cool enough (the cold interface at one or more locations 67), the vapor releases heat to the wall of the chamber 51 and condenses back into a liquid. The liquid form of the fluid flows back to the hot interface at location 63. In operation, the working fluid goes through this evaporation, condensation and return flow to form a repeating thermal cycle that effectively transfers the heat from the hot interface to the cold interface.

Hence, as in the earlier examples, the apparatus 41 is configured as a thermal conductivity and phase transition heat transfer mechanism. The thermal conductivity of the housing 43 and the phase transition cycle through evaporation and condensation transfer heat from the hot location 63 to the cold locations 67.

As in the earlier examples, the exemplary apparatus 41 also includes a wicking structure 55 mounted within the chamber 51 to facilitate flow of condensed liquid of the working fluid from the cold locations 67 to the hot location 63 of the mechanism. The capillary action of the wicking structure 55 can overcome other forces on the liquid, such as gravity, to promote a desired movement of the liquid, regardless of the orientation of the optical/electrical transducer apparatus 41. The wicking structure may take many forms, as outlined in the discussion of the earlier examples, such as one or both of the nanowire arrangements of FIGS. 3 and 4.

The orientation in the drawing, in which light enters the apparatus 41 or is emitted from the apparatus 41 to/from directions above the horizontal plane, is shown only for purposes of illustration. Those skilled in the art will appreciate that the apparatus 41 may be used in any other orientation that is desirable or suitable for any particular application of the transducer apparatus. As in the earlier examples, optical processing elements (not shown), such as diffusers, reflectors, lens and the like, may be coupled to the optically transmissive member 49 to process light directed into the transducer apparatus 41 or to process light emitted from the transducer apparatus 41.

A first electrical connection path to a first layer of the semiconductor structure of the transducer 57 is provided via the conductive metal of the housing section 45. An outer surface of another semiconductor layer of the transducer 57 may be can be coated with a transparent conductor like one of those discussed earlier, in this case, to provide a second electrical connection path to the semiconductor structure of the transducer 57. Alternatively, the second electrical connection path can be provided via the working fluid, in which case, the working fluid is a conductive fluid.

As noted earlier in the discussion of FIG. 1A, the transducer 57 can be configured as an electrical-to-optical light emitter or as an optical-to-electrical sensor or photovoltaic.

FIG. 7A is another example of a thermal conductivity and phase transition heat transfer mechanism that incorporates an active optical element. The apparatus 41*a* of FIG. 7A is an electroluminescent device for emitting light in response to an electrical current. At a high level, the device 41*a* is similar to a light emitting device application of the apparatus 41 of FIG. 6, except that instead of the semiconductor transducer, the device 41 includes at least an electroluminescent (EL) phosphor 57*a* serving as the light emitting transducer.

The electroluminescent device 41*a* also is configured as a thermal conductivity and phase transition heat transfer mechanism. The device 41*a* includes a housing 43*a* formed of a metal section 45*a* and a light transmissive member 49*a*, of materials similar to the metal and optically transmissive materials discussed above relative to the earlier examples. In this electroluminescent device example, the metal section 45 supports the electroluminescent transducer, including the electroluminescent phosphor 57*a*. The light transmissive member 49*a* forms a curved cover over but separated from the emitting portions of the light emitting phosphor 57*a*. In cross-section, the member 49*a* and section 45*a* form a housing 43*a* of rectangular shape. Viewed from above or below, the apparatus could be circular, oval, rectangular, square or the like. The metal of section 45*a* may be reflective, but it is not optically transmissive in this example.

As in the earlier example, the optically transmissive member or section 49 is attached to the housing section 45 to form a seal for the vapor tight chamber 51. For example, if the optically transmissive member or section 49 is a glass or ceramic material and the housing section 45 is formed of a metal, the two elements may be joined by a glass frit process or by application of a suitable epoxy.

Electroluminescent devices are fabricated using thin films of either organic or inorganic materials between an anode and a cathode, in the form of one or more layers represented collectively by the layer 57*a* forming the electroluminescent transducer in the drawing. The thin film layers contain a bulk semiconductor (or host material for organic electroluminescence) and a dopant which defines the visible color emitted. The semiconductor needs to have wide enough bandwidth to allow exit of the light. The most typical inorganic thin-film EL (TFEL), for example, is ZnS:Mn with its yellow-orange emission. Examples of the range of EL material include: powder zinc sulfide doped with copper or silver; thin film zinc sulfide doped with manganese, natural blue diamond (diamond with boron as a dopant), III-V semiconductors—such as InP, GaAs, and GaN, and Inorganic semiconductors—such as $[Ru(bpy)_3]^{2+}(PF_6^-)_2$, where bpy is 2,2'-bipyridine.

In the example, the conductive base formed by the housing section 45*a* may serves as the cathode of the transducer 57*a*. An additional transparent conductive coating could be provided over the opposite surface of the thin film structure of the electroluminescent transducer 57*a* to serve as the anode. Alternatively, the working fluid may be conductive and provide the second path for electrical connection to the electroluminescent transducer 57*a* in place of a separate solid conductive anode.

The exemplary apparatus 41*a* also includes a working fluid within the chamber 51. A variety of different fluids may be used as the working fluid, as in the earlier examples. The working fluid, in its liquid state, contacts the hot interface at the location the EL transducer 57*a* produces heat. As in the earlier examples, the exemplary apparatus 41*a* also includes a wicking structure 55*a* mounted within the chamber 51*a* to facilitate flow of condensed liquid of the working fluid from the cold location to the hot location of the mechanism. The capillary action of the wicking structure 55*a* can overcome other forces on the liquid, such as gravity, to promote a desired movement of the liquid, regardless of the orientation of the optical/electrical transducer apparatus 41*a*. The wicking structure may take many forms, as outlined in the discussion of the earlier examples, such as one or both of the nanowire arrangements of FIGS. 3 and 4. As in the earlier examples, the light emitting device 41*a* is configured as a thermal conductivity and phase transition heat transfer mechanism. The thermal conductivity of the housing 43*a* and the phase transition cycle through evaporation and condensation transfer heat from the hot location to the cold location.

The pressure within the chamber 51*a*, typically a pressure somewhat lower than atmospheric pressure, configures the working fluid to absorb heat during operation of the apparatus, to vaporize at the relatively hot location as it absorbs heat from the EL transducer 57*a*, to transfer heat to and condense at the relatively cold location, and to return as a liquid to the relatively hot location. In operation, the working fluid goes through this evaporation, condensation and return flow to form a repeating thermal cycle that effectively transfers the heat from the hot interface to the cold interface.

A first electrical connection path to a first layer of the thin film structure of the EL transducer 57*a* is provided via the conductive metal of housing section 45*a*. An outer surface of another layer of the thin film structure of the EL transducer 57*a* may be can be coated with a transparent conductor like one of those discussed earlier, in this case, to provide a second electrical connection path to the structure of the EL transducer 57. Alternatively, the second electrical connection path can be provided via the working fluid, in which case, the working fluid is a conductive fluid.

The orientation in the drawing, in which light is emitted from the EL device 41*a* to/from directions above the horizontal plane, is shown only for purposes of illustration. Those skilled in the art will appreciate that the apparatus 41*a* may be used in any other orientation that is desirable or suitable for any particular application of the transducer apparatus. As in the earlier examples, optical processing elements (not shown), such as diffusers, reflectors, lens and the like, may be coupled to the optically transmissive member 49*a* to process light directed into the transducer apparatus 41 or to process light emitted from the transducer apparatus 41*a*.

The example of the EL device in FIG. 7A utilized a thin film structure for the electroluminescent transducer 57*a*. An alternative approach might use a layer of an electroluminescent phosphor. Again, the conductive base formed by the housing section 45a may serve as the cathode, and an additional transparent conductive coating could be provided over the opposite surface of the electroluminescent phosphor to serve as the anode. Alternatively, the working fluid may be conductive and provide the second path for electrical connection to the electroluminescent phosphor in place of a separate solid conductive anode. If electrical paths are provided via the lateral ends of the phosphor layer, the inner surface of the layer may be exposed to the working fluid or may at most be covered by a minimal barrier layer as noted in several earlier examples.

FIG. 7B depicts an electroluminescent device 41a' for emitting light in response to an electrical current, similar to the device 41a of FIG. 7A. However, the device 41a' of FIG. 7B uses a different structure for the actual electroluminescent emitter 57a'. Hence, the housing 43a, the optically transmissive member 45a, the thermally conductive housing section 49a, and the working fluid are essentially the same as in the example of FIG. 7A, and like reference numbers have been used. The wicking structure 55a' will also include some portions, e.g. at least on the inner surfaces of the thermally conductive housing section 49a, that are the same as used on the corresponding surfaces in the device 41a of FIG. 7A. However, the actual transducer 57a' in the example of FIG. 7B includes nanowires, which serve both a light emitting function and as part of the wicking structure 55a'. More specifically, the electroluminescent emitter 57a' includes a nanowire wick 56b that forms or serves as part of the actual electroluminescent emitter 57a'.

Figure 7C:
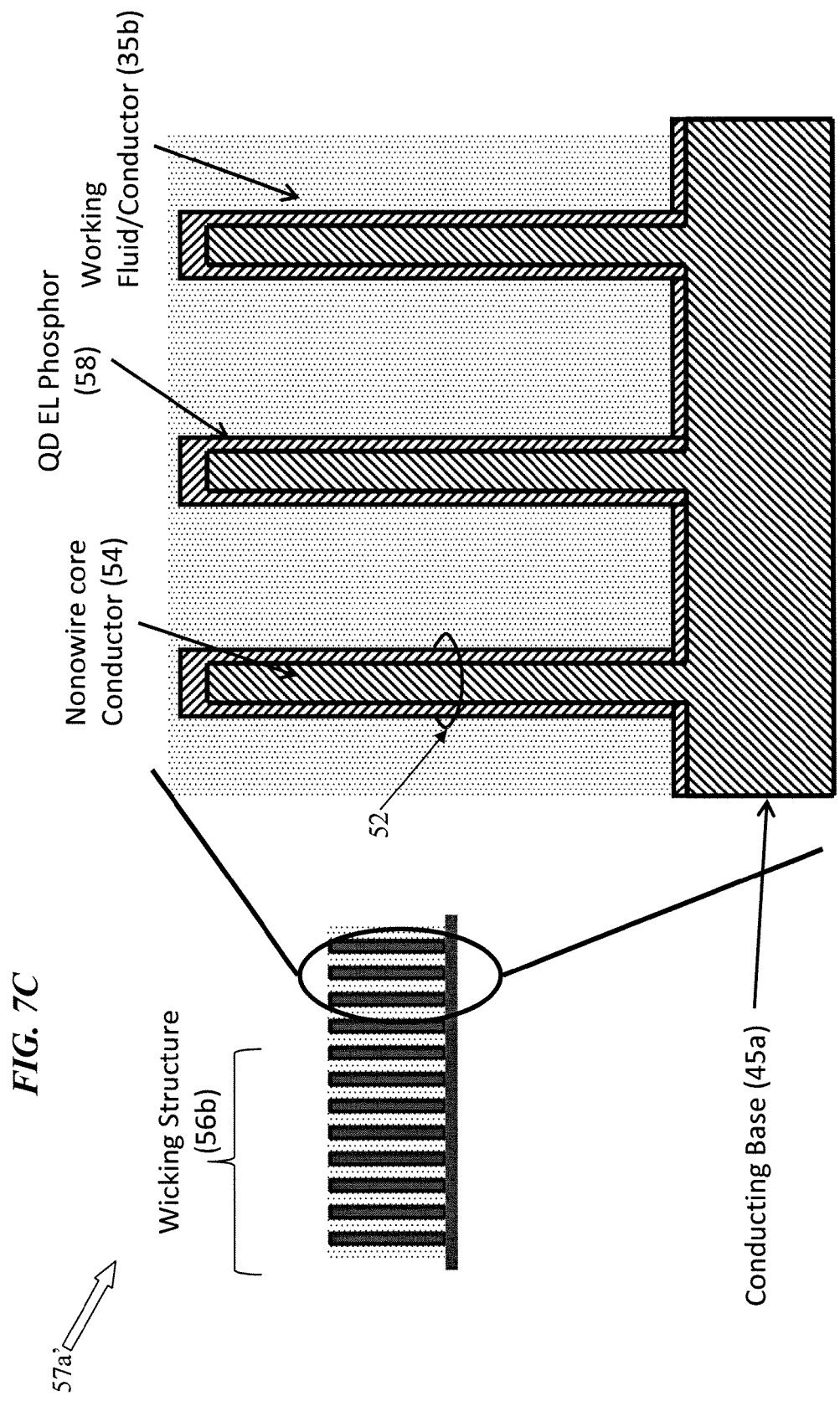
Figure 8:
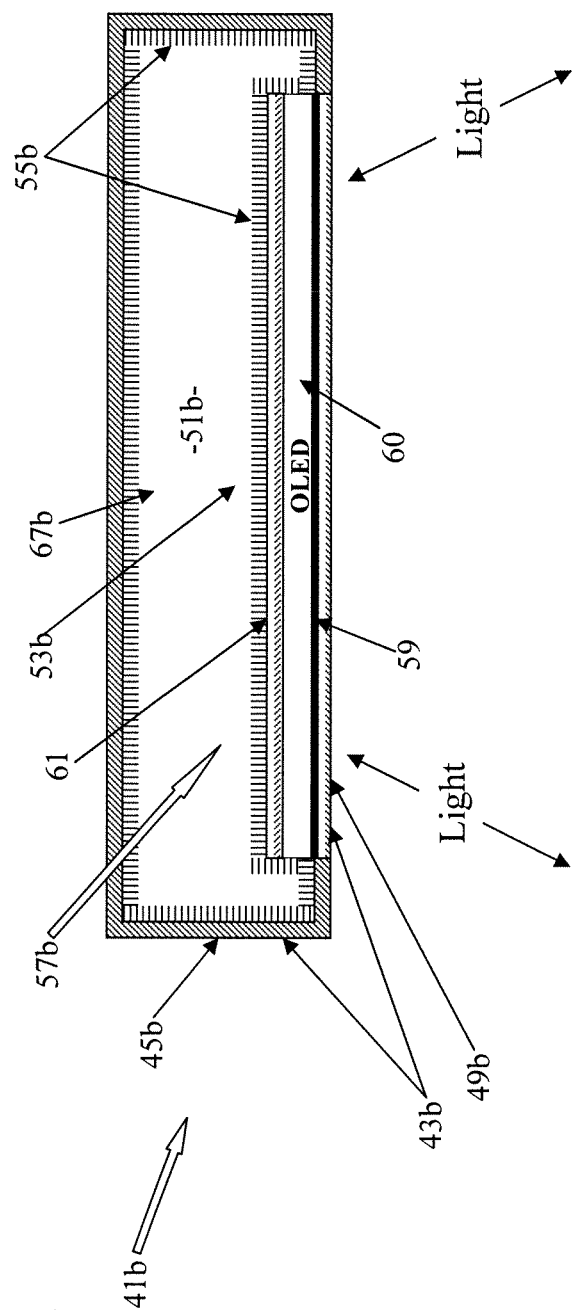

FIG. 7C shows an example of a section of the electroluminescent emitter 57a', utilizing the nanowire portion 56a of the wicking structure. The electroluminescent emitter 57a' includes a conductive base. The base may be formed of an appropriate conductive material. The base could be formed of a transparent conductor, e.g. if formed on the member 49a instead of on the housing section 45a, since the electroluminescent emitter 57a' is formed on the housing section 45a, and the conductive base need not be transparent. Although a separate base material may be provided as a layer on the housing section 45a, in the example, the metal of the housing section 45a serves as the conductive base of the emitter 57a.

The electroluminescent emitter 57a' also includes a nanowire wick 56b formed of individual nanowires 52 grown to extend out from the conductive base formed by the housing section 45a. Each nanowire 52 comprises a nanowire conductor 54 for example, formed as a nanowire of the conductive material grown outward from the base/housing section 45a. The electroluminescent emitter 57a' also includes a coating layer of an electroluminescent phosphor, in this example, a quantum dot (QD) electroluminescent (EL) phosphor. The QD electroluminescent EL phosphor coating 58 is formed over the outer surfaces of the nanowire core conductors 54 and the intervening surface regions of the conductive base 45a. Hence, each individual nanowire 52 includes an outer nanowire coating of the QD electroluminescent phosphor over the nanowire core conductor 58.

In the example, the conductive base formed by the housing section 45a serves as the cathode. An additional transparent conductive coating could be provided over the QD electroluminescent phosphor to serve as the anode. However, in the example, the working fluid 35b is conductive and provides the second path for electrical connection to the electroluminescent emitter 57a' in place of a separate solid conductive anode. The working fluid directly contacts the surfaces of the phosphor coating 58 exposed within the chamber, both for supply of electricity and for transfer of heat. Electrical power applied through the housing section 45a and the conductive working fluid 35b of sufficient voltage and/or current will drive the electroluminescent phosphor 58 to emit light, generally upwards in the orientation of the device 41a' shown in FIG. 7B. In operation, however, the thermal conductivity and phase transition heat transfer mechanism operations of the device 41a (like those of earlier examples) will transfer heat away from the transducer, in this case, away from the light emitting electroluminescent phosphor 58 of the emitting transducer 57a'.

FIG. 6 represented an example of a device 41 that used a multilayer semiconductor such as a diode or transducer 57 for a light emitter or a light responsive transducer. The light emitting device 41a of FIGS. 7A-7C utilized electroluminescent (EL) type emitters. Similar teachings, however, can be applied to other types of transducers. Another example of a light emitting transducer that may be incorporated in a thermal conductivity and phase transition heat transfer mechanism is an organic light emitting diode (OLED).

We will consider next FIG. 8, which is a cross-sectional view of an example of an optical/electrical transducer 41b for light emitting applications, where the incorporated transducer is an OLED 57b. The light emitting device 41b includes a housing 43b. The housing 43b is formed of a metal section 45b and a light transmissive member 49b, of materials and joined together to form a chamber 51b, much like in the earlier examples. In this example, however, the light transmissive member 49b supports the OLED 57b.

An OLED, such as 57b, may include layers of organic material 60 situated between a transparent anode and a metallic cathode. An OLED can be fabricated on a sheet of glass or plastic, in this case, serving as the optically transmissive member 49b. In the example of FIG. 8, a transparent conductor 59 on the optically transmissive member 49b would form the anode. Examples of suitable transparent conductors have been discussed above relative to an earlier example. The metallic cathode, shown at 61, may be reflective. The organic layers comprise a hole-injection layer, a hole-transport layer, an emissive layer, and an electron-transport layer. When sufficient voltage is applied to the OLED, the injected positive and negative charges combine in the emissive layer to produce light. The brightness of the light is proportional to current flow. The dopant defines the visible color emitted. The semiconductor needs to have wide enough bandwidth to allow exit of the light. The most typical inorganic thin-film EL (TFEL), for example, is ZnS:Mn with its yellow-orange emission. Examples of the range of EL material include: powder zinc sulfide doped with copper or silver; thin film zinc sulfide doped with manganese, natural blue diamond (diamond with boron as a dopant), III-V semiconductors—such as InP, GaAs, and GaN, and Inorganic semiconductors—such as [Ru (bpy)$_3$]$^2$+(PF$_6^-$)$_2$, where bpy is 2,2'-bipyridine. Different materials allow OLEDs to provide colors covering the visual spectrum, thereby obviating a need for filters.

In this example, the optically transmissive member 49b is shown in the form of a flat plate or the like, although obviously other shapes may be used. OLEDs, for example, may be formed on curved or angle members. The metal section 45b in our example forms the rest of the rectangular cross-sectioned housing 43b over the non-emitting portions of the OLED 57b. Viewed from above or below, the light emitting device 41b could be circular, oval, rectangular, square or the like. The OLED 57B is roughly coextensive with the area the optically transmissive member 49b, although the OLED or the member could extend somewhat beyond the other.

In this example, a hot location 53b is formed in the area within the chamber 51b where heat is produced by operation of the OLED 57b. The outer surfaces of the OLED 57b form the hot interface. One or more portions of the housing section 45b provides the relatively cold interfaces, similar to that at the cold location in the example of FIG. 1A. Although the apparatus functions at various orientations, in the illustrated orientation, a cold interface or location would be formed at 67b at or near the upper or back surface of the thermally conductive section 45b of the housing 43b.

As in the earlier examples, the optically transmissive member or section 49b is attached to the housing section 45b to form a seal for the vapor tight chamber 51b. The exemplary apparatus 41b also includes a working fluid within the chamber 51b as well as a wicking structure 55b to facilitate flow of condensed liquid of the working fluid from the cold location 67b to the hot location 53b. The working fluid, in its liquid state, contacts the hot interface at the location 53b where the light emitting device 41b produces heat, that is to say, by direct contact with the outer surfaces of the OLED 57b within the chamber 51b in this example. As in the earlier examples, the pressure within the chamber 51b configures the working fluid to absorb heat during operation of the apparatus, to vaporize at the relatively hot location 53b as it absorbs heat from the OLED 57b, to transfer heat to and condense at the relatively cold location 67b, and to return as a liquid to the relatively hot location 53b. Hence, as in the earlier examples, the light emitting device 41b is configured as a thermal conductivity and phase transition heat transfer mechanism. The thermal conductivity of the housing 43b and the phase transition cycle through evaporation and condensation transfer heat from the hot location 53b to the cold location 67b.

In this OLED example, first electrical connection path to the OLED structure of via connection (not shown) to the conductive anode 59. If insulated, a conductive lead may provide a connection to the cathode 61. Alternatively, the second electrical connection path can be provided to the cathode 61 via the working fluid, in which case, the working fluid is a conductive fluid.

The orientation in the drawing, in which the device 41b light downward around a substantially central axis of the device, is shown only for purposes of illustration. Those skilled in the art will appreciate that the apparatus 41b may be used in any other orientation that is desirable or suitable for any particular application of the transducer apparatus. As in the earlier example, optical processing elements (not shown), such as diffusers, reflectors, lens and the like, may be coupled to the optically transmissive member 49b to process light directed into the transducer apparatus 61 or to process light emitted from the light emitting device 41b.

Figure 9A:
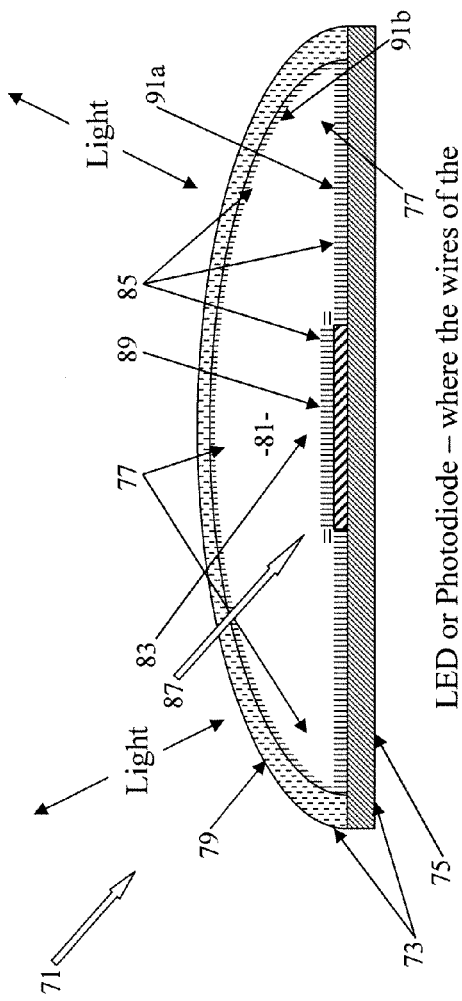
FIG. 9A is a cross-sectional view of an example of an optical/electrical transducer apparatus, where the semiconductor transducer, such as a LED or photodiode, utilizes semiconductor nanowires that also form a portion of the wicking structure, in a manner analogous to the example of FIGS. 1B and 2.

FIG. 9A is a cross-sectional view of an example of an optical/electrical transducer apparatus 71, similar to that of FIG. 1B, where the semiconductor transducer 87, such as a LED or a photodiode, utilizes semiconductor nanowires 89 that also form a portion of the wicking structure 85 of the thermal conductivity and phase transition heat transfer mechanism that is an integral part of the transducer apparatus 71.

The transducer apparatus 71 includes a housing 73. The housing 73 is formed of a metal section 75 and a light transmissive member 79. In this example, the metal section 75 supports the semiconductor transducer 87; and the light transmissive member 79 forms a curved cover or dome over but separated from the emitting portions of the semiconductor transducer 87. Viewed from above or below, the apparatus could be circular, oval, rectangular, square or the like. The metal of section 75 may be reflective, but it is not optically transmissive in this example. The optically transmissive section 78 of the housing 73 may be formed of a material that is also thermally conductive, although it may not be as thermally conductive as the metal of section 75.

The semiconductor transducer 87 is located at a roughly central area or region of the metal section 75, in this example, and a hot location 83 is formed in the area within the chamber where heat is produced by operation of a semiconductor transducer 87.

One or more portions of the member 79 and/or section 75 provide one or more relatively cold interfaces, similar to that at the cold location in the example of FIG. 1B. Although the apparatus functions at various orientations, in the illustrated orientation, a cold interface or location would be formed at 77. A cold location may be along the surface of the curved optically transmissive section 79 of the housing 73, although there may also be cold areas or interfaces at other locations 77 within the chamber. The materials of the housing section 75 and member 79 may be similar to those of the section 5 and the member 9 in the example of FIG. 1B, although other suitable materials may be used.

As in the earlier example, the optically transmissive member or section 79 is attached to the housing section 75 to form a seal for a vapor tight chamber 81. For example, if the optically transmissive member or section 79 is a glass or ceramic material and the housing section 75 is formed of a metal, the two elements may be joined by a glass frit process or by application of a suitable epoxy.

The exemplary apparatus 71 also includes a working fluid within the chamber 81. Again, the pressure within the chamber 81, typically a pressure somewhat lower than atmospheric pressure, configures the working fluid to absorb heat during operation of the apparatus, to vaporize at the relatively hot location 83 as it absorbs heat from the transducer 87, to transfer heat to and condense at one or more relatively cold locations 77, and to return as a liquid to the relatively hot location 83. A variety of different fluids may be used as the working fluid, and the pressure is determined based on the fluid type and the amount of heat that the fluid is expected to transfer.

The working fluid, in its liquid state, contacts the hot interface at the location 83 where the apparatus receives or produces heat. For example, the working fluid directly contacts the outer surfaces of the nanowires 89. As the liquid absorbs the heat, it vaporizes. The vapor fills the otherwise empty volume of the chamber 81. Where the chamber wall is cool enough (the cold interface at locations 77), the vapor releases heat to the wall of the chamber 81 and condenses back into a liquid. The liquid form of the fluid flows back to the hot interface at location 83. In operation, the working fluid goes through this evaporation, condensation and return flow to form a repeating thermal cycle that effectively transfers the heat from the hot interface to the cold interface.

Hence, as in the earlier example, the apparatus 71 is configured as a thermal conductivity and phase transition heat transfer mechanism. The thermal conductivity of the housing 73 and the phase transition cycle through evaporation and condensation transfer heat from the hot location 83 and the cold locations 77.

As noted, the exemplary apparatus 71 also includes a wicking structure 85 mounted within the chamber 81 to facilitate flow of condensed liquid of the working fluid from the cold location 87 to the hot location 83 of the mechanism. The capillary action of the wicking structure 85 can overcome other forces on the liquid, such as gravity, to promote a desired movement of the liquid, regardless of the orientation of the optical/electrical transducer apparatus 71. The wicking structure may take many forms, as outlined in the discussion of the earlier examples.

As in the earlier example, the apparatus 71 includes a semiconductor type optical/electrical transducer 87 for converting between optical and electrical energy. The transducer in the example here is a diode, although the diode may be a light emitting diode or a photodiode. For an implementation using a photodiode form of the transducer 87, light enters the apparatus 71 through the optically transmissive member 79, impacts on the photodiode transducer 87 and causes the diode to generate a responsive electrical signal. For an electrical-to-optical conversion application, a drive current is applied to the light emitting diode of the transducer 17 causing it to generate light, which emerges from the apparatus 71 through the optically transmissive member 79.

The orientation in the drawing, in which light enters the apparatus 71 or is emitted from the apparatus 71 to/from directions above the horizontal plane, is shown only for purposes of illustration. Those skilled in the art will appreciate that the apparatus 71 may be used in any other orientation that is desirable or suitable for any particular application of the transducer apparatus. As in the earlier example, optical processing elements (not shown), such as diffusers, reflectors, lens and the like, may be coupled to the optically transmissive member 79 to process light directed into the transducer apparatus 71 or to process light emitted from the transducer apparatus 71.

The transducer 87 may be formed in a manner similar to that of the transducer 17 in the examples of FIGS. 1B and 2, e.g. in the form of a conductive base with a semiconductor structure formed on the conductive base. The semiconductor structure in turn includes semiconductor nanowires, in the example of FIG. 9A, nanowires 89. In this example, the conductive base can be a metal or an appropriately doped semiconductive material. Unlike the earlier example of FIG. 2, the conductive base need not be transparent.

A first electrical connection path to the semiconductor structure of the transducer 87 is provided via the conductive base. The outer surfaces of the semiconductor structure of the transducer 87, including the outer surfaces of the semiconductor nanowires 89, can be coated with a transparent conductor like one of those discussed earlier, in this case, to provide a second electrical connection path to the semiconductor structure of the transducer 87. Alternatively, the second electrical connection path can be provided via the working fluid, in which case, the working fluid is a conductive fluid.

As in the example of FIG. 1B, in the apparatus 71 of FIG. 9A, the semiconductor nanowires 89 of the optical/electrical transducer 87 also serve as part of the wicking structure 85 for purposes of promoting the liquid flow in the phase transition cycle of the heat transfer mechanism.

In addition to the semiconductor nanowire portion 89, the wicking structure 85 includes one on more portions 91 formed on inner surfaces of the chamber wall formed by the section 75 and the optically transmissive member 79. The portions 91 of the wicking structure formed on the section 75 and the optically transmissive member 79 could be the same or different kinds of structures. The wicking structure in portions 91 may take many forms, as outlined in earlier discussions.

In the example, however, the portions 91 formed on inner surfaces of the chamber wall formed by the section 75 and the optically transmissive member 79 consist of nanowires formed on the appropriate surfaces. The nanowire wicking structures on the section 75 and the optically transmissive member 79 may be the same, e.g. similar to one of the structures discussed above relative to FIGS. 2 and 3. In the example of FIG. 9A, however, a first type of nanowire arrangement is provided for the portion 91a of the wicking structure on the metal housing section 25, and a different type of nanowire arrangement is provided for the portion 91b of the wicking structure on the optically transmissive member 79. For example, the first type of nanowire arrangement is provided for the portion 91a of the wicking structure on the metal housing section 25 may be a reflective metallic nanowire configuration as in part of the discussion of FIG. 4 above. The second type of nanowire arrangement provided for the portion 91b of the wicking structure on the optically transmissive member 79 may be optically transmissive, although it may also contain a phosphor component for conversion of some of the light passing through the member 79 as discussed earlier relative to FIG. 3. Phosphor may also be provided in the working fluid, if useful to support a particular application of the transducer apparatus 71.

The number and size of the nanowires in the various sections 89, 91a and 91b would be chosen to promote the desired capillary action as well as to achieve a degree of heat transfer appropriate for the particular transducer design.

For purposes of discussion of a first application of a transducer apparatus 71, assume for now that the transducer apparatus 71 emits light, e.g. the transducer 87 is a LED. A substantial portion light emitted from the LED type transducer 87 is directed toward the optically transmissive member 79. As it reaches the inner surface of the optically transmissive member 79, some of that light excites phosphor(s) in the phosphor nanowires in the portion 91b of the wicking structure on the optically transmissive member 79. The excited phosphors re-emit light of a different spectral characteristic, e.g. at a wavelength different from the excitation light. If provided, phosphor(s) in the working fluid may be similarly excited to produce light of an additional spectral characteristic. Output light of the apparatus 71 includes a combination of light directly emitted by the LED type transducer 87 and light produced by phosphor excitation. The use of phosphors may shift light from a wavelength region that does not substantially contribute to the intended application into a more desirable/useful wavelength region, e.g. from ultraviolet (UV) or near UV up into the more desirable visible part of the spectrum. This may improve efficiency or efficacy of the overall light output of the apparatus 71.

In the light emitting application of a transducer apparatus 71, some light emitted by the LED type transducer 87 is directed toward the metal section 75. If phosphors are provided in the wicking structure and/or the working fluid, then some of the light produced by phosphor excitation also is directed toward the metal section 75. The metal of the section 75 may be reflective, to redirect such light for output via the optically transmissive member 79. However, in the example, much of the inner surface of the metal section 75 is covered by the portion 91a of the wicking structure formed of reflective metallic nanowires. Hence, the metal nanowires of the portion 91a redirect light for output via the optically transmissive member 79.

Much like the example of FIGS. 1B-3, the arrangement of FIG. 9A is also suitable for use in a sensor or photovoltaic application in which the transducer 87 is a photodiode. The optical-to-electrical application would function essentially in reverse of the preceding discussion of the electrical-to-optical emitter application. For example, light entering via the member 79 would be processed by phosphors (if provided) and/or reflected. Then, upon impact on the photodiode type transducer 87, the light would cause the transducer 87 to generate electricity as the light responsive output of the apparatus 71.

Figure 9B:
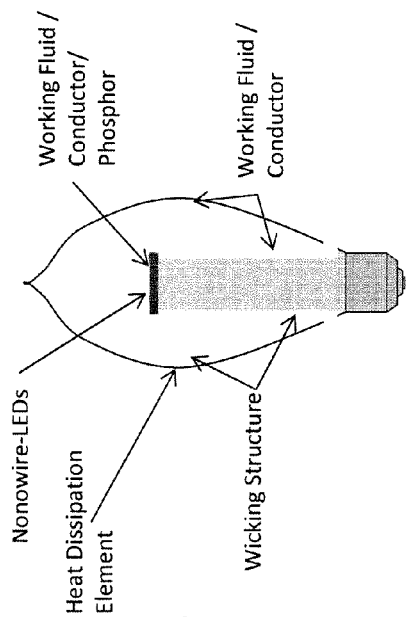
FIG. 9B is a cross-sectional view of an example of a lamp based on the principles of the example of FIG. 9A.

FIG. 9B is a cross-sectional view of a lamp that incorporates the principles of FIGS. 1B, 2 and 9A. Although shaped differently, the lamp of FIG. 9B is very similar to the device of FIG. 9A. The device includes a heat dissipation element that is also optically transmissive. The nanowire LED structure is mounted on a thermally conductive and not light transmissive housing section, which in the example of FIG. 9B also forms a pedestal for the nanowire LED structure. The thermally conductive pedestal/housing member and the optically transmissive member/heat dissipation element are joined in such a manner as to form a vapor chamber for the thermal conductivity and phase transition heat transfer mechanism. A wicking structure for facilitating the flow of the working fluid is formed on the surfaces forming the chamber walls, on both the optically transmissive member and the thermally conductive pedestal/housing member.

The example in FIG. 9B is shown in the form of a candelabra lamp or light bulb. A standard lamp base connects to the pedestal, and circuitry (not shown) within the base and/or pedestal would provide power to drive the nanowire LED structure, derived from battery supply or AC mains power received via the base. It is believed that one of skill in the art will appreciate the structure and operation of the lamp of FIG. 9B from the illustration and from the description of related examples above with regard to FIGS. 1B, 2 and 9A. Of course those skilled in the art will appreciate that the concepts of FIGS. 1B, 2 and 9B can be adapted to other lamp and fixture configurations and are not just limited to the illustrated examples.

FIGS. 6-8 were examples of application of the principles of the apparatus of FIG. 1A. FIGS. 9A-9B were examples showing application of the principles of the apparatus of FIG. 1A. The example of FIG. 1C involved incorporation of a phosphor in the mechanism but assumed that the source was outside of the mechanism 1c, although in that high-level example, the source was omitted. It may be helpful now to consider an example of a lighting device or system that incorporates a source and a thermal conductivity and phase transition heat transfer mechanism with a phosphor, with reference to FIGS. 10A to 11.

An opto-luminescent phosphor may be used with an optical/electrical transducer, both in the context of a light generating or emitting application and in the context of a light responsive electrical signal or power generation application. For example, the mechanism 1c may be used with a light source to generate light, or the mechanism 1c may be used with a light responsive transducer to sense or otherwise response to light from some other source processed by the phosphor within the mechanism. An opto-luminescent phosphor may convert energy from a source to a different wavelength range, to make a light output of an emitter more efficient and/or to provide a more desirable spectral characteristic in the output of the device. An opto-luminescent phosphor may convert energy from a light input to different wavelength range to which a sensor or photovoltaic device may be more responsive, to improve sensitivity of the transducer. In many cases, the configuration of the phosphor deployment relative to one or more transducers may be very similar. We will consider an example of a phosphor deployment in a thermal conductivity and phase transition heat transfer mechanism with respect to FIGS. 10A-10C. Although as noted, the configuration may be applied in the context of an optical-to-electrical conversion, in the discussion of the example illustrated in these particular drawings, we will concentrate on a light generation application.

Hence, FIG. 10A is a back view of an example of a light emitting device or light engine 131, FIG. 10B is a cross-sectional view of an example of the light emitting device or light engine 131 (taken along line B-B of FIG. 10A), and FIG. 10C is an end or plan view of the light emitting device or light engine 131. The light emitting device 131 includes a source 133 and a thermal conductivity and phase transition heat transfer mechanism 135 that incorporates an opto-luminescent phosphor within the thermal conductivity and phase transition heat transfer mechanism 135. The light emitting device or light engine 131 also includes a heat sink 137.

In this example, the source 133 is outside of the thermal conductivity and phase transition heat transfer mechanism 135 but coupled to supply optical excitation energy to the mechanism 135 for optical excitation of the phosphor within the mechanism 135. The source may be any type of light emitter configured to supply optical energy in a wavelength range that includes at least a portion of the excitation band of the phosphor included within the mechanism 135. Examples of suitable sources include laser diodes and electroluminescent devices. However, most examples of the source 133 are solid state devices, including a wide range of devices referred to as light emitting diodes (LEDs).

As discussed herein, in this specific example but also with regard to other solid state emitter examples, applicable solid state light emitters essentially include any of a wide range light emitting or generating devices formed from organic or inorganic semiconductor materials. Examples of solid state light emitters include semiconductor laser devices and the like. Many common examples of solid state emitters, however, are classified as types of "light emitting diodes" or "LEDs." This exemplary class of solid state light emitters encompasses any and all types of semiconductor diode devices that are capable of receiving an electrical signal and producing a responsive output of electromagnetic energy. Thus, the term "LED" should be understood to include light emitting diodes of all types, light emitting polymers, organic light emitting diodes (OLEDs), and the like. LEDs may be individually packaged, as in the illustrated example. Of course, LED based devices may be used that include a plurality of LEDs within one package, for example, multi-die LEDs that contain separately controllable red (R), green (G), blue (B) LEDs or the like, within one package. Those skilled in the art will recognize that "LED" terminology does not restrict the source to any particular type of package for the LED type source. Such terms encompass LED devices that may be packaged or non-packaged, chip on board LEDs, surface mount LEDs, and any other configuration of the semiconductor diode device that emits light. Solid state lighting elements may include one or more phosphors and/or nano-phosphors, which are integrated into elements of the package to convert at least some radiant energy to a different more desirable wavelength or range of wavelengths.

The drawings show a single source, e.g. a single LED, OLED, laser diode, semiconductor nanowire light emitter, or electroluminescent device, at 133. However, those skilled in the art will appreciate that many light engine designs for the device 131 may include a number of similar or different sources, as required to provide sufficient light for a particular application of the light engine 131.

As in the earlier example of FIG. 1c, the mechanism 135 includes a housing 136 having a section 138 that is thermally conductive and two members 139 and 140 that are at least partially optically transmissive. Although other shapes or configurations may be used, the example of FIGS. 10A-10C utilizes a cylindrical configuration of the mechanism 135 similar to that of FIG. 1c, but where the cylinder is somewhat flattened or disk shaped so that the axial dimension of the cylinder is smaller than the radial dimension of the cylinder. The optically transmissive members 139 and 140 appear flat in cross-section, although they could have other cross-sectional configurations, e.g. convex or concave, if a particular shape would promote light input or light output for a particular application. Larger or additional optically transmissive members and/or members of different lateral shapes may be provided, e.g. to facilitate light input and/or output in a light engine using additional sources. The materials and the thermal and optical properties of the thermally conductive section 138 and the optically transmissive members 139, 140 forming the housing 136 can be similar to those discussed above relative to similar elements in the example of FIG. 1c.

The orientation in FIG. 10B, in which light enters the mechanism 135 and is emitted from the mechanism 135 in the left to right direction about a somewhat horizontal central axis, is shown only for purposes of illustration. Those skilled in the art will appreciate that the light engine may be used in any other orientation that is desirable or suitable for any particular application of the mechanism 135.

The optically transmissive members 139, 140 are attached to the housing section 138 to form a seal for a vapor tight chamber 141. For example, if the optically transmissive members 139, 140 are formed of a glass or ceramic material and the housing section 138 is formed of a metal, the different elements may be joined by a glass frit process or by application of a suitable epoxy.

The heat sink 137 in this example is formed from two pieces 137a and 137b, which together form a tight-fitting cavity enclosing the housing section 138 of the mechanism 135. For example, the pieces 137a and 137b form a cylindrical cavity of approximately the same outer size and shape as the thermally conductive section 138 of the housing 136, so that when assembled as shown, the heat sink 137 provides structural support for the mechanism 135 and contact of the section 138 with the pieces 137a and 137b provides efficient thermal conductivity for heat transfer from the section 138 of the housing 136 to the heat sink 137.

As shown in FIG. 10A, the piece 137a of the heat sink 137 includes a core 143 and radially extending fins 145 for radiating heat to the ambient environment, in this case to the surrounding atmosphere. Straight radial fins are shown, for convenience, although other shapes/contours may be used for the fins, e.g. to improve transfer of heat to the ambient atmosphere. The core 143 of the heat sink 137 includes an indentation of an appropriate size and shape for securely holding the source 133. For example, the outer canister of the source 133 may serve as the heat slug for the source 133, and the canister of the source 133 may be press fitted into the indentation in the core 143 of the heat sink 137. The mounting of the source 133 in this way provides both structural support for the source 133 and efficient thermal conductivity for heat transfer from the source 133 to the heat sink 137.

The light output of the source 133 is coupled to the optically transmissive member 139 through a passage or aperture 147 through the core 143 of the first piece 137a of the heat sink 137. In this way, the source 133 supplies light, including at least some phosphor excitation energy, into the mechanism 135. The optically transmissive member 140 is coupled to a passage or aperture 149 through the second piece 137b of the heat sink 137. In this way, light from the source 133 and/or from excitation of phosphor within the chamber 141 of the mechanism 135 emerges through the optically transmissive member 140 and the passage 149. Each passage or aperture 147, 149 may be a physical opening as shown, or each passage or aperture 147, 149 may be formed of or include another optically transmissive element, such as a window, a lens, a holographic diffuser, a color filter or the like. The inner surfaces of the passages 147, 149 may be reflective, e.g. specular or diffusely reflective, to minimize loss of light.

Of course, the shape of the depicted elements and the arrangement of parts, in this case for the source, the mechanism and the heat sink, are given here by way of example only. Those skilled in the art will appreciate that other sizes, shapes, arrangements, etc. may be used for particular light engine applications. For example, FIG. 10B shows a relatively straight path from the source 133 through the two members 139, 140 and out the optical passage 149. For some applications, there may be additional members/paths/passages and/or the elements may be arranged to provide a somewhat angled or curved light transmission path.

As in the example of FIG. 1c, the mechanism or device 135 also includes an opto-luminescent phosphor contained within the chamber 147 for emitting light when excited by optical pumping energy from the source 133. The phosphor is the active optical element of the mechanism or device 135. The particular phosphor of one or more different types is similar to the phosphor discussed above relative to the example of FIG. 1.

The arrangement of the phosphor in the mechanism or device 135 and the separate mounting of the source 133, with optical coupling there between, provide a form of "remote" deployment of the phosphor relative to the source 133 in that the phosphor is outside of the package enclosing the actual semiconductor chip or other light emitter of the source 133 and thus is apart or remote from the actual light emitter(s). The housing 138 containing the phosphor may be located at any convenient distance in relation to the light output of the source 133. For example, there may be a separation as shown between the light output of the source 133 and the nearest optically transmissive member 139. As another example, to provide efficient coupling of the light from the source 133 to the mechanism 135, the light output of the source 133 may be adjacent to the optically transmissive member 139 so that they are in direct contact or so that there is contact through an index of refraction matching material, such as an optical gel or optical adhesive.

The phosphor may be provided in the chamber 141 in a variety of different ways, including some ways outlined above. For example, the phosphor may be provided in the mechanism 135 as a layer formed on the inner surface of either one or both of the optically transmissive members 139, 140, similar to the layer 17c in the example of FIG. 1c. Another approach to the phosphor deployment would be to include the phosphor in the working fluid 141. The light engine 131 also includes a wicking structure 150 mounted within the chamber 141 to facilitate flow of the condensed liquid of the working fluid from the cold location(s) to the hot location of the mechanism 135. The example of FIGS. 10A-2D incorporates the phosphor in the wicking structure, in a manner similar to the implementation discussed earlier, with respect to FIG. 3.

As in the earlier example, a portion of the chamber 141 within the housing section 138 will form a cold location 153 within the chamber 141, and the housing section 138 in that location forms a cold interface for transfer of heat to the heat sink 137. In the example of FIGS. 10A-10C, the cold location 153 is formed around the periphery of the chamber 141, such that the outer periphery of the cylindrical section 138 of the housing serves as the cold interface. The relatively hot location 155 is in and possibly somewhat around the central region of the chamber between the optically transmissive members 139, 140. Phosphors in the wicking structure and/or fluid along the inner surfaces of the optically transmissive members 139, 140 would be at the hot location from which the thermal conductivity and phase transition heat transfer mechanism transfers heat.

As noted, the exemplary light engine 131 also includes a working fluid 151 within the chamber 141. The working fluid 151 is directly in contact with at least a portion of the opto-luminescent phosphor 17, in this example, within the wicking structure on one or both of the optically transmissive members 139, 140 and/or contained within the fluid itself. The pressure within the chamber 141, typically a pressure somewhat lower than atmospheric pressure, configures the working fluid 151 to absorb heat during operation of the light engine 131, including heat from the phosphor produced by phosphor excitation and/or received from the source 133. The working fluid 151, in its liquid state, contacts the hot interface at the location 155 where the mechanism 135 receives or produces heat. In the example, the working fluid directly contacts at least some surface area(s) of the phosphor at or near the hot location 155. When heated at the relatively hot location 155, the working fluid 151 vaporizes. The vapor flows outward to the periphery of the chamber 141 to the cold location(s) 153 at the periphery of the chamber 151 in this example. At the cold location(s) 153, heat is transferred from the vapor to the wall of the section 138 of the housing and from there to the heat sink 137 for dissipation to ambient air and/or via an external cooling system (not shown). The transfer of heat to the housing section 138 causes the vapor to condense back to the liquid form, at the relatively cold location(s) 153. Through the capillary action of the wicking structure 150, the liquid form of the working fluid 151 flows to the relatively hot location 155 at the center of the mechanism 135. A variety of different fluids may be used as the working fluid, and the pressure is determined based on the fluid type and the amount of heat that the fluid is expected to transfer.

The mechanism 135 within the light engine 131 in the example thus is configured as a thermal conductivity and phase transition heat transfer mechanism. The thermal conductivity of the housing section 138 and the phase transition cycle through evaporation and condensation transfer heat from the hot location 155 to the cold location(s) 153. Thermal conductivity at the cold interface allows heat transfer away from the mechanism, e.g. through the heat sink to ambient air.

As shown by the discussion of FIGS. 10A-10C, the mechanism 135 in the light engine 131 includes a wicking structure 150 mounted within the chamber 141 to facilitate the flow of condensed liquid of the working fluid 151 from the cold location(s) 153 to the hot location 155 of the mechanism 135. As in the earlier examples, the wicking structure 150 may take many forms. The spacing between elements of the wicking structure 150 is sufficiently small to cause inter-molecular forces on the liquid form of the working fluid 151 to cause the liquid to flow toward the region where the fluid vaporizes, that is to say, the hot location 155 in the mechanism 135. This wicking or capillary action enables the liquid form of the working fluid to flow back to the hot location regardless of the orientation of (and thus the impact of gravity on fluid in) the heat transfer mechanism 135.

Although other wicks may be used on the members 139, 140 and/or the housing section 138, in the example, the mechanism 135 uses wicks for the structure 150 that utilize nanowires, like those discussed above relative to FIGS. 3 and 4.

Also as noted above, the mechanism 135 includes an active optical element, in this case, a phosphor within the chamber 141 that is to be cooled by the thermo-dynamic operation of the combined phase transition heat transfer mechanism. At least a portion of a surface of the phosphor is directly contacted by the working fluid 151 at the location 155 where the fluid evaporates as it absorbs heat. The phosphor may be provided in the chamber in a variety of different ways, for example, as a layer like that in FIG. 1 or carried by the working fluid 151. However, for purposes of further discussion of the example of FIGS. 10A-2E, we will consider an arrangement in which the phosphor forms or is carried by material forming a nanowire structure serving as a portion of the wicking structure 150 of the mechanism 135. Other portions of the wicking structure 150 may have other structures or characteristics, although the specific example below will concentrate on an arrangement in which some or all of the other portions of the wicking structure 150 are at least somewhat reflective.

FIG. 10B shows partially enlarged views of sections E-E and D-D of the chamber wall and associated wicking structures at two different exemplary locations. The view D-D corresponds to a location on one of the optically transmissive members, for example, of member 140; whereas the view E-E corresponds to a location on the thermally conductive section 138 of the housing of the mechanism 135.

Hence, the enlarged detail view D-D in FIG. 10B shows phosphor bearing nanowire wick 150A formed on a portion of the optically transmissive member 140. Phosphor may be similarly provided in the wick on the optically transmissive member 139. The phosphor bearing nanowire wick 150A may be similar to that shown in FIG. 3. The enlarged detail view E-E in FIG. 10B shows a metallic nanowire wick 150b formed on a portion the thermally conductive housing section 138, which may be similar to that show in FIG. 4. The detail views also show a portion of the working fluid 151.

Thermal conductivity and phase transition heat transfer mechanisms that incorporate phosphor materials to be cooled by operation of the mechanisms under discussion herein can be used in a variety of different types of light emitting devices, apparatuses and systems. The light engine 131, for example, may be incorporated into various designs for light bulb type lamps; floor, desks or table lamps; light fixtures; displays; as well a lamps and fixtures for use in vehicles.

Figure 11:
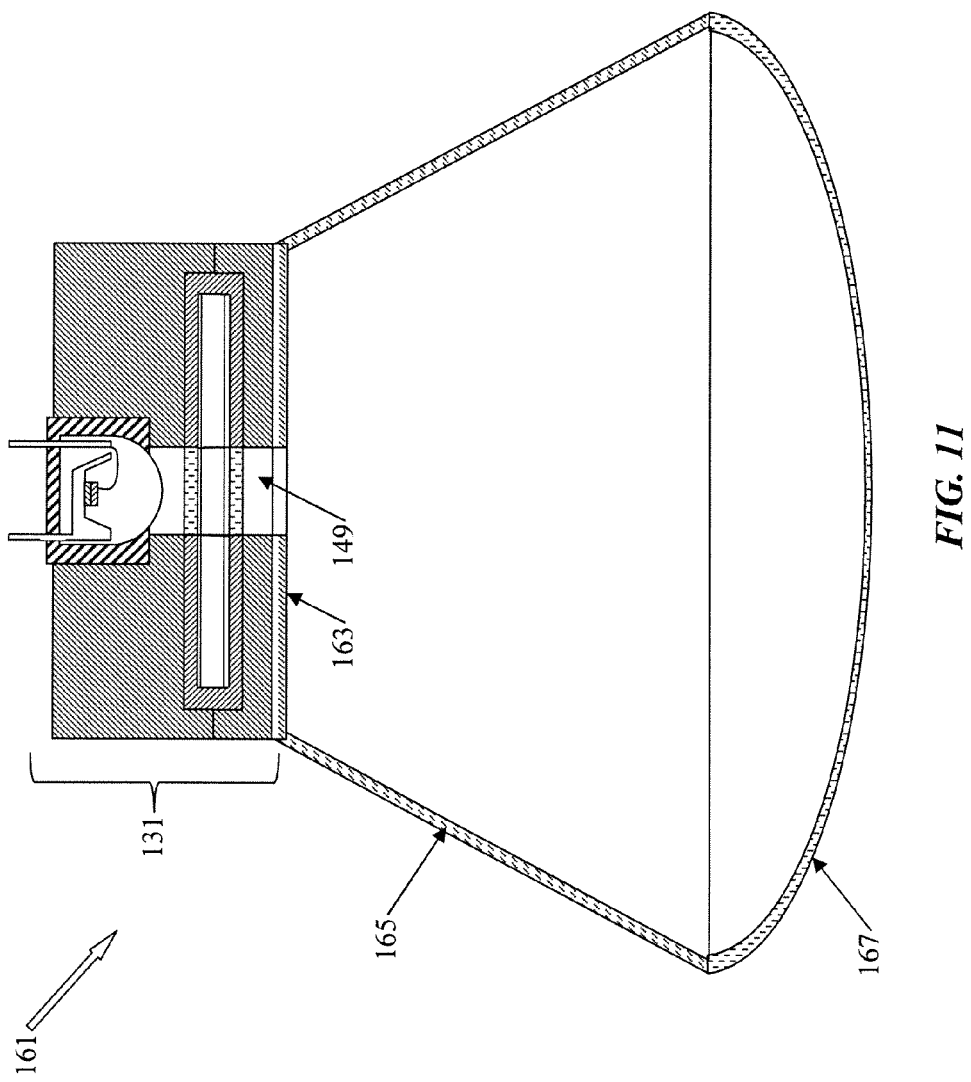
FIG. 11 is a cross-sectional view of an example of a light fixture incorporating a light engine like that shown in FIG. 10B.

To help illustrate, consider the simplified example of FIG. 11, which is a cross-sectional view of an example of a light fixture 161 incorporating a light engine 131 like that shown in FIG. 10B. The fixture 161 thus includes the light engine 131 for producing the light intended for output from the fixture 161 together with one or more passive optical processing elements, such as diffusers, reflectors, lens and the like, optically coupled to the output aperture or passage 149 of the light engine 131.

In the example, the additional passive optical processing elements optically coupled to the output aperture or passage 149 include a reflective coating or disk 163 on an output face of the light engine 131 and surrounding the optical output aperture 149 (through the second piece 137b of the heat sink 137 in FIGS. 10B and 10C). The passive optical processing elements of the fixture 161 also include a truncated conically shaped reflector 165 and a diffuser 167. The proximal end of the truncated cone of the reflector 165 connects to or matches with the outer periphery of the reflective coating or disk 163. The diffuser 167 is located at or near the distal end opening of the reflector 167.

The reflective surfaces of the reflective disk 163 and the reflector 165 may be specular, quasi-specular or diffusely reflective. Although shown as separate components, the reflective disk 163 and reflector 165 may be formed as a single unified reflective element. Also, the elements 163, 165 are shown as relatively flat cross-sectional shapes, although one or both may be curved or form angles. For example, the disk 163 and reflector 165 may be configured to form a parabolic reflector, to provide a more beam-shaped output of the fixture 161.

The diffuser 167 may be a translucent white material, which passes and diffuses some light and tends to diffusely reflect some light back within the optical chamber formed by the reflective disk 163, the reflector 165 and the diffuser 167. If the reflective disk 163 and the reflector 165 are diffusely reflective, the chamber may perform at least some optical integration of light from the source and the phosphor before emission of light via transmission through the diffuser 167.

The disclosed fixture 161 may use a variety of different structures or arrangements for the disk 163, reflector 165 and diffuser 167. For efficiency, the reflective surfaces of the disk 163 and of the reflector 167 should be highly reflective. In the example, the light engine 131 is arranged in the fixture 161 so as to emit most of the light energy toward the diffuser 167. To increase the optical integration and reduce possible pixilation or striation, the light engine 131 is arranged in the fixture 161 so as to emit light toward a reflective surface in such a manner that direct emissions form the aperture 149 are not directed to a transmissive output portion of the fixture (not directly toward the diffuser 167 in our example).

The orientation in the drawing, in which light from the engine 131 is emitted downward, is shown only for purposes of illustration. Those skilled in the art will appreciate that the light fixture 161 may be used in any other orientation that is desirable or suitable for any particular application.

Fixtures of the type shown in FIG. 11 may combine the source, the reflector/diffuser elements and the thermal conductivity and phase transition heat transfer mechanism 135 that incorporates an opto-luminescent phosphor in a variety of other configurations. The remote phosphor may be provided in or about the optic formed by the source and the reflector/diffuser elements in any of a number of different ways or locations. For example, in another configuration, the thermal conductivity and phase transition heat transfer mechanism might have a reflective inner walled thermally conductive section with the phosphor deployed on the thermally conductive member and otherwise shaped like the combined reflector formed by 163 and 165 in the example of FIG. 11. Light reflected within the chamber would pump the phosphor and be reflected for passage through the diffuser 167.

As discussed, FIG. 11 represents an example of a light fixture. Although not shown, a lighting system that uses the engine 131 would include the engine and other elements forming the fixture or the like, in combination with appropriate electronics to drive the particular source 133. For example, if the source 133 includes one or more solid state light emitters, such as one or more LEDs, then the electronics would include a power supply for deriving DC power from the main source (DC battery or AC main lines) and driver circuitry for converting the derived DC to a form appropriate to drive the particular solid state emitter(s) at the output level appropriate for the intended lighting application. The power supply and driver circuitry are omitted from this and later examples for convenience, although those skilled in lighting will be quite familiar with such system components.

FIG. 12 is a top view and FIG. 13 is a side view, of a linear downlight utilizing an OLED in a thermal conductivity and phase transition heat transfer mechanism. FIG. 14 is a cross-sectional view of the linear downlight taken along line A-A of FIG. 13, although FIG. 14 is not drawn to the same scale as are FIGS. 12 and 13. FIG. 15 is an enlarged detail view of portions of the metal housing section, the OLED and the wicking structure, corresponding to that encircled by the arrow B-B in FIG. 14. Although shaped differently, the OLED based light emitting device of FIGS. 12-15 is very similar to the device 41b of FIG. 8.

The optical/electrical transducer for emitting light includes a thermally conductive metal housing section, an optically transmissive member or window, and an OLED; although in the example of FIGS. 12-15, the OLED is mounted on the metal housing section rather than the optically transmissive member. A heat sink is attached to the surface of the metal housing section opposite the chamber (on the upper surface in the orientation illustrated in FIG. 14).

In this example, the thermally conductive metal housing section is shown in the form of a rectangular flat plate or the like, although obviously other shapes may be used. The fixture may be three or four feet long, for example, for replacement of or substitution for a fluorescent light fixture. Here, the optically transmissive member is an elongated rectangular member having an upper shape matching the length and width of the metal housing, but the optically transmissive member has a curved cross-section (see FIG. 14) covering and separated from the OLED. As in the earlier examples, the optically transmissive member or window is attached to the metal thermally conductive housing section to form a seal for the vapor tight chamber. A hot location/interface is formed at the surface of the OLED where the OLED emits light downward, and cold locations are formed at the opposite portion of the chamber adjacent the optically transmissive member as well as locations somewhat away from the OLED along lateral regions of the housing section.

In this example, the metal housing section has a reflective surface where it supports the OLED and facing downward within the chamber. The metal housing section may provide an electrical connection to the OLED, although the example shows one or more leads for the electrical connections. The working fluid in this example is conductive, to carry current from one of the leads to the OLED.

The materials and manner of assembly of the light emitting transducer of FIGS. 12-15 are similar to those of earlier examples. The light emitting transducer of FIGS. 12-15 operates to emit light as well as to dissipate heat, essentially in the same ways as does the OLED based light emitter of FIG. 8.

FIG. 16 is a top view of a downlight utilizing a free-standing, substrate free LED capable of emitting light from both sides of the diode structure, such as an EpiChip™ from Goldeneye, Inc. A transparent divider supports the LED, and the divider and LED together divide the interior of the downlight into two vapor tight chambers. Opposite sides of the LED are exposed to working fluids in the two chambers. The divider is also electrically insulating, and the conductive working fluids in the two chambers provide two current flow paths to/from the respective sides of the LED. The fluids are of sufficient quantity to form pools in contact with and fully immerse the side surfaces of the LED. FIG. 17 is a cross sectional view taken along line C-C of FIG. 16. This example requires an orientation like that shown in FIG. 17, in which gravity causes the fluid to pool at the lower portions of the chambers and thus immerse the LED so as to provide electrical conductivity to the LED while absorbing heat from the LED during operation As shown in that drawing, the luminaire emits light generally downward, and some light will be emitted laterally. FIG. 18 is a cross sectional view taken along line D-D of FIG. 16. FIG. 19 is an enlarged detail view of the section of the downlight encircled by the arrow F in FIG. 18, showing a portion of the wicking structure on the interior surface of the optically transmissive member or lens; and FIG. 20 is an enlarged detail view of portions of the divider and of the LED encircled by the arrow E in FIG. 18. Reference now is made in detail to the example illustrated in FIGS. 16-20.

The example of a downlight apparatus or luminaire 241 incorporates a LED 257, as the active optical element. The apparatus 241 also is configured as a two-chambered thermal conductivity and phase transition heat transfer mechanism, that is to say providing phase transition and heat transfer in both chambers 251a and 251b formed on opposite sides of a wall provided by a divider 252 and the two-sided LED 257 incorporated into the divider 252.

The apparatus 241 includes a housing, in this case, in the form of a sealed lens 243 formed of two sections or members 245 and 249. The flat upper section 245 of the housing lens 243 serves as the thermally conductive section and is attached or otherwise thermally coupled to a heat sink 246. In this example, the light transmissive member 249 takes the form of a somewhat elongated dish-shaped section of the lens/housing 243, with one flattened end.

The inner surface of the thermally conductive section 245 is reflective, either due to the material of the section 245 or by virtue of a reflective surface coating. Hence, the lower surface of the section 245 forms a downward facing reflector 248 for the luminaire 241.

The wall formed by the divider 252 and LED 257 is located between the inner surfaces of the housing section 245 and the transmissive member 249 of the lens so as to divide the dish into two chambers 251a and 251b. The thermally conductive housing section 245 and the optically transmissive member 249 may be formed of materials used for transmissive members in the earlier examples, or the section 245 may be formed of a material used for a thermally conductive section in earlier examples. The divider 252 is optically transmissive and may be formed of a suitable one of the materials used for optically transmissive members in the earlier examples. The housing section 245, the optically transmissive member 249 and the divider 252 are joined together using techniques discussed earlier, to form the vapor tight seals for the two chambers 251a and 251b, with respect to the outside ambient environment as well as between the two chambers 251a and 251b.

The LED 257 is located in a lower region of the transparent divider 252. One major conductive and emitting surface of the LED 257 is exposed in each chamber 251a, 251b.

FIG. 17 shows the LED 257 as an elongated structure running along a substantial portion of the divider 252. For such a configuration, the LED may be a single chip or a number of similar but smaller LEDs arranged side-by-side but fairly close together. Of course, other configurations or arrangements may be used to provide an amount of light generation and a light source profile that is desirable for a particular application of the luminaire 241.

In the example, the section 245 coupled to the heat sink 246 provides the cold interfaces. Hence, the upper portion of each chamber 251a, 251b will form the relatively cold locations in the respective chamber. The major LED surface in each chamber will be a hot interface at a hot location in the respective chamber 251a or 251b.

The exemplary apparatus 241 also includes a working fluid 265 within each of the chambers 251a, 251b. Again, the pressure within each chamber configures the working fluid 265 to absorb heat during operation of the luminaire 241, to vaporize at the relatively hot location adjacent the LED surface in the respective chamber as the fluid absorbs heat from the LED 257, rise out of the pool of liquid to fill the remainder of the chamber as a vapor, to transfer heat to and condense back from vapor to liquid at the relatively cold location(s), and to return as a liquid to the relatively hot location. A variety of different fluids may be used as the working fluid, and the pressure is determined based on the fluid type and the amount of heat that the fluid is expected to transfer. Hence, much like earlier examples, each chamber of the luminaire 241 is configured as a thermal conductivity and phase transition heat transfer mechanism. The thermal conductivity of the housing 243 and the phase transition cycle through evaporation and condensation transfer heat from the hot locations to the cold locations for dissipation to the ambient environment via the heat sink 246.

Because of the orientation, a wicking structure may or may not be provided in a luminaire like 241. As in the earlier examples, however, the exemplary luminaire 241 also includes a wicking structure (see FIG. 19) may mounted within each chamber 251a, 251b. Although the wicking structure may be formed on surfaces of the LED 257 as in earlier examples, as illustrated, the wicking structure is formed only on other surfaces forming the interior walls of the chambers and not on the exposed surfaces of the LED 257, particularly surfaces above the expected level of the liquid pools. In this example, there is a sufficient amount of working fluid in each of the chambers 251a, 251b to form a pool covering the exposed surfaces of the LED 257, therefore wicking structure on those surfaces may be omitted. However, as in the earlier examples, if provided, the wicking structure facilitates flow of condensed liquid of the working fluid from the cold locations back to the pools surrounding the hot locations 263 in the respective chambers 251a, 252b. The wicking structure may take many forms, as outlined in the discussion of the earlier examples.

The free-standing, substrate free LED 257 emits light from both its major surfaces when power is applied to those surfaces. Conductive leads could be provided to carry electricity to/from the surfaces of the LED 257 in the respective chambers 251a, 251b. However, in the example, the working fluid 265 is conductive and provides the electrical connection paths to the opposite surfaces of the LED 257 exposed in the respective chambers 251a, 251b. A lead or other means may be provided to supply power to the conductive working fluid in each chamber. When a voltage is applied across the electrically isolated pools of liquid in the two chamber 251a, 251b, the voltage is applied through the liquid pools to the opposite surfaces of the LED 257. If the voltage is sufficiently high to cause current to flow through the diode of the LED, the LED 257 will emit light from both its major surfaces. The emitted light flows through the liquid 265. If directed toward the member 249 or if reflected down from the reflector 248, the light passes through the optically transmissive member 249 as a light output of the luminaire.

FIG. 21 is a top view and FIG. 22 is a side view, of a linear downlight utilizing an electroluminescent (EL) device in a thermal conductivity and phase transition heat transfer mechanism. FIG. 23 is a cross-sectional view of the linear downlight taken along line A-A of FIG. 22, although the FIG. 23 is not drawn to the same scale as are FIGS. 21 and 22. FIG. 24 is an enlarged detail view of portions of the optically transmissive member or window, the EL device and the wicking structure, corresponding to that encircled by the arrow B-B in FIG. 23. Although shaped differently, the EL based light emitting device of FIGS. 21-24 is very similar to the device 41a of FIG. 7A.

The optical/electrical transducer for emitting light includes a thermally conductive metal housing section, an optically transmissive member or window. Similar to the transducer 41a of FIG. 7A, the downlight of FIGS. 21-24 includes an EL device mounted on the optically transmissive member that serves as the light emission window. A heat sink is formed on the exterior of the upper portion of the metal housing section (on the upper surface in the orientation illustrated in FIG. 14).

In this example, the thermally conductive metal housing section is shown in the form of a rectangular member, with angled sides and a curved upper section. The optically transmissive window is shown in the form a flat plate or the like. Obviously other shapes may be used for the housing section and member. The fixture may be three or four feet long, for example, for replacement of or substitution for a fluorescent light fixture. As in the earlier examples, the optically transmissive member or window is attached to the metal thermally conductive housing section to form a seal for the vapor tight chamber. A hot location/interface is formed at the surface of the EL device exposed within the chamber, and cold locations are formed at the opposite portion of the chamber adjacent the upper region of the metal housing section as well as locations somewhat away from the EL device along lateral regions of the housing section.

In this example, the lower element of the electroluminescent device is a transparent conductor formed on the optically transmissive member. A reflective conductive layer may be provided on the opposite surfaced, although in the example, electrical connection to the opposite surface is provided by use of an electrically conductive working fluid. The materials and manner of assembly of the light emitting transducer of FIGS. 21-24 are similar to those of earlier examples. The light emitting transducer of FIGS. 21-24 operates to emit light as well as to dissipate heat, essentially in the same ways as does the EL device based light emitter of FIG. 7A.

FIG. 25 is a top view, and FIG. 26 is an isometric view, of a device or light engine for emitting light. The illustrated device 301 could be used as a light engine of a light fixture, although the exemplary configuration is particularly configured for use in a lamp or 'light bulb,' for example, in combination with a transparent, translucent or colored transmissive globe (not shown).

As in the earlier examples, the light emitting device 301 may operate at any orientation, although a particular orientation is illustrated for convenience. Some aspects of the following description of the light emitting device 301 use directional terms corresponding to the illustrated orientation, for convenience only. Such directional terms may help with understanding of this description of the example of FIGS. 25-27B but are not intended to be limiting in any way.

The light emitting device 301 includes a light emitting transducer apparatus that is integrated with a thermal conductivity and phase transition heat transfer mechanism, represented together as one integral element 303 in the drawings. Heat is transferred from the apparatus 303 to a heat sink 305. The heat sink 305 is formed of a highly thermally conductive material, typically a metal such as copper or aluminum, although other materials, such as thermally conductive plastics and ceramics, may be used. The heat sink 305 in our example has a core 307 having a central passage, a wall of which forms a fairly tight structural and thermal connection to the outer surface of a portion of the housing of the apparatus 303. The rest of the apparatus 303 extends upward or away from the passage in the core 307 of the heat sink 305, to form a pedestal or the like with a light emitting diode at or near the distal end. Extending radially outward from the core 307, the heat sink 305 has a number of fins 309 for radiating heat to the ambient atmosphere. Straight radial fins are shown, for convenience, although other shapes/contours may be used, e.g. to promote heat transfer and/or to allow a desired amount of light from the emitter and phosphor to pass down between the fins.

FIG. 27A is a cross-sectional view taken along line A-A of FIG. 25, and FIG. 27B is an enlarged detail view of a portion of the optical/electrical transducer apparatus 303 and heat sink 305 corresponding to that encircled by the arrow B-B in FIG. 27A. As illustrated, the light emitting device 301 includes a housing having a section 313 that is thermally conductive and a member 315 that is at least partially optically transmissive. In this example, the thermally conductive section 313 consists of a hollow copper cylinder or tube having a circular cross-section. A substantial portion of the copper section 313 of the housing extends down into the passage through the core 307 of the heat sink 305. The copper section 313 may be press fitted into the passage or be otherwise connected and thermally coupled to the heat sink 305 in any appropriate manner suitable for efficient heat transfer and to provide structural support that may be necessary for the apparatus 303. The end of the copper cylinder or tube of section 313 opposite the optically transmissive member 315 is closed, e.g. by a flat circular section of copper.

In this example, the optically transmissive member 315 consists of a hollow glass cylinder or tube having a circular cross-section and closed at one end by a curved or dome-shaped section of the glass. The cylindrical thermally conductive section 313 and the optically transmissive member 315 have approximately the same lateral dimensions so as to form a relatively straight continuous cylinder, although other lateral and cross-sectional shapes could be used. For example, one or both of the elements 313, 315 could vary in shape and/or dimension along the lateral length of the light emitting transducer apparatus 303, e.g. so that the region away from the heat sink 305 is somewhat enlarged or bulbous at the end of the pedestal. Also, the distal end of the optically transmissive member 315 (furthest away from the heat sink 305) could have other shapes, e.g. to be flat or concave instead of the illustrated dome shape.

The glass optically transmissive member 315 is connected to the copper thermally conductive section 313 of the light emitting transducer apparatus 303 to form a housing enclosing a vapor chamber and a semiconductor light emitting device. Specifically, the section 313 and member 315 are connected so as to form a vapor tight seal for the chamber. The two elements may be joined by a glass frit process or by application of a suitable epoxy, at the glass/copper interface.

Glass and copper are given by way of examples of the materials of the optically transmissive member 315 and the thermally conductive section 313. Those skilled in the art will appreciate that other optically transmissive materials and thermally conductive materials may be used.

The semiconductor light emitting device in this example includes semiconductor nanowires forming a light emitting diode (LED) 317, within the chamber. In this example, the semiconductor nanowires forming the LED 317 are formed or mounted on the curved interior surface at the distal end of the optically transmissive member 315. The structure of the LED 317 with the nanowires may be similar to the transducer device discussed above relative to FIGS. 1B and 2. As noted at one point in the discussion of FIGS. 1B and 2, reflectors may be provided at the distal (inner most) ends of the nanowires of the LED device 317, to increase output of light from the LED through the dome of the glass member 315. Since the LED 317 is mounted on glass, one or both electrical connections to the LED may be provided by separate leads (two of which are shown in the drawing), in which case, the working fluid need not be conductive.

The glass forming the optically transmissive member 315 may be transparent or translucent or exhibit other transmissive characteristics (e.g. non-white color filtering), depending on the application for the device 301. The glass of the member 315 permits emission of at least some light from the LED 317 as an output of the light emitting device 301.

For purposes of operating as a thermal conductivity and phase transition heat transfer mechanism, the light emitting device 301 also includes a working fluid within the chamber. The working fluid directly contacts the outer surfaces of the nanowires of the LED 317. The working fluid may also directly contact surfaces of the phosphor The pressure within the chamber configures the working fluid to absorb heat from the LED 317, particularly from the nanowires, during operation of the device 301. The fluid vaporizes at a relatively hot location at or near the semiconductor nanowires of the LED 317 as the working fluid absorbs heat. The vapor transfers heat to and condenses at a relatively cold location of the copper section 313 in contact with the heat sink 305, and the condensed working fluid returns as a liquid to the relatively hot location at or around the LED 317.

As in the earlier examples, the device 301 of FIG. 25 includes a wicking structure mounted within the chamber to facilitate flow of condensed liquid of the working fluid from the cold location to the hot location. Together, the housing, the chamber, the working fluid and the wicking structure form a thermal conductivity and phase transition heat transfer mechanism for transferring heat away from the LED 317, in this case, to the heat sink 305. The semiconductor nanowires of LED 317 on the inner curved surface of the glass member 315 are configured to serve as a portion of the wicking structure.

In addition to the nanowires of the LED 317, the wicking structure includes a non-LED (not semiconductor nanowires) wick 321 formed on the portions of the inner surface of the glass member 315 in regions other than the region(s) covered by the structure of the LED 317. The overall wicking structure further includes a non-LED (not semiconductor nanowires) wick 323 on the inner surface of the copper section 313. The wicks 321 and 323 may take many forms, as discussed with regard to the earlier examples. The wicks may be similar to each other or different, e.g. as discussed above relative to earlier examples. In the example of FIGS. 25-27B, the wick in the glass member 315 may be formed of a material that is at least somewhat optically transmissive, whereas the wick in the copper section 313 may be at least somewhat reflective.

Depending on the application of the light emitting device 301 and/or the light output properties of the LED, the device 301 may or may not include a phosphor or other luminescent material. In the present example, however, the light emitting device 301 does include a phosphor. As outlined earlier, the phosphor may be provided in some or all of the wicking structure. In the example of FIGS. 27A and 27B, the phosphor is provided in the form of a layer 325 between the LED 317 and the curved interior surface at the distal end of the optically transmissive member 315 on which the LED is mounted. Light emerging from the LED 317 toward the curved interior surface of the optically transmissive member 315 passes through the phosphor layer 325. Some of the light excites the phosphor, and the excited phosphor converts optical energy from the LED 317 from energy in one wavelength range (the excitation band of the phosphor) to another wavelength range. For example, the phosphor 325 may convert some energy from the LED 317 from a less desirable wavelength range (e.g. near or outside the visible spectrum) to a more desirable wavelength range (e.g. to fill-in a gap in the spectral characteristic of light produced by the emitter), to improve efficiency of the light emitting device 301 and/or to improve the quality of the light output.

The phosphor layer may include one type of phosphor or phosphor of a number of types, depending on the desired characteristics of the light output of the device 301. Also, the phosphor layer may extend down the inner surface of the housing, e.g. down the inner cylindrical surface of the glass member 315 to the glass/copper interface. Additional phosphor may be provided in the working fluid.

Figure 29:
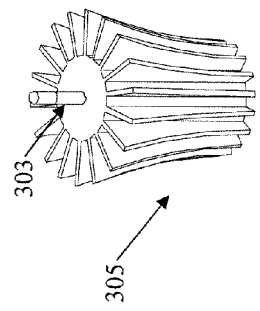
FIGS. 28 and 29 are top and isometric views of another light emitting type optical/electrical transducer apparatus and heat sink as may be used in a fixture or lamp/light bulb.
Figure 30B:
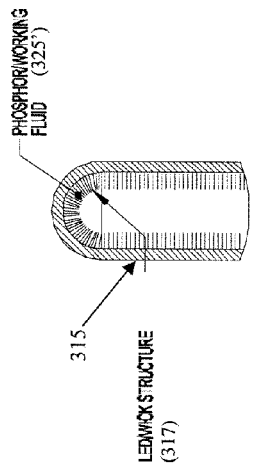
FIG. 30B is an enlarged detail view of a portion of the optical/electrical transducer apparatus and heat sink of FIG. 30A, showing the addition of a phosphor layer.
Figure 28:
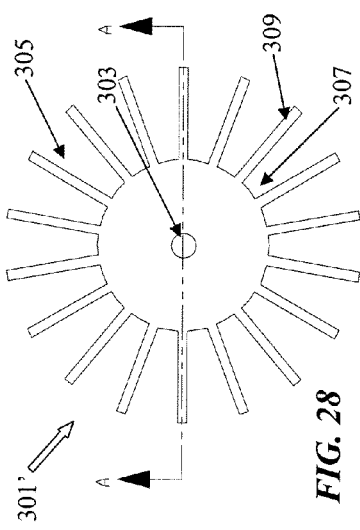
Figure 30A:
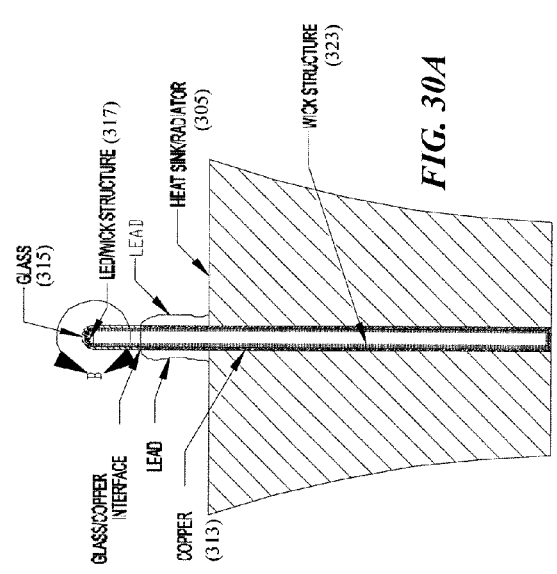
FIG. 30A is a cross-sectional view taken along line A-A of FIG. 28.

FIG. 28 is a top view, and FIG. 29 is an isometric view of another device or light engine 301' for emitting light. FIG. 30A is a cross section view taken along line A-A of FIG. 28, and FIG. 30B is an enlarged detail view of a portion of the optical/electrical transducer apparatus and heat sink of FIG. 30A, showing the addition of a phosphor layer. The device or light engine 301' is generally similar to the device 301 of FIGS. 7-9, like reference numerals identify corresponding elements, and the discussion above can be referenced for detailed information about the corresponding elements. The device 301' does include a phosphor. However, instead of including the phosphor as a layer between the light emitting diode and the surface of the optically transmissive member 315, the phosphor in the device 301' is carried by the working fluid 325'. A phosphor bearing working fluid as may be used in the device 301' has been discussed earlier with regard to the examples of FIGS. 3 and 4.

FIGS. 25-30B and the descriptions thereof relate to light emitting devices 301, 301'. The present teachings are also applicable to transducers that convert optical energy into electrical energy. To appreciate such additional applicability, it may be helpful to consider a specific example of an optical-to-electrical transducer, with reference to FIGS. 31-33B.

FIG. 31 is a top view, and FIG. 32 is an isometric view, of a device 331 for producing an electrical signal in response to light. The device 331 may be configured as an optical energy sensor or detector, e.g. for UV, visible light, infrared, or the like; and/or the device 331 may be configured as a photovoltaic device for generating power in response to optical energy in a desired spectral range. Although not shown, an optically transmissive outer element such as a globe may be added as a cover or the like.

As in the earlier examples, the light responsive transducer device 331 may operate at any orientation, although a particular orientation is illustrated for convenience. Some aspects of the following description of the light transducer device 331 use directional terms corresponding to the illustrated orientation, for convenience only. Such directional terms may help with understanding of this description of the example of FIGS. 31-33B but are not intended to be limiting in any way.

The device 331 includes a light responsive transducer apparatus (including the actual semiconductor transducer, such as a photodiode) that is integrated with a thermal conductivity and phase transition heat transfer mechanism, represented together as one integral element 333 in the drawings. Heat is transferred from the apparatus 333 to a heat sink 335. The heat sink 335 is formed of a highly thermally conductive material, typically a metal such as copper or aluminum, although other materials, such as thermally conductive plastics and ceramics, may be used. The heat sink 335 in our example has a core 337 having a central passage, a wall of which forms a fairly tight structural and thermal connection to the outer surface of a portion of the housing of the apparatus 333. The rest of the apparatus 333 extends upward or away from the passage in the core 337 of the heat sink 335, to form a pedestal or the like with the photodiode or the like at or near the distal end. Extending radially outward from the core 337, the heat sink 335 has a number of fins 339 for radiating heat to the ambient atmosphere.

FIG. 33A is a cross-sectional view taken along line A-A of FIG. 31, and FIG. 33B is an enlarged detail view of a portion of the optical/electrical transducer apparatus 333 and heat sink 335 corresponding to that encircled by the arrow B-B in FIG. 33A. As illustrated, the light responsive transducer device 331 includes a housing having a section 343 that is thermally conductive and a member 345 that is at least partially optically transmissive.

In the example of FIGS. 33A, 33B, the member 345 is a curved glass element having an inwardly reflective outer surface to form a reflector with respect to the transducer. Various curvatures may be used to concentrate incoming light at the location of the actual semiconductor transducer 347. Reflectivity can be provided by a coating or other surface treatment at the curved outer surface of the glass member 345 or possibly by total internal reflection of a substantial portion of the incident light.

A separate member could be used as the optically transmissive member as in the examples of FIGS. 25-27B and as shown in the FIG. 32. In such a case, the reflector would be fitted over the glass member, and the reflector may be solid as shown or may be an open reflector. However, the reflector is omitted from the isometric view of FIG. 32, for convenience, to more clearly show the portion of the apparatus 333 extending above the heat sink 335.

In the examples of FIGS. 33A, 33B with the solid reflector 345, a hollowed portion of the glass forms a portion of the housing of the transducer apparatus 333 with the integral thermal conductivity and phase transition heat transfer mechanism. Stated another way, in this example, the glass of the reflector 345 also serves as the optically transmissive member of the housing. It should be noted that the detail view of FIG. 33B represents only the portion of the reflector/member 345 encircled by the arrow B-B and does not show the entire reflector 345 (compare to FIG. 33A).

The thermally conductive section 343 consists of a hollow copper cylinder or tube having a circular cross-section. A substantial portion of the copper section 343 of the housing extends down into the passage through the core 337 of the heat sink 335. The copper section 343 may be press fitted into the passage or be otherwise connected and thermally coupled to the heat sink 335 in any appropriate manner suitable for efficient heat transfer and to provide structural support that may be necessary for the apparatus 333. The end of the copper cylinder or tube of section 343 opposite the optically transmissive member 345 is closed, e.g. by a flat circular section of copper.

In this example, the optically transmissive member 345 consists of a hollow cylinder or tube formed within the glass of the reflector 345. The hollow section has a circular cross-section and is closed at one end by a curved or dome-shaped contour within the glass. The interior of the cylindrical thermally conductive section 343 and the hollow within the optically transmissive member/reflector 345 have approximately the same lateral dimensions so as to form a relatively straight continuous cylindrical volume for the vapor chamber within the housing. As in the examples of FIGS. 25-30B, other lateral and longitudinal shapes may be used for either or both of the section 343 and the interior volume of the glass member 345.

The glass optically transmissive member 345 is connected to the copper thermally conductive section 343 of the light emitting transducer apparatus 333 to form a housing enclosing a vapor chamber and a light responsive semiconductor transducer. Specifically, the section 343 and member 343 are connected so as to form a vapor tight seal for the chamber. The two elements may be joined by a glass frit process or by application of a suitable epoxy, at the glass/copper interface.

Glass and copper are given by way of examples of the materials of the optically transmissive member 345 and the thermally conductive section 343. Those skilled in the art will appreciate that other optically transmissive materials and thermally conductive materials may be used.

The apparatus 333 includes a semiconductor transducer that generates an electrical signal in response to light. As shown at 347, the semiconductor transducer is formed so as to include semiconductor nanowires. The semiconductor transducer may take and of a number of different forms, although for purposes of further discussion, we will assume that the semiconductor transducer 347 is configured as a photovoltaic or the like.

The glass forming the optically transmissive portion of the reflector 345 may be transparent or translucent or exhibit other transmissive characteristics (e.g. non-white color filtering), depending on the photovoltaic or sensor application for the device 331. The glass of the member 345 permits light directed toward the reflector/member to pass through to the photo voltaic device 347 as an input of the light responsive transducer device 331. Light impacting on the reflective portion of the member 345 is reflected back through the glass for concentration at the position of the photovoltaic 347.

As discussed above, the device 331 includes a housing having a section 343 that is thermally conductive and a member 345 that is at least partially optically transmissive; and together, the housing section 343 and the optically transmissive member form a vapor chamber containing the working fluid for the integral thermal conductivity and phase transition heat transfer mechanism.

In this example, the semiconductor nanowires forming the photovoltaic 347 are formed or mounted on the curved interior surface at the distal end of the cavity within the optically transmissive member 345. The structure of the photovoltaic 347 with the nanowires may be similar to the transducer device discussed above relative to FIG. 2. As noted in earlier discussions, reflectors may be provided at distal ends of the nanowires, in this case to reduce the amount of light that escapes past the photovoltaic into the rest of the chamber and thus increase the amount of light processed by the photovoltaic 347. Since the photovoltaic 347 is mounted on glass, one or both electrical connections to the photovoltaic may be provided by separate leads (two of which are shown in the drawing), in which case, the working fluid need not be conductive.

For purposes of operating as a thermal conductivity and phase transition heat transfer mechanism, the light emitting device 331 also includes a working fluid within the chamber. The working fluid directly contacts the outer surfaces of the nanowires of the photovoltaic 347. The pressure within the chamber configures the working fluid to absorb heat from the photovoltaic, particularly from the nanowires, during operation of the device 331, to vaporize at a relatively hot location at or near the semiconductor nanowires of the photovoltaic 347 as the working fluid absorbs heat. The vapor transfers heat to and condenses at a relatively cold location of the copper section 343 in contact with the heat sink 335, and the condensed working fluid returns as a liquid to the relatively hot location at or around the photovoltaic 347.

As in the earlier examples, the device 331 of FIGS. 31-33B includes a wicking structure mounted within the chamber to facilitate flow of condensed liquid of the working fluid from the cold location to the hot location. Together, the housing, the chamber, the working fluid and the wicking structure form a thermal conductivity and phase transition heat transfer mechanism for transferring heat away from the photovoltaic 347. The semiconductor nanowires of photovoltaic 347 on the inner curved surface of the glass member 345 are configured to serve as a portion of the wicking structure.

In addition to the nanowires of the photovoltaic 347, the wicking structure includes a wick 351 formed of non-semiconductor nanowires on the portions of the inner surface of the glass member 345 in regions other than the region(s) covered by the structure of the photovoltaic 347. The overall wicking structure further includes a wick 353 formed of non-semiconductor nanowires on the inner surface of the copper section 343. Although formed of nanowires in the example, the wicks 351 and 353 may take many forms, as discussed with regard to the earlier examples. The wicks may be similar to each other or different, e.g. as discussed above relative to the earlier examples. In the example of FIGS. 31-33B, the wick in the glass member 345 may be formed of a material that is at least somewhat optically transmissive, whereas the wick in the copper section 343 may be at least somewhat reflective.

The example of FIGS. 31-33B does not include a phosphor. However, some sensor or photovoltaic applications of the apparatus 331 may include a phosphor. If useful, a phosphor appropriate to the application could be included in any of the various ways discussed above with regard to earlier examples.

Those skilled in the art will appreciate that the teachings above may be applied in a variety of different ways and are not limited to the specific structures, materials and arrangements shown in the drawings and described above. For example, the instructed devices include one transducer with the nanowires forming part of the wick within the chamber of the thermal conductivity and phase transition heat transfer mechanism. It is contemplated that a single device or apparatus may include multiple transducers with the nanowires of the transducers forming part of the wick. In a device having multiple semiconductor transducers, the transducers may be substantially similar, e.g. to emit or sense the same type of light. Alternatively, different transducers in one device may serve multiple purposes. For example, one semiconductor transducer might be configured to sense or emit light of a first spectral characteristic, whereas another semiconductor transducer might be configured to sense or emit light of a different second spectral characteristic. In another example of a multi-transducer arrangement, one semiconductor transducer might be configured to sense or emit light and another semiconductor transducer might be configured as a sensor of light or temperature.

It should be apparent from the discussion above that when an element is referred to as being "on", "attached" to, "connected" to, "coupled" with, "contacting," etc., another element, it can be directly on, attached to, connected to, coupled with or contacting the other element or intervening elements or spacing may also be present. In contrast, when an element is referred to as being, for example, "directly on", "directly attached" to, "directly connected" to, "directly coupled" with or "directly contacting" another element, there are no substantial intervening elements present, although in some cases there may be intervening elements or layers of up to a micron or so, so long as such layers or elements do no substantially reduce thermal conductivity. It will also be appreciated by those of skill in the art that references to a structure or feature that is disposed "adjacent" another feature may have portions that are nearby or even overlap or underlie the adjacent feature.

Similarly, spatially relative terms, such as "under," "below," "lower," "over," "upper" related orientation or directional terms and the like, that may have been used above for ease of description to describe one element or feature's relationship to another element(s) or feature(s) orientation or direction as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A thermal conductivity and phase transition heat transfer mechanism, comprising:
   a housing having a section that is thermally conductive and a member, that is at least partially optically transmissive, connected to the thermally conductive section to form a seal for a vapor tight chamber enclosed by the housing;
   a working fluid within the chamber; and
   an active optical element to be cooled by phase transition of the heat transfer mechanism, wherein:
   the active optical element is configured to be driven to emit light and/or driven by light to produce an electrical current, through the optically transmissive member,
   at least a portion of the active optical element is at least partially exposed within the chamber so as to be incorporated in or in contact with the working fluid, and
   pressure within the chamber configures the working fluid to absorb heat during operation of the active optical element, to vaporize at a relatively hot location of the mechanism as it absorbs heat from the operation of the active optical element, to transfer heat to and condense at a relatively cold location of the mechanism, and to return as a liquid to the relatively hot location of the mechanism.

2. The mechanism of claim 1, wherein:
   the mechanism is configured as a light emitting device; and
   the active optical element comprises a semiconductor light emitter positioned to emit light through the optically transmissive member, the semiconductor light emitter having at least one surface exposed within the chamber.

3. The mechanism of claim 2, further comprising a wicking structure extending over at least one interior surface of the vapor chamber and at least a portion of the at least one exposed surface of the semiconductor light emitter.

4. The mechanism of claim 3, wherein a part of the wicking structure comprises grooves formed in the at least one surface of the semiconductor light emitter exposed within the chamber.

5. The mechanism of claim 3, wherein a part of the wicking structure comprises nanowires extending into the vapor chamber from the at least one surface of the semiconductor light emitter exposed within the chamber.

6. The mechanism of claim 3, wherein at least a portion of the wicking structure comprises phosphor nanowires.

7. The mechanism of claim 3, wherein at least a portion of the wicking structure is at least substantially reflective.

8. The mechanism of claim 2, wherein the working fluid is electrically conductive for carrying electrical current to or from a portion of the semiconductor light emitter during operation of the semiconductor light emitter.

9. The mechanism of claim 2, further comprising a phosphor within the chamber.

10. The mechanism of claim 2, wherein the semiconductor light emitter is a type of emitter selected from the group consisting of: a light emitting diode (LED), an organic light emitting diode (OLED), and a laser diode.

11. The mechanism of claim 1, wherein the active optical element comprises a phosphor within the chamber.

12. The mechanism of claim 11, wherein the phosphor is an opto-luminescent type of phosphor.

13. The mechanism of claim 11, wherein the phosphor is an electroluminescent type of phosphor.

14. The mechanism of claim 11, wherein the phosphor is carried by the working fluid within the chamber.

15. The mechanism of claim 11, further comprising a wicking structure extending over at least one interior surface of the chamber.

16. The mechanism of claim 15, wherein at least a portion of the wicking structure is at least substantially reflective.

17. The mechanism of claim 15, wherein the phosphor is formed in at least a portion of the wicking structure.

18. The mechanism of claim 1, wherein:
the mechanism is configured as a light emitting device; and
the active optical element comprises an electroluminescent light emitting device positioned to emit light through the optically transmissive member, the electroluminescent light emitting device having at least one surface exposed within the chamber.

19. The mechanism of claim 18, wherein the electroluminescent light emitting device comprises a phosphor and at least one electrode for applying electrical energy to excite the phosphor.

20. The mechanism of claim 19, wherein the working fluid is electrically conductive for carrying electrical current to or from the electrode of the electroluminescent light emitting device during operation of the electroluminescent light emitting device.

21. The mechanism of claim 19, wherein the electrode of the electroluminescent light emitting device is at least substantially transparent for allowing transmission of light from the phosphor for emission through optically transmissive member.

22. The mechanism of claim 18, further comprising a wicking structure extending over at least one interior surface of the vapor chamber and at least a portion of the at least one exposed surface of the electroluminescent light emitting device.

23. The mechanism of claim 22, wherein a part of the wicking structure comprises grooves formed in the at least one surface of the electroluminescent light emitting device exposed within the chamber.

24. The mechanism of claim 22, wherein a part of the wicking structure comprises nanowires extending into the vapor chamber from the at least one surface of the electroluminescent light emitting device exposed within the chamber.

25. The mechanism of claim 22, wherein at least a portion of the wicking structure is at least substantially reflective.

26. The mechanism of claim 1, wherein:
the mechanism is configured as an optical-to-electrical transducer; and
the active optical element comprises an optical-to-electrical converter positioned to receive light through the optically transmissive member, the optical-to-electrical converter having at least one surface exposed within the chamber.

27. The mechanism of claim 26, further comprising a wicking structure extending over at least one interior surface of the vapor chamber and at least a portion of the at least one exposed surface of the optical-to-electrical converter.

28. The mechanism of claim 27, wherein:
the optical-to-electrical converter is a semiconductor device; and
a part of the wicking structure comprises grooves formed in the at least one surface of the semiconductor device exposed within the chamber.

29. The mechanism of claim 27, wherein:
the optical-to-electrical converter is a semiconductor device; and
a part of the wicking structure comprises nanowires extending into the vapor chamber from at least one surface of the semiconductor device exposed within the chamber.

30. The mechanism of claim 27, wherein at least a portion of the wicking structure comprises phosphor nanowires.

31. The mechanism of claim 27, wherein at least a portion of the wicking structure is at least substantially reflective.

32. The mechanism of claim 26, wherein the working fluid is electrically conductive for carrying electrical current to or from a portion of the optical-to-electrical transducer during operation of the optical-to-electrical transducer.

33. The mechanism of claim 26, further comprising a phosphor within the chamber.

34. The transducer of claim 26, wherein the optical-to-electrical converter is a photovoltaic.

35. The transducer of claim 26, wherein the optical-to-electrical converter is a semiconductor configured for detecting light.

36. A thermal conductivity and phase transition heat transfer mechanism, comprising:
a housing having a section that is thermally conductive and a member, that is at least partially optically transmissive, connected to the thermally conductive section to form a seal for a vapor tight chamber enclosed by the housing;
a semiconductor device to be cooled by phase transition of the heat transfer mechanism, the semiconductor device being of a type configured to be driven to emit light and/or driven by light to produce an electrical current, through the optically transmissive member, wherein at least a surface of the semiconductor device is at least partially exposed within the chamber; and
a working fluid within the chamber, wherein:
pressure within the chamber configures the working fluid to absorb heat during operation of the semiconductor device, to vaporize at a relatively hot location of the mechanism as it absorbs heat from the operation of the semiconductor device, to transfer heat to and condense at a relatively cold location of the mechanism, and to return as a liquid to the relatively hot location of the mechanism, and
the working fluid is electrically conductive for carrying electrical current to or from a portion of the surface of the semiconductor device during operation of the semiconductor device.

37. The mechanism of claim 36, wherein the semiconductor device is a light emitting diode, an electroluminescent device, a photodiode or a photovoltaic device.

38. The mechanism of claim 36, wherein at least a portion the semiconductor device comprises semiconductor nanowires.

39. A thermal conductivity and phase transition heat transfer mechanism, comprising:
a housing having a section that is thermally conductive and a member, that is at least partially optically transmissive, connected to the thermally conductive section to form a seal for a vapor tight chamber enclosed by the housing;
a working fluid within the chamber; and an electroluminescent light emitter, including an electroluminescent material of a type configured to be driven to emit light for passage through the optically transmissive member, wherein at least a portion of the electroluminescent light emitter is exposed to the working fluid within the chamber, wherein:

pressure within the chamber configures the working fluid to absorb heat during operation of the electroluminescent light emitter, to vaporize at a relatively hot location of the mechanism as it absorbs heat from the operation of the electroluminescent light emitter including at least some heat from the electroluminescent material, to transfer heat to and condense at a relatively cold location of the mechanism, and to return as a liquid to the relatively hot location of the mechanism.

40. The mechanism of claim 39, wherein the electroluminescent light emitter comprises a thin film structure formed on a wall of the chamber.

41. The mechanism of claim 39, wherein the electroluminescent light emitter comprises electroluminescent nanowires.

42. The mechanism of claim 41, wherein the nanowires comprise an electroluminescent phosphor.

43. The mechanism of claim 39, wherein the electroluminescent light emitter comprises an electroluminescent phosphor.

* * * * *